(12) United States Patent
Chen et al.

(10) Patent No.: US 12,113,071 B2
(45) Date of Patent: Oct. 8, 2024

(54) MULTI-FUNCTION SUBSTRATE

(71) Applicant: Taiwan Semiconductor Manufacturing Company, Ltd., Hsinchu (TW)

(72) Inventors: Eugene I-Chun Chen, Taipei (TW); Kuan-Liang Liu, Pingtung (TW); Szu-Yu Wang, Hsinchu (TW); Chia-Shiung Tsai, Hsin-Chu (TW); Ru-Liang Lee, Hsinchu (TW); Chih-Ping Chao, Hsin-Chu (TW); Alexander Kalnitsky, San Francisco, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 144 days.

(21) Appl. No.: 17/869,827

(22) Filed: Jul. 21, 2022

(65) Prior Publication Data
US 2022/0352211 A1 Nov. 3, 2022

Related U.S. Application Data

(62) Division of application No. 17/189,709, filed on Mar. 2, 2021, now Pat. No. 11,532,642.

(60) Provisional application No. 63/124,983, filed on Dec. 14, 2020.

(51) Int. Cl.
*H01L 27/12* (2006.01)
*H01L 21/02* (2006.01)
*H01L 21/762* (2006.01)

(52) U.S. Cl.
CPC .... *H01L 27/1207* (2013.01); *H01L 21/76275* (2013.01); *H01L 21/76283* (2013.01); *H01L 21/02381* (2013.01); *H01L 21/02532* (2013.01); *H01L 21/02595* (2013.01); *H01L 21/02658* (2013.01)

(58) Field of Classification Search
CPC ........... H01L 27/1207; H01L 21/76275; H01L 21/76283; H01L 21/02381; H01L 21/02532; H01L 21/02595; H01L 21/02658
See application file for complete search history.

(56) References Cited

U.S. PATENT DOCUMENTS

| | | |
|---|---|---|
| 10,957,577 B2 | 3/2021 | Schwarzenbach et al. |
| 2005/0161663 A1 | 7/2005 | Atanackovic |
| 2013/0234145 A1 | 9/2013 | Hirler et al. |

(Continued)

OTHER PUBLICATIONS

Notice of Allowance dated Aug. 10, 2022 for U.S. Appl. No. 17/189,709.

(Continued)

*Primary Examiner* — Julia Slutsker
(74) *Attorney, Agent, or Firm* — Eschweiler & Potashnik, LLC

(57) ABSTRACT

The present disclosure relates to an integrated chip. The integrated chip includes a polysilicon layer arranged on an upper surface of a base substrate. A dielectric layer is arranged over the polysilicon layer, and an active semiconductor layer is arranged over the dielectric layer. A semiconductor material is arranged vertically on the upper surface of the base substrate and laterally beside the active semiconductor layer.

20 Claims, 61 Drawing Sheets

(56) References Cited

U.S. PATENT DOCUMENTS

| | | |
|---|---|---|
| 2016/0276807 A1 | 9/2016 | Cai et al. |
| 2017/0005111 A1* | 1/2017 | Verma .................... H01L 29/20 |
| 2018/0138284 A1 | 5/2018 | Pelzel et al. |
| 2018/0277421 A1 | 9/2018 | Peidous et al. |
| 2018/0337043 A1* | 11/2018 | Englekirk ........... H01L 27/1218 |
| 2020/0321243 A1 | 10/2020 | Schwarzenbach et al. |
| 2021/0111192 A1 | 4/2021 | Lee et al. |

OTHER PUBLICATIONS

Non-Final Office Action dated May 10, 2022 for U.S. Appl. No. 17/189,709.

* cited by examiner

MULTI-FUNCTION SUBSTRATE

REFERENCE TO RELATED APPLICATIONS

This Application is a Divisional of U.S. application Ser. No. 17/189,709, filed on Mar. 2, 2021, which claims the benefit of U.S. Provisional Application No. 63/124,983, filed on Dec. 14, 2020. The contents of the above-referenced Patent Applications are hereby incorporated by reference in their entirety.

BACKGROUND

Integrated circuits have traditionally been formed on bulk semiconductor substrates. A bulk semiconductor substrate is a substrate that comprises a free standing semiconductor material (e.g., silicon). In recent years, semiconductor-on-insulator (SOI) substrates have emerged as an alternative to bulk semiconductor substrates. An SOI substrate comprises a handle substrate, an insulating layer (e.g., a buried oxide) over the handle substrate, and an active semiconductor layer over the insulating layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
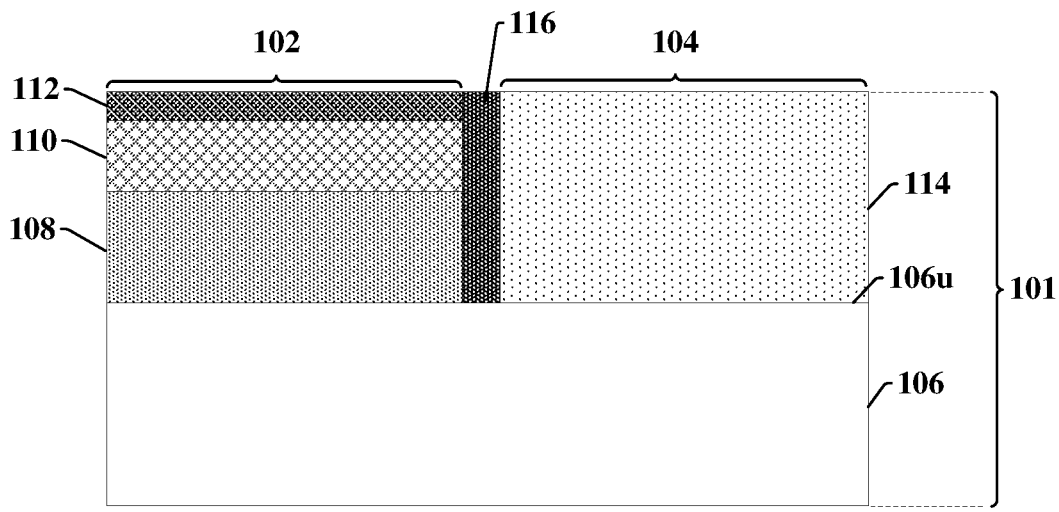
FIG. 1 illustrates a cross-sectional view of some embodiments of a multi-function substrate having different regions with different structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In modern day integrated chip fabrication, devices (e.g., transistor devices, passive devices, etc.) are typically formed in either bulk substrates or SOI (semiconductor-on-insulator) substrates. However, it has been appreciated that the different structures of bulk substrates and SOI substrates have different characteristics, which may be advantageous to different types of devices. For example, some types of devices, such as low noise amplifiers (LNA), transmit/receive (T/R) switches, or the like, may have a better performance when formed within a thin active semiconductor layer of an SOI substrate. Other types of devices, such as core CMOS devices (e.g., core NMOS devices and/or core PMOS devices within a processor), I/O CMOS devices, high-voltage devices, or the like, may have a better performance when formed on a thicker layer of semiconductor material of a bulk substrate. Because different types of devices may perform better in different types of substrates, a single type of substrate may not be able to provide optimal performance for different types of devices on a same die.

To fabricate a die that provides good performance for different types of devices, a multi-function substrate having different regions with different structures may be used. For example, a multi-function substrate may comprise both bulk regions and SOI regions. A multi-function substrate may be formed by selectively patterning an SOI substrate to remove an insulating layer and an active semiconductor layer, and to expose an upper surface of a base substrate. A selective epitaxial growth of a semiconductor material is subsequently performed on the exposed upper surface of the base substrate. However, the patterning process used to remove the insulating layer and the active semiconductor layer may expose defects (e.g., crystal originated particle (COP) defects) that are present along the upper surface of the base substrate. These defects may negatively affect a growth of the overlying semiconductor material and lead to degradation in performance of devices subsequently formed within the semiconductor material.

The present disclosure, in some embodiments, relates to an integrated chip comprising a multi-function substrate having different regions (e.g., a bulk region and an SOI region) with different structures. The integrated chip comprises a base substrate having an upper surface that is substantially devoid of COP defects. In some embodiments, the base substrate may comprise an epitaxial layer disposed over a high resistivity semiconductor body (e.g., a semiconductor body having a resistivity of greater than approximately 1 kΩ-cm). Within a first region, an active semiconductor layer is separated from the epitaxial layer by a dielectric layer. Within a second region, a semiconductor material is disposed on the epitaxial layer. Having a single substrate comprising different regions with different structures allows for different types of devices to be formed within a single die. By forming both different types of devices on a single die, the performance of an integrated chip can be improved. Furthermore, by having a base substrate with an upper surface that is substantially devoid of COP defects, the negative effect of the defects on the semiconductor material can be mitigated.

FIG. 1 illustrates a cross-sectional view of some embodiments of an integrated chip 100 having a multi-function substrate (e.g., a localized BOX substrate).

The integrated chip 100 comprises a substrate 101 having a first region 102 and a second region 104. The first region 102 and the second region 104 of the substrate 101 have different structures (e.g., stacks of one or more different layers/materials) that provide for different characteristics (e.g., performance) to different types of devices. In some embodiments, the first region 102 may comprise an SOI region (e.g., a region having an active semiconductor layer separated from a base substrate by an insulating material), while the second region 104 may comprise a bulk region (e.g., a region having a semiconductor material continuously extending between upper and lower surfaces of the substrate 101). In some embodiments, the substrate 101 may comprise a die, a wafer, or the like.

Within the first region 102, the substrate 101 comprises a polysilicon layer 108 disposed over a base substrate 106, a dielectric layer 110 (e.g., a buried oxide (BOX) layer) disposed over the polysilicon layer 108, and an active semiconductor layer 112 disposed over the dielectric layer 110. Within the second region 104, the substrate 101 comprises a semiconductor material 114 disposed over the base substrate 106. The semiconductor material 114 has a greater thickness than that of the active semiconductor layer 112. In some embodiments, the base substrate 106 may have an upper surface 106u that is substantially devoid of defects (e.g., COP defects). In some embodiments, the semiconductor material 114 may directly contact the base substrate 106.

A gap fill structure 116 is laterally arranged between the first region 102 and the second region 104. In various embodiments, the gap fill structure 116 may comprise a dielectric material (e.g., an oxide, a nitride, or the like), a semiconductor material (e.g., doped silicon, un-doped silicon, doped germanium, un-doped germanium, amorphous silicon, polysilicon, or the like), and/or the like. In some embodiments, the gap fill structure 116 covers a sidewall of the active semiconductor layer 112 and a sidewall of the semiconductor material 114. In some additional embodiments, the gap fill structure 116 continuously extends from along the sidewall of the active semiconductor layer 112 to along sidewalls of the dielectric layer 110 and/or the polysilicon layer 108.

The different structures of the first region 102 and the second region 104 allow for the substrate 101 to provide for different characteristics on different parts of a same integrated chip (e.g., a same integrated chip die). By having different structures that provide different characteristics on different parts of a same integrated chip, the integrated chip 100 is able to provide for good performance to different types of devices. For example, the relatively thin active semiconductor layer 112 and the dielectric layer 110 within the first region 102 may suppress body capacitance, reduce cross-talk, and/or provide for good performance (e.g., allow high speed and/or low power operation) to an RF device (e.g., a LNA, T/R switch, or the like), while the relatively thick semiconductor material 114 within the second region 104 may prevent floating body effects and provide for good performance to a digital device (e.g., a core CMOS device, an I/O CMOS device, a high voltage device, or the like).

Figure 2A:
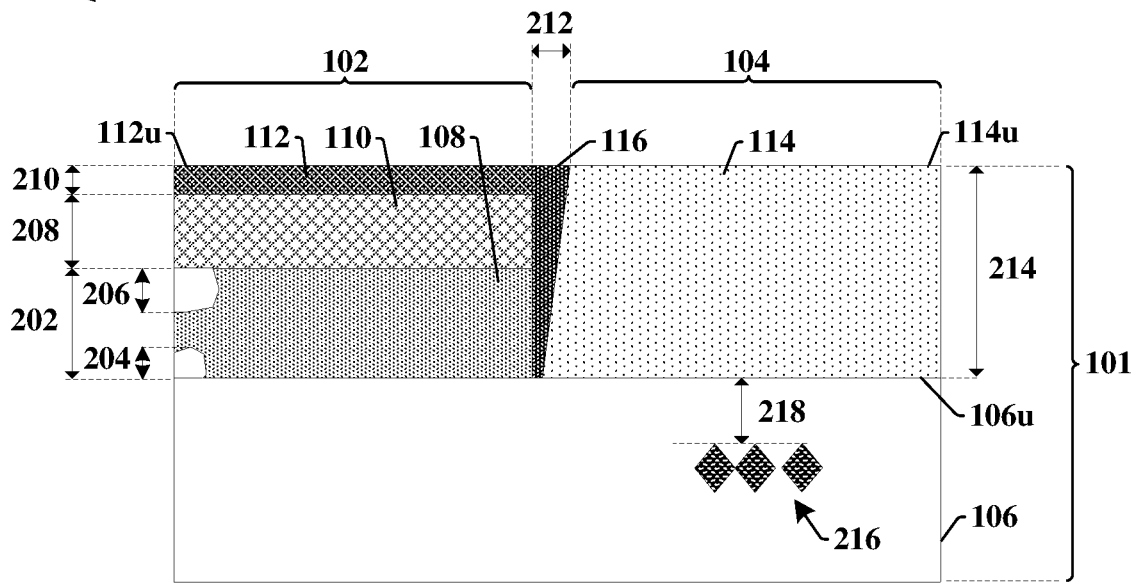
FIGS. 2A-2D illustrate some additional embodiments of multi-function substrates having different regions with different structures.

FIG. 2A illustrates a cross-sectional view of some additional embodiments of an integrated chip 200 having a multi-function substrate.

The integrated chip 200 comprises a substrate 101 having a first region 102 and a second region 104. In some embodiments, the first region 102 comprises a polysilicon layer 108 disposed on a base substrate 106, a dielectric layer 110 disposed on the polysilicon layer 108, and an active semiconductor layer 112 disposed on the dielectric layer 110. In other embodiments (not shown), the polysilicon layer 108 may be omitted, such that the dielectric layer 110 is disposed directly onto the base substrate 106 within the first region 102. In some embodiments, the base substrate 106 may comprise a high-resistivity substrate (e.g., a substrate having a resistivity that is greater than or equal to approximately 1 kΩ-cm), and the polysilicon layer 108 may comprise a trap-rich (TR) polysilicon layer (e.g., a polysilicon layer having a trap density of greater than approximately $10^{10}$ cm$^2$ eV$^{-1}$, greater than approximately $10^9$ cm$^2$ eV$^{-1}$, or other similar values). The density of traps within the polysilicon layer 108 is configured to reduce RF (radio frequency) second harmonic distortion of devices within the first region 102. In some embodiments, the polysilicon layer 108 may have a first thickness 202 that is in a range of between approximately 0.1 micron (μm) and approximately 0.2 μm, between approximately 2 μm and approximately 0.5 μm, between approximately 1 μm and approximately 2 μm, between approximately 0 μm and approximately 3 μm, of approximately 1.5 μm, or other similar values.

In some embodiments, the polysilicon layer 108 may comprise grain sizes 204-206 that are in a range of between approximately 50 nm and approximately 300 nm, between approximately 90 nm and approximately 230 nm, or other similar values. The relatively small grain sizes 204-206 allow for the polysilicon layer 108 to effectively trap charge carriers and provide for good isolation and/or to decrease cross-talk between devices within the first region 102. In some embodiments, the grain sizes 204-206 may increase as a thickness of the polysilicon layer 108 increases. For example, in some embodiments, the polysilicon layer 108 may have a first grain size 204 near a bottom of the polysilicon layer 108 (e.g., along the interface between the polysilicon layer 108 and the base substrate 106) and a second grain size 206, which is larger than the first grain size 204, near a top of the polysilicon layer 108 (e.g., along the interface between the polysilicon layer 108 and the dielectric layer 110). In some embodiments, the first grain size 204 may be in a range of between approximately 15% and approximately 30% of the second grain size 206. For example, in some embodiments, the first grain size 204 may be approximately 90 nm and the second grain size 206 may be approximately 230 nm.

In some embodiments, the base substrate 106 may be doped within a dopant species having a first doping type. In some additional embodiments, a part of the polysilicon layer 108 may be doped with the dopant species having the first doping type. In some embodiments, the dopant species within the polysilicon layer 108 may have a maximum doping concentration that is greater than approximately 1e12 at/cm$^3$, greater than approximately 1e13 at/cm$^3$, less than approximately 1.4e13 at/cm$^3$, approximately 1e15 at/cm$^3$, or other similar values. In some embodiments, the polysilicon layer 108 may have a gradient doping concentration that decreases as a distance from a lower surface of the polysilicon layer 108 increases. For example, the doping concentration may decrease from the maximum doping concentration along the lower surface of the polysilicon layer 108 to an intrinsic doping concentration at a distance over the lower surface.

In some embodiments, the dielectric layer 110 may comprise an oxide (e.g., silicon oxide), a nitride (e.g., silicon nitride, silicon oxynitride, etc.), or the like. In some embodiments, the dielectric layer 110 may have a second thickness 208 that is in a range of between approximately 200 Angstroms (Å) and approximately 2 μm, between approximately 200 nm and approximately 1 μm, or other similar values. In some embodiments, the active semiconductor layer 112 may comprise silicon, germanium, or the like. In some embodiments, the active semiconductor layer 112 may have a third thickness 210 that is less than or equal to approximately 2 kÅ, less than or equal to approximately 1 kÅ, that is approximately 750 Å, or other similar values.

A gap fill structure 116 laterally separates the first region 102 from the second region 104. In some embodiments, the gap fill structure 116 may comprise a dielectric material, a semiconductor material, and/or the like. The gap fill structure 116 may have a width 212 that is between approximately 0 μm and approximately 20 μm, between approximately 1 μm and approximately 10 μm, or other similar values. In some embodiments, the width 212 of the gap fill structure 116 may increase as a distance over the base substrate 106 increases, so that an upper surface of the gap fill structure 116 is wider than a lower surface of the gap fill structure 116. In some embodiments, the gap fill structure 116 may have a height that extends from a top surface of the active semiconductor layer 112 to below a bottom surface of the active semiconductor layer 112. In some embodiments, the gap fill structure 116 may further extend below a bottom surface of the dielectric layer 110 and/or to below a bottom surface of the polysilicon layer 108 (e.g., to directly between sidewalls of the base substrate 106).

In some embodiments, the second region 104 comprises a semiconductor material 114 disposed over an upper surface 106u of the base substrate 106. In some embodiments, the upper surface 106u of the base substrate 106 may be substantially devoid of defects. In some additional embodiments, one or more defects 216 may be arranged within the base substrate 106 at positions that are vertically separated from the upper surface 106u by a region 218 of the base substrate 106 that is substantially devoid of defects (e.g., COP defects). In such embodiments, because the defects 216 are vertically separated from the semiconductor material 114 by the region 218 that is substantially devoid of defects, the defects 216 do not negatively impact growth of the semiconductor material 114.

The semiconductor material 114 may be a same material as the base substrate 106. For example, the semiconductor material 114 may comprise silicon, germanium, or the like. In some embodiments, the semiconductor material 114 may have a fourth thickness 214 that is substantially equal to a sum of the thicknesses of the polysilicon layer 108, the dielectric layer 110, and the active semiconductor layer 112. In some embodiments, the fourth thickness 214 may be greater than approximately 1 μm, greater than approximately 2 μm, greater than approximately 5 μm, or other similar values. In some embodiments, the semiconductor material 114 contacts the base substrate 106.

In some embodiments, the active semiconductor layer 112 may have an upper surface 112u that is substantially co-planar (e.g., co-planar within a tolerance of a chemical mechanical planarization process) with an upper surface 114u of the semiconductor material 114. The substantially planar upper surfaces of the active semiconductor layer 112 and the semiconductor material 114 allow for good depth of focus on subsequently performed lithographic processes. For example, lithography processes used to form interconnects within an inter-level dielectric (ILD) layer over the first region 102 and the second region 104 can be performed without depth of focus issues.

Although the disclosed substrate 101 is illustrated as having a single first region (e.g., 102) and a single second region (e.g., 104), it will be appreciated that in some embodiments the disclosed substrate 101 may have multiple first regions (e.g., multiple SOI regions) and multiple second regions (e.g., multiple bulk regions) having different structures. For example, in some embodiments, the substrate 101 may comprise a wafer having a plurality of first regions 102 and a plurality of second regions 104 arranged on different parts of the wafer. In other embodiments, the substrate may comprise a die having a plurality of first regions 102 and a plurality of second regions 104.

Figure 2B:
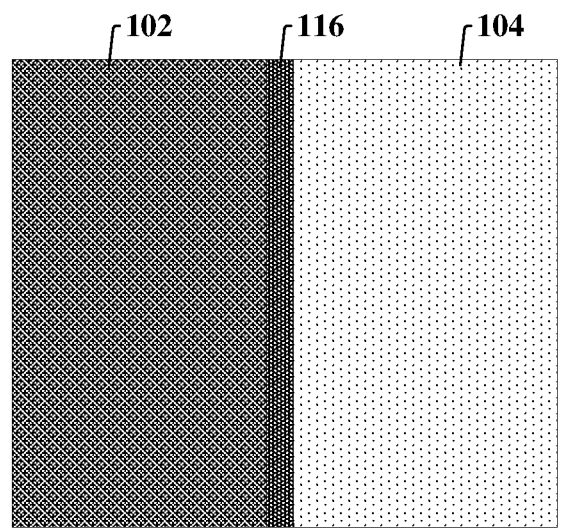
Figure 2C:
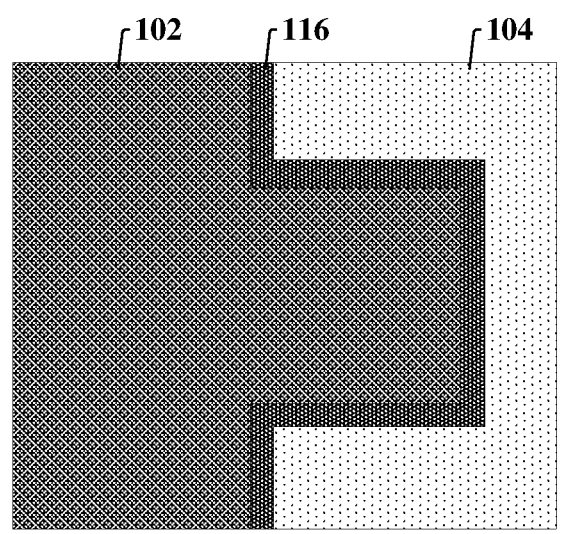
Figure 2D:
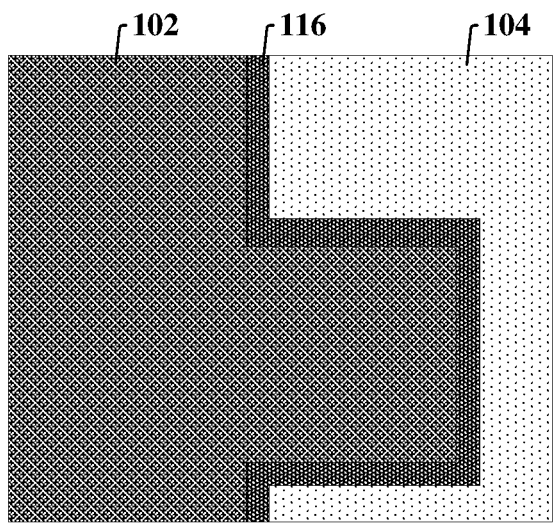

It will be appreciated that the first region 102 and the second region 104 may have various shapes in different embodiments. FIGS. 2B-2D illustrate top-views of various embodiments of a disclosed multi-function substrate. It will be appreciated that FIGS. 2B-2D are not limiting examples of a first region 102 and a second region 104, and that the first region 102 and/or the second region 104 may have different shapes than those shown in FIGS. 2B-2D in alternative embodiments.

In some embodiments, shown in top-view 220 of FIG. 2B, the first region 102 may comprise a substantially rectangular shaped region and the second region 104 may comprise a rectangular shaped region.

In some alternative embodiments, shown in top-view 222 of FIG. 2C, the first region 102 may comprise a substantially "T" shaped region.

In yet other alternative embodiments, shown in top-view 224 of FIG. 2D, the first region 102 may comprise a multi-sided shaped region (e.g., a polygonal shaped region). In some embodiments, the first region 102 may have an asymmetric shape.

Figure 3:
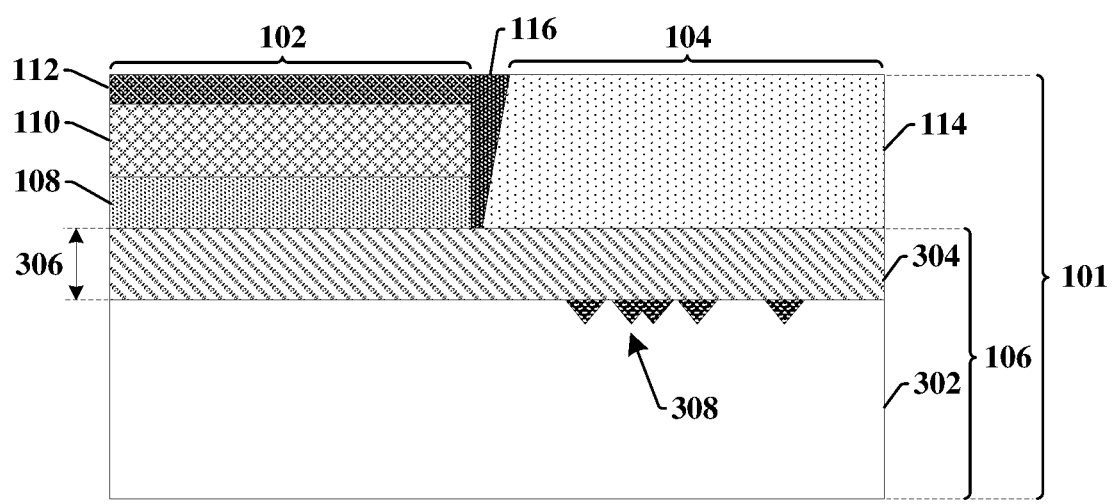
FIG. 3 illustrates a cross-sectional view of some additional embodiments of a multi-function substrate having different regions with different structures.

FIG. 3 illustrates a cross-sectional view of some additional embodiments of an integrated chip 300 having a multi-function substrate.

The integrated chip 300 comprises a substrate 101 having a base substrate 106 including a first region 102 and a second region 104. In some embodiments, the base substrate 106 may comprise an epitaxial layer 304 arranged on a semiconductor body 302 within the first region 102 and within the second region 104. In some embodiments, the semiconductor body 302 and the epitaxial layer 304 continuously extend from within the first region 102 to within the second region 104. In other embodiments, the epitaxial layer 304 may be discontinuous between the first region 102 and the second region 104. For example, the epitaxial layer 304 may be interrupted by a gap fill structure 116, which extends into and/or through the epitaxial layer 304. In some embodiments, the gap fill structure 116 may vertically contact the epitaxial layer 304. Within the first region 102, a polysilicon layer 108 is disposed on the epitaxial layer 304, a dielectric layer 110 is disposed on the polysilicon layer 108, and an active semiconductor layer 112 is disposed on the dielectric layer 110. Within the second region 104, a semiconductor material 114 is disposed on the epitaxial layer 304.

In some embodiments, the semiconductor body 302 may be doped within a dopant species having a first doping type. In some additional embodiments, a part of the epitaxial layer 304 may be doped with the dopant species having the first doping type. In some embodiments, the dopant species within the epitaxial layer 304 may have a maximum doping concentration that is greater than approximately 1e12 at/cm³. Such a doping concentration will give the epitaxial layer 304 a relatively high resistivity (e.g., greater than approximately 1 kΩ-cm) to improve performance of devices within the first region 102. In some embodiments, the epitaxial layer 304 may have a gradient doping concentration that decreases as a distance from a lower surface of the epitaxial layer 304 increases. For example, the doping concentration may decrease from the maximum doping concentration along the lower surface of the epitaxial layer 304 to an intrinsic doping concentration at a distance over the lower surface.

In some embodiments, the semiconductor body 302 and the epitaxial layer 304 may comprise a same semiconductor material, such as silicon, germanium, or the like. In some embodiments, the semiconductor body 302 may comprise one or more defects 308 arranged along a part of an upper surface of the semiconductor body 302 that is directly below the epitaxial layer 304 and the semiconductor material 114. In some embodiments, the one or more defects 308 may comprise crystal originated particle (COP) defects. In some embodiments, the epitaxial layer 304 may contact the one or more defects 308 arranged the upper surface of the semiconductor body 302.

It has been appreciated that a thickness 306 of the epitaxial layer 304 may reduce defects along a top of the epitaxial layer 304. For example, an epitaxial layer 304 having a thickness 306 of greater than approximately 500 nm will have fewer defects along an upper surface than an epitaxial layer 304 having a thickness of greater than 100 nm. In some embodiments, the epitaxial layer 304 may have a thickness 306 that is greater than approximately 100 nm, greater than approximately 200 nm, in a range of between approximately 100 nm and approximately 500 nm, between approximately 100 nm and approximately 1 μm, or other similar values.

In some embodiments, the upper surface of the epitaxial layer 304 within the second region 104 may be substantially devoid of COP defects. Because the upper surface of the epitaxial layer 304 within the second region 104 is substantially devoid of COP defects, the epitaxial layer 304 is able to mitigate negative impacts of the one or more defects in the base substrate 106 and improve performance of devices within the second region 104. In some embodiments, the epitaxial layer 304 may also reduce a formation time and/or a thickness of the semiconductor material 114 within the second region 104, thereby leading to lower total thickness variation (TTV) between the first region 102 and the second region 104 and/or a lower fabrication cost.

Figure 4A:
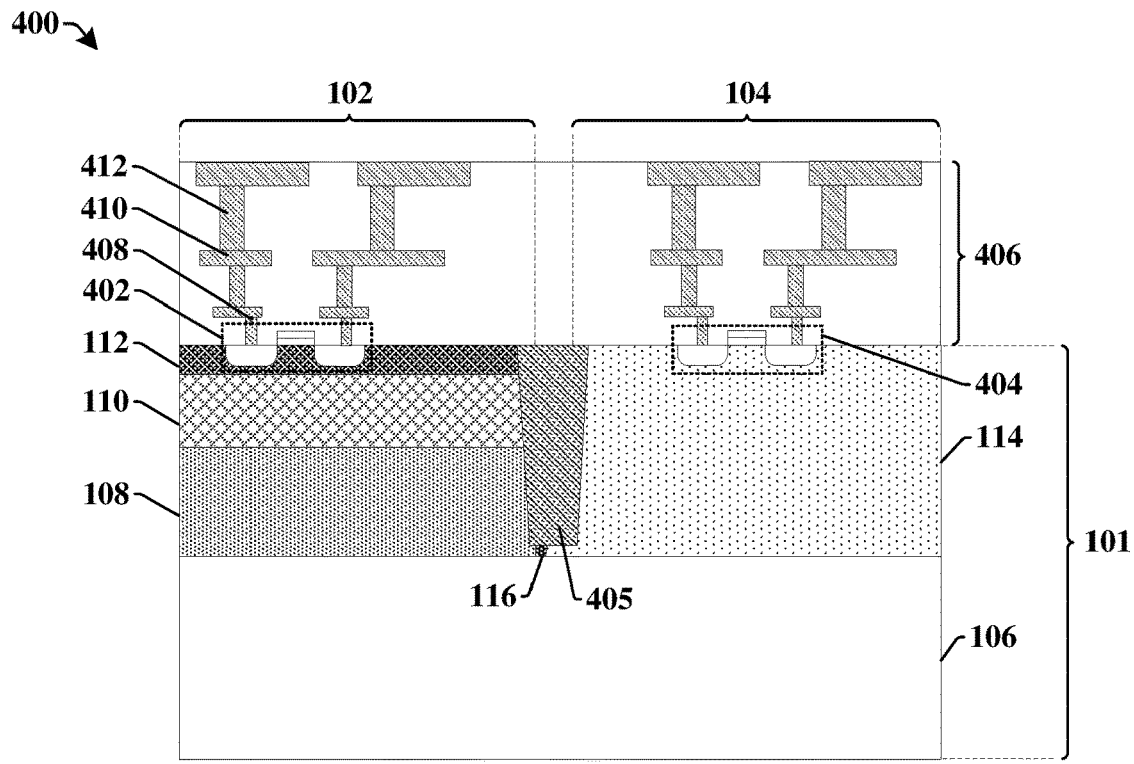
FIGS. 4A-4B illustrate cross-sectional views of some additional embodiments of multi-function substrates having different regions with different structures.
Figure 4B:
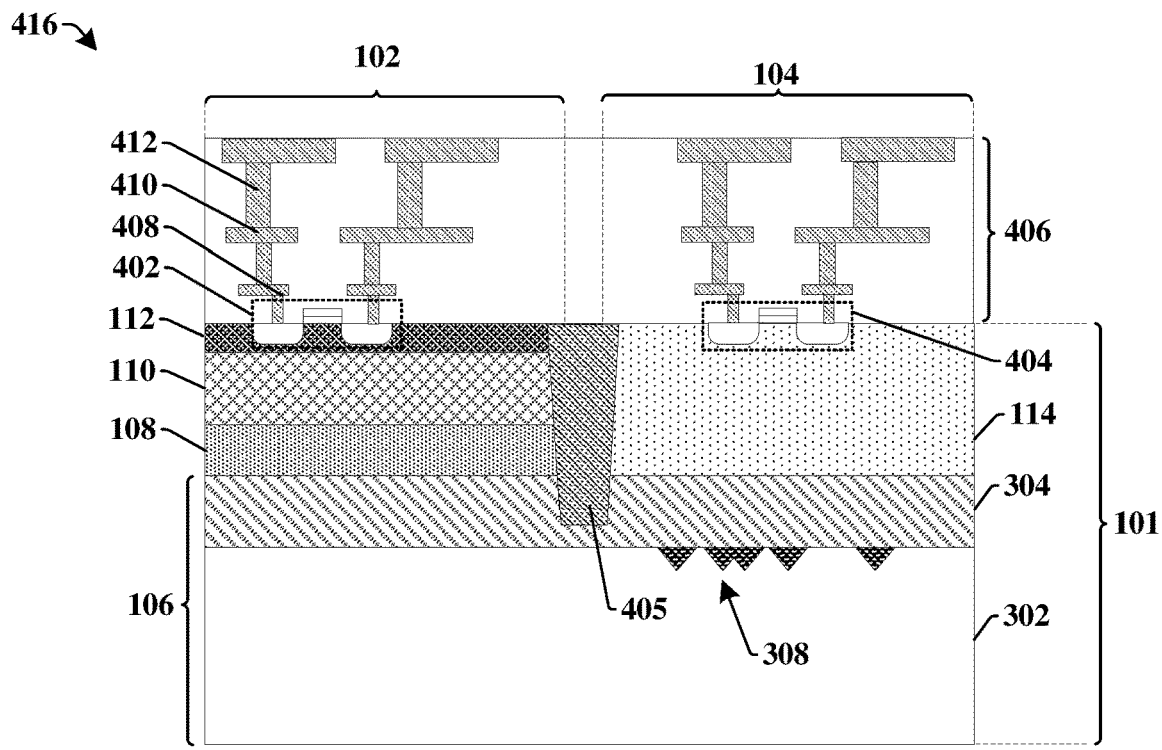

FIGS. 4A-4B illustrate cross-sectional views of some additional embodiments of integrated chips, 400 and 416, having a multi-function substrate.

The integrated chip 400 of FIG. 4A and the integrated chip 416 of FIG. 4B respectively comprise a substrate 101 having a first region 102 and a second region 104. A first device 402 is disposed within an active semiconductor layer 112 arranged along an upper surface of the substrate 101 within the first region 102, and a second device 404 is disposed within a semiconductor material 114 arranged along the upper surface of the substrate 101 within the second region 104. The first device 402 is a different type of device than the second device 404. For example, in some embodiments the first device 402 may comprise a low noise amplifier (LNA), a transmit/receive (T/R) switch, or the like, and the second device may comprise a core CMOS device (e.g., core NMOS device and/or core PMOS device within a processor), an I/O CMOS device, a high-voltage device, or the like.

Although the integrated chip 400 of FIG. 4A and the integrated chip 416 of FIG. 4B illustrate a single device within the first region 102 and the second region 104, it will be appreciated that the first region 102 and the second region 104 may respectively comprise a plurality of devices. For example, the first region 102 and/or the second region 104 may have widths that are on the order of millimeters (mm) wide, so that the regions comprise a plurality of devices.

In some embodiments, the first device 402 within the first region 102 and the second device 404 within the second region 104 may be laterally separated by an isolation structure 405 disposed within the substrate 101. In some embodiments, the isolation structure 405 may comprise a shallow trench isolation (STI) structure comprising one or more dielectric materials disposed within a trench in the substrate 101. In some embodiments, the isolation structure 405 may extend to the base substrate 106. In other embodiments (not shown), the isolation structure 405 may have a bottommost surface that is separated from the base substrate 106 by one or more layers (e.g., a gap fill structure 116, a semiconductor material 114, etc.)

An inter-level dielectric (ILD) structure 406 is disposed over the substrate 101 and extends over both the first region 102 and the second region 104. In some embodiments, the ILD structure 406 comprises a plurality of stacked ILD layers disposed over the substrate 101. In some embodiments, the plurality of stacked ILD layers may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like.

The ILD structure 406 surrounds a plurality of interconnects 408-412. In some embodiments, the plurality of interconnects 408-412 may comprise one or more of a middle of line (MOL) interconnect, a conductive contact 408, an interconnect wire 410, an interconnect via 412, or the like. In some embodiments, the plurality of interconnects 408-412 may comprise one or more of copper, tungsten, ruthenium, aluminum, or the like. Having the plurality of interconnects 408-412 within the ILD structure 406 coupled the different types of devices within the first region 102 and the second region 104, provides the integrated chips 400 and 416 with good performance since the interconnects are relatively short (e.g., shorter than interconnects between an SOI die and a bulk die) and thereby provide for relatively low resistances.

Figure 5A:
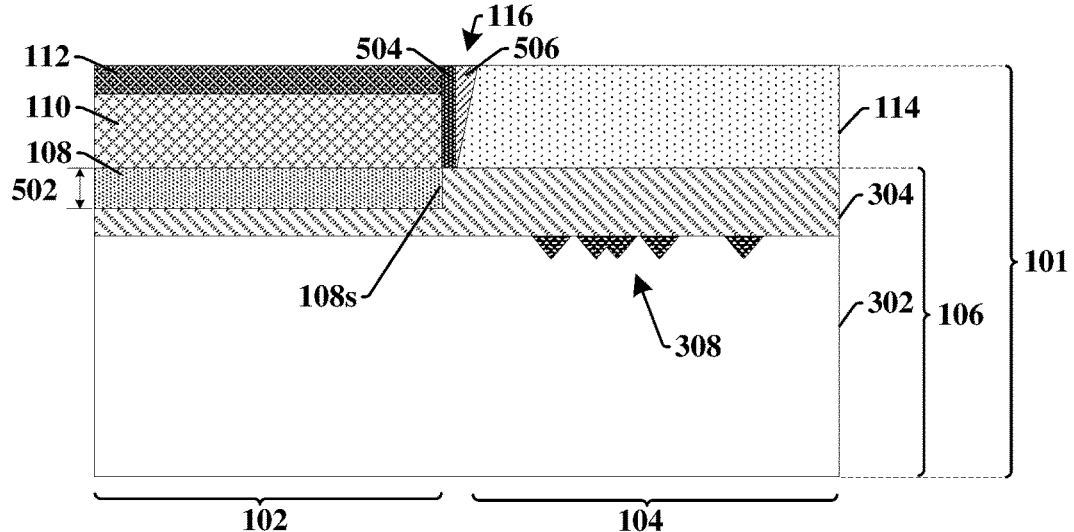
FIGS. 5A-5D illustrate cross-sectional views of some additional embodiments of multi-function substrate having different regions with different structures.

FIG. 5A illustrates a cross-sectional view of some additional embodiments of an integrated chip 500 having a multi-function substrate.

The integrated chip 500 comprises a substrate 101 having an epitaxial layer 304 disposed over a semiconductor body 302 within a first region 102 and within a second region 104. Within the first region 102, a polysilicon layer 108 is disposed over and recessed within the epitaxial layer 304. In some embodiments, a bottommost surface of the polysilicon layer 108 is separated from the semiconductor body 302 by the epitaxial layer 304. In such embodiments, a sidewall 108s of the polysilicon layer 108 is arranged along a sidewall of the epitaxial layer 304. In some embodiments, the polysilicon layer 108 may be recessed to a first distance 502 below an upper surface of the epitaxial layer 304. In some embodiments, the first distance 502 may be in a range of greater than approximately 100 nm, greater than approximately 50 nm, or other similar values. In some embodiments, the polysilicon layer 108 may have an upper surface that is substantially co-planar with an upper surface of the epitaxial layer 304.

A gap fill structure 116 extends through a semiconductor material 114 to contact an upper surface of the epitaxial layer 304. In some embodiments, the gap fill structure 116 may completely cover sidewalls of the semiconductor material 114, a dielectric layer 110, and an active semiconductor layer 112. In some embodiments, the gap fill structure 116 comprises a spacer 504 and a gap fill material 506 arranged along a sidewall of the spacer 504. In some embodiments, the gap fill material 506 may cover a sidewall of the semiconductor material 114 and the spacer 504 may cover sidewalls of the dielectric layer 110 and the active semiconductor layer 112. In some embodiments, the gap fill material 506 may comprise a semiconductor material such as silicon, germanium, or the like. In some embodiments, the spacer 504 may comprise one or more dielectric materials, such as an oxide, a nitride, a carbide, or the like.

Figure 5B:
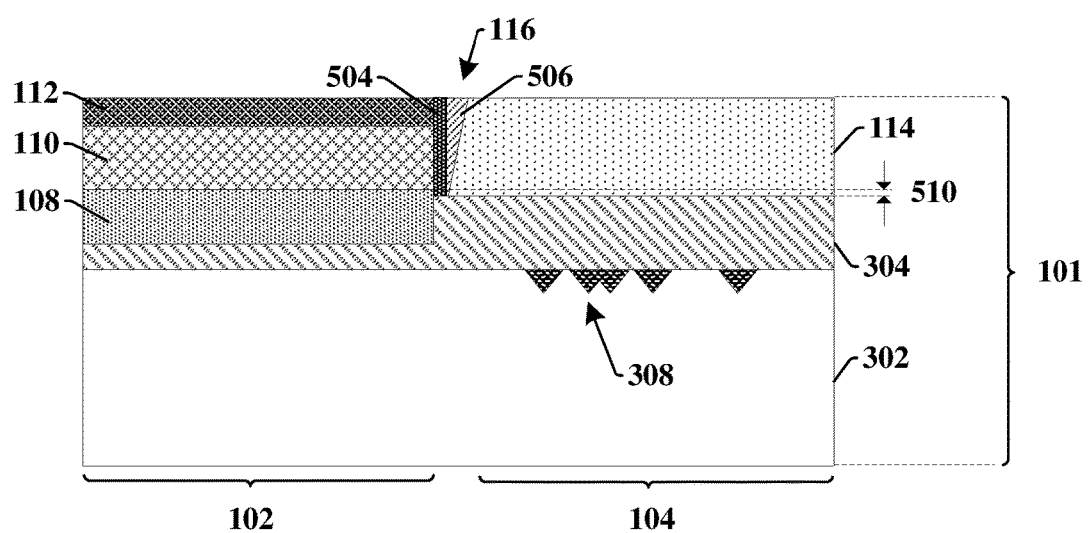

FIG. 5B illustrates a cross-sectional view of some additional embodiments of an integrated chip 508 having a multi-function substrate.

The integrated chip 508 comprises a polysilicon layer 108 recessed within the epitaxial layer 304. The polysilicon layer 108 protrudes outward from the epitaxial layer 304 to a second distance 510 above an upper surface of the epitaxial layer 304, so that the polysilicon layer 108 continuously extends from along a sidewall of the epitaxial layer 304 to above an uppermost surface of the epitaxial layer 304. In some embodiments, a gap fill material 506 may cover a sidewall of a semiconductor material 114 and a spacer 504 may cover sidewalls of the polysilicon layer 108, a dielectric layer 110 over the polysilicon layer 108, and an active semiconductor layer 112 over the dielectric layer 110. In some embodiments, the polysilicon layer 108 may protrude outward from the epitaxial layer 304 to a second distance 510 above an upper surface of the epitaxial layer 304.

Figure 5C:
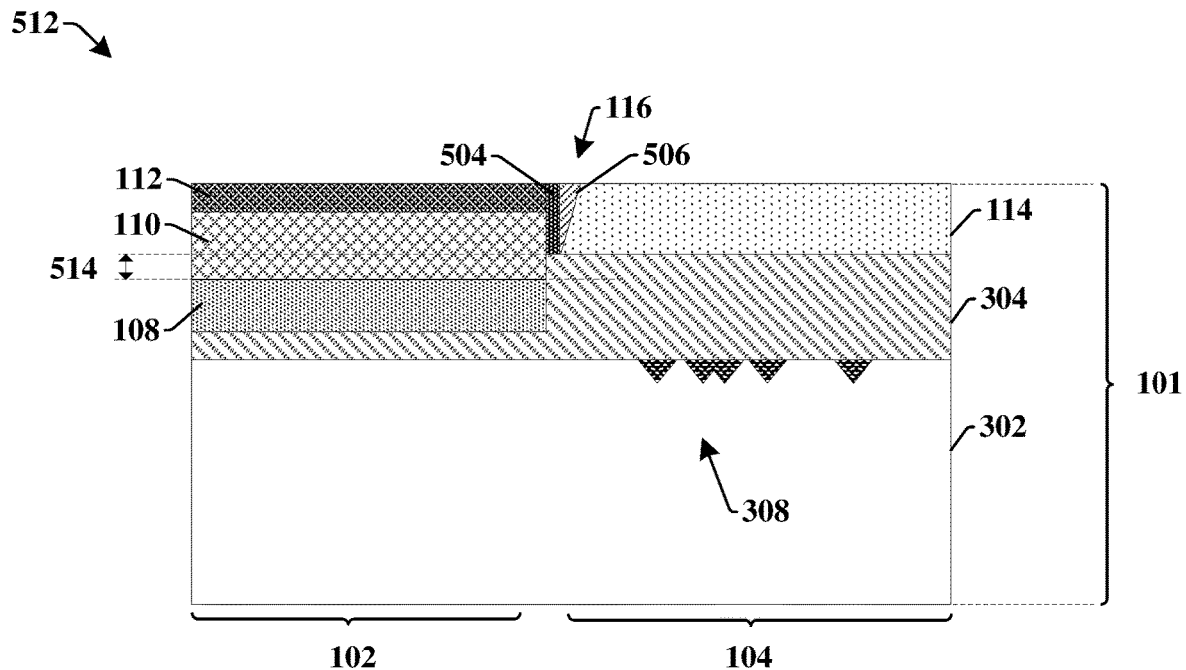

FIG. 5C illustrates a cross-sectional view of some additional embodiments of an integrated chip 512 having a multi-function substrate.

The integrated chip 512 comprises a polysilicon layer 108 recessed within the epitaxial layer 304. In some embodiments, a polysilicon layer 108 is recessed below an upper surface of the epitaxial layer 304. In some embodiments, the epitaxial layer 304 may extend along sidewalls of the polysilicon layer 108 and a dielectric layer 110 over the polysilicon layer 108. In some embodiments, the polysilicon layer 108 may have an uppermost surface that is recessed a third distance 514 below an uppermost surface of the epitaxial layer 304, so that the epitaxial layer 304 continuously extends from below the uppermost surface of the polysilicon layer 108 to above the uppermost surface of the polysilicon layer 108.

Figure 5D:
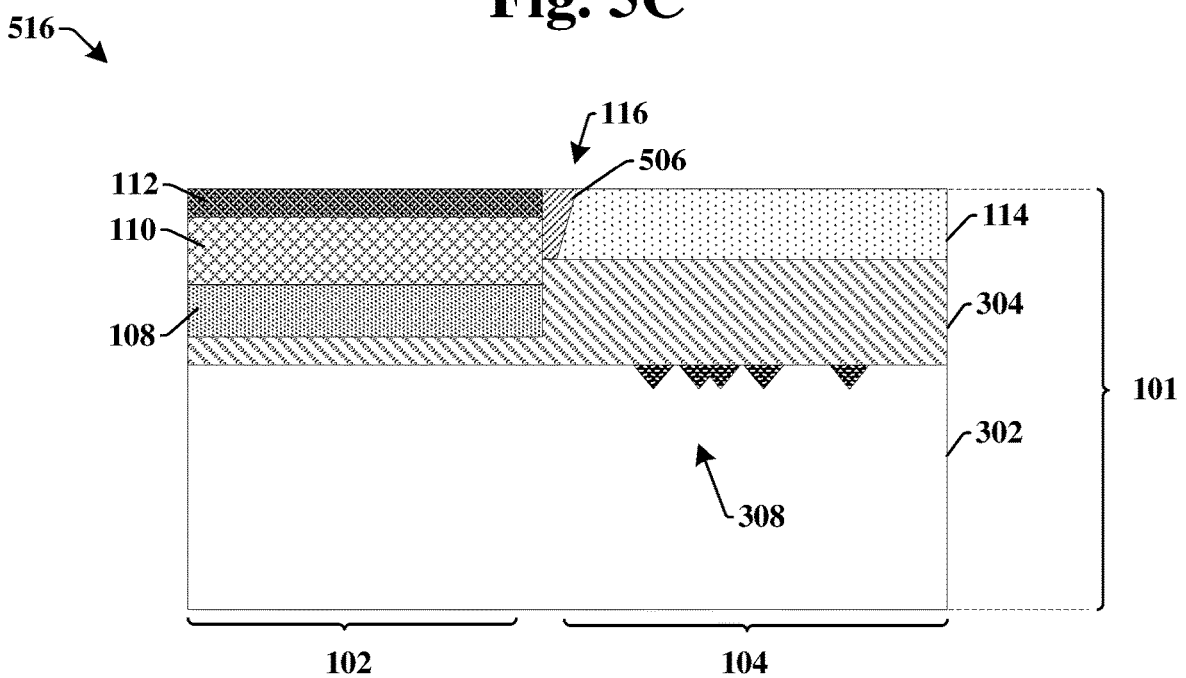

It will be appreciated that in some embodiments, the disclosed integrated chip (e.g., shown in FIGS. 1-9) may comprise a gap fill structure 116 that includes a gap fill material 506 and not a spacer 504. For example, FIG. 5D illustrates a cross-sectional view of some embodiments of an integrated chip 516 having a multi-function substrate having a gap fill structure 116 that does not have a spacer 504.

The integrated chip 516 comprises a polysilicon layer 108 recessed within the epitaxial layer 304. Within a first region 102, a dielectric layer 110 is over the polysilicon layer 108 and an active semiconductor layer 112 is over the dielectric layer 110. Within a second region 104, a semiconductor material 114 is over the epitaxial layer 304. A gap fill structure 116 is disposed laterally between the first region 102 and the second region 104. In some embodiments, the gap fill structure 116 comprises the gap fill material 506 without the spacer 504, such that the gap fill structure 116 is a gap fill material 506. The gap fill material 506 may continuously extend from a sidewall of the dielectric layer 110 to a sidewall of the semiconductor material 114. In some embodiments, the gap fill material 506 may comprise a semiconductor material, such as silicon, germanium, or the like. In some embodiments, the gap fill material 506 may be partially polysilicon and partially silicon, due to imperfect growth of the gap fill material 506 along sidewalls of the dielectric layer 110 and/or the polysilicon layer 108.

Figure 6A:
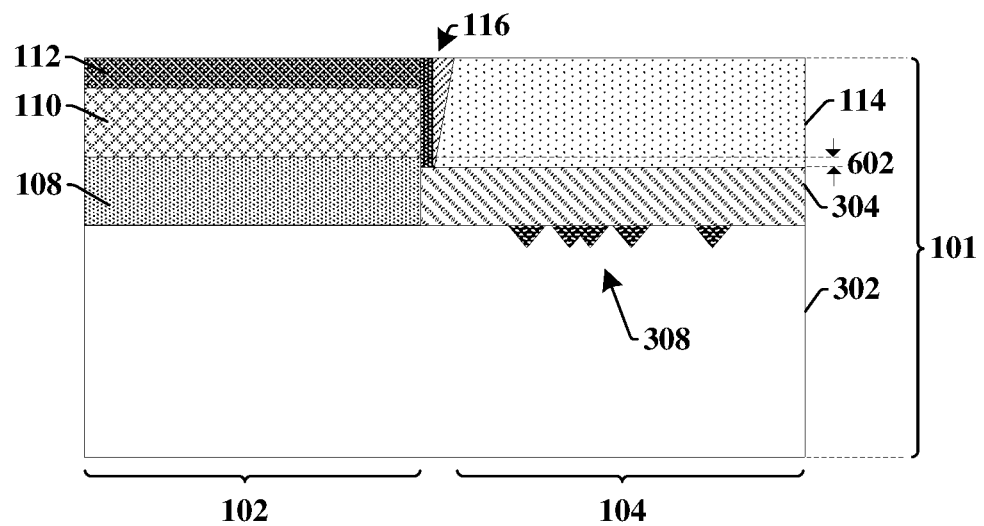
FIGS. 6A-6B illustrate cross-sectional views of some additional embodiments of multi-function substrates having different regions with different structures.

FIG. 6A illustrates a cross-sectional view of some additional embodiments of an integrated chip 600 having a multi-function substrate.

The integrated chip 600 comprises a substrate 101 having a first region 102 and a second region 104. Within the first region 102, a polysilicon layer 108 is disposed on a semiconductor body 302, a dielectric layer 110 is disposed over the polysilicon layer 108, and an active semiconductor layer 112 is disposed over the dielectric layer 110. Within the second region 104, an epitaxial layer 304 is disposed on the semiconductor body 302 and a semiconductor material 114 is disposed over the epitaxial layer 304.

In some embodiments, the polysilicon layer 108 has an outermost sidewall that faces and/or contacts an outermost sidewall of the epitaxial layer 304. In some such embodiments, the polysilicon layer 108 and the epitaxial layer 304 have lower surfaces that contact the semiconductor body 302. In some additional embodiments, the polysilicon layer 108 and the epitaxial layer 304 have lower surfaces are substantially co-planar. In some embodiments, the polysilicon layer 108 has an upper surface that is a first distance 602 over an upper surface of the epitaxial layer 304.

Figure 6B:
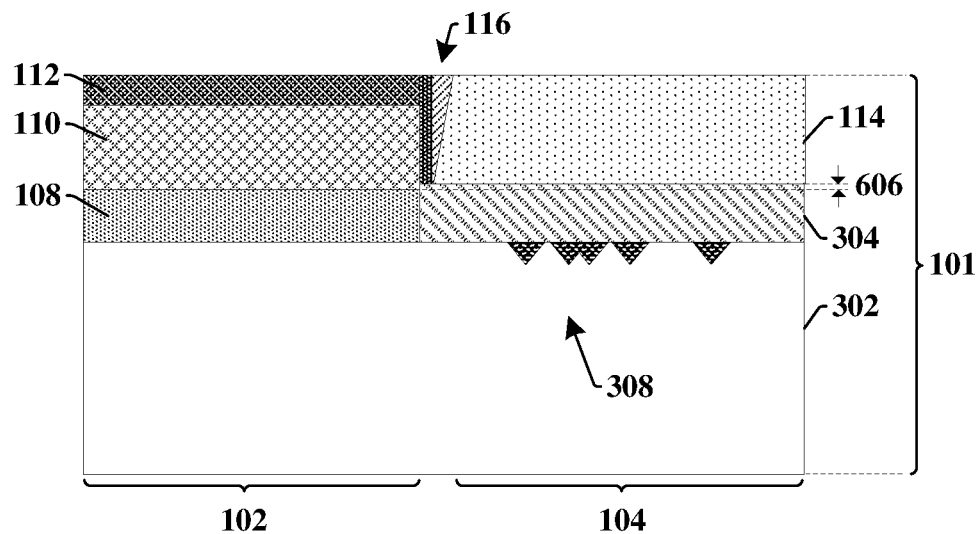

FIG. 6B illustrates a cross-sectional view of some additional embodiments of an integrated chip 604 having a multi-function substrate.

The integrated chip 604 comprises a substrate 101 having a first region 102 and a second region 104. Within the first region 102, a polysilicon layer 108 is disposed on a semiconductor body 302, a dielectric layer 110 is disposed over the polysilicon layer 108, and an active semiconductor layer 112 is disposed over the dielectric layer 110. Within the second region 104, an epitaxial layer 304 is disposed on the semiconductor body 302 and a semiconductor material 114 is disposed over the epitaxial layer 304. In some embodiments, the polysilicon layer 108 and the epitaxial layer 304 have lower surfaces that contact the semiconductor body 302. In some such embodiments, the polysilicon layer 108 and the epitaxial layer 304 have lower surfaces are substantially co-planar. In some embodiments, the polysilicon layer 108 has an upper surface that is a second distance 606 below an upper surface of the epitaxial layer 304.

Figure 7:
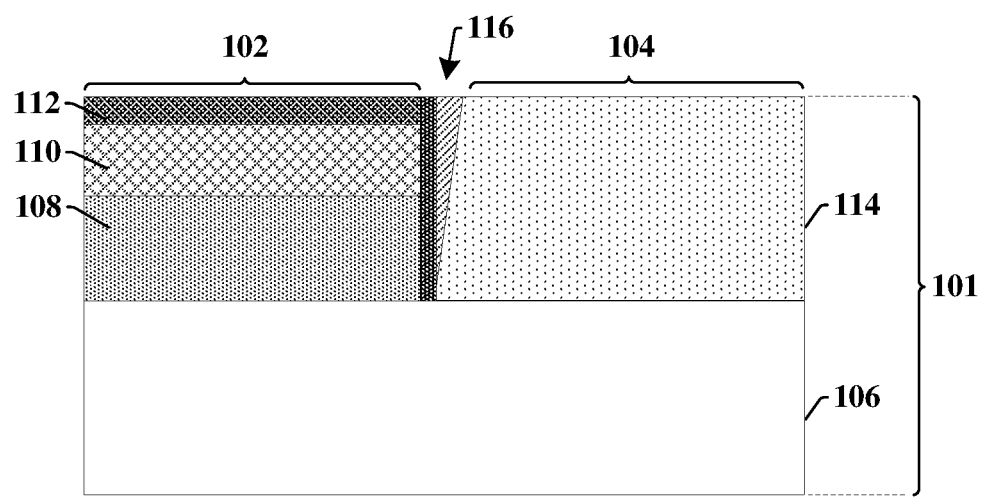
FIG. 7 illustrates a cross-sectional view of some additional embodiments of a multi-function substrate having different regions with different structures.

FIG. 7 illustrates a cross-sectional view of some additional embodiments of an integrated chip 700 having a multi-function substrate.

The integrated chip 700 comprises a substrate 101 having a first region 102 and a second region 104. Within the first region 102, a polysilicon layer 108 is disposed on a base substrate 106, a dielectric layer 110 is disposed over the polysilicon layer 108, and an active semiconductor layer 112 is disposed over the dielectric layer 110. Within the second region 104, a semiconductor material 114 is disposed on the base substrate 106.

A gap fill structure 116 extends through the semiconductor material 114 to contact the upper surface of the base substrate 106. In some embodiments, the gap fill structure 116 comprises a gap fill material 506 and a spacer 504 arranged along a sidewall of the gap fill material 506. In some embodiments, the gap fill material 506 may completely cover a sidewall of the semiconductor material 114 and the spacer 504 may completely cover sidewalls of the polysilicon layer 108, the dielectric layer 110, and the active semiconductor layer 112.

Figure 8:
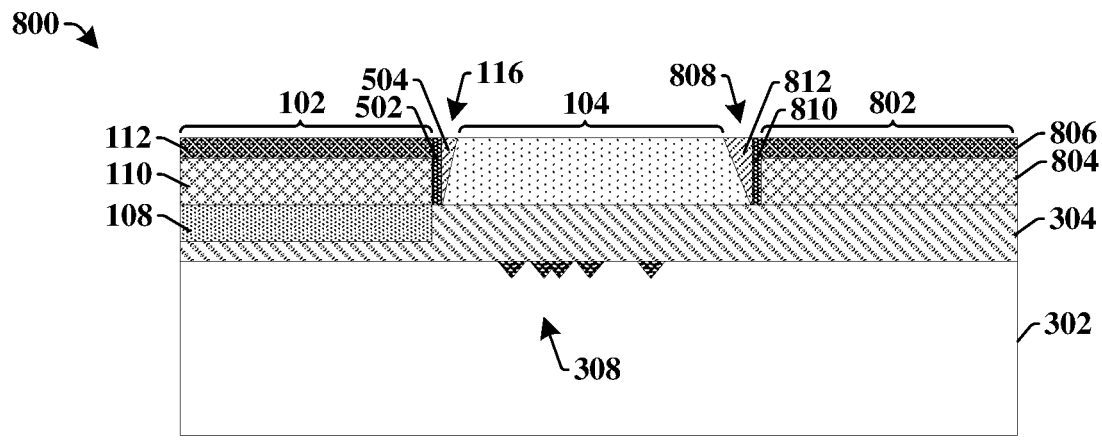
FIGS. 8-9 illustrate cross-sectional views of some additional embodiments of a multi-function substrate having three different regions with different structures.

FIG. 8 illustrates a cross-sectional view of some additional embodiments of an integrated chip 800 having a multi-function substrate with three different regions.

The integrated chip 800 comprises a substrate 101 having a first region 102, a second region 104, and a third region 802. The first region 102, the second region 104, and the third region 802 have different structures (e.g., stacks of one or more different layers or materials) that provide for different characteristics that enable improved performance of different types of devices. In some embodiments, the first region 102 may comprise a first SOI region, the second region 104 may comprise a bulk region, and the third region 802 may comprise a second SOI region that is different than the first SOI region. In some embodiments, the substrate 101 may comprise a die, a wafer, or the like.

The first region 102 comprises an epitaxial layer 304 disposed over a base substrate 106, a polysilicon layer 108 disposed over the epitaxial layer 304, a dielectric layer 110 arranged over the polysilicon layer 108, and an active semiconductor layer 112 arranged over the dielectric layer 110. The second region 104 comprises the epitaxial layer 304 and a semiconductor material 114 disposed over the epitaxial layer 304. The third region 802 comprises the epitaxial layer 304, a second dielectric layer 804 disposed over the epitaxial layer 304, and a second active semiconductor layer 806 arranged over the second dielectric layer 804. In some embodiments, the epitaxial layer 304 continuously extends from within the first region 102, to within the second region 104, and to within the third region 802.

In some embodiments, the dielectric layer 110 on the polysilicon layer 108 may have a different thickness than the second dielectric layer 804 on the epitaxial layer 304. For example, in some embodiments, the dielectric layer 110 on the polysilicon layer 108 may be thicker than the second dielectric layer 804 on the epitaxial layer 304 (e.g., due to oxidation rate differences between the polysilicon layer 108 and the epitaxial layer 304). In some such embodiments, top surfaces of dielectric layer 110 and second dielectric layer 804 may be substantially co-planar, while a bottom surface of dielectric layer 110 is lower than a bottom surface of second dielectric layer 804.

A gap fill structure 116 is arranged on a first side of the second region 104, which is between the first region 102 and the second region 104. The gap fill structure 116 vertically extends through the semiconductor material 114 to contact an upper surface of the epitaxial layer 304. In some embodiments, the gap fill structure 116 comprises a gap fill material 506 and a spacer 504 arranged along a sidewall of the gap fill material 506.

A second gap fill structure 808 is arranged on a second side of the second region 104, which is between the second region 104 and the third region 802. The second gap fill structure 808 vertically extends through the semiconductor material 114 to contact the upper surface of the epitaxial layer 304. In some embodiments, the second gap fill structure 808 comprises a second gap fill material 810 and one or more second dielectric materials 812 arranged along a sidewall of the gap fill material 810.

Figure 9:
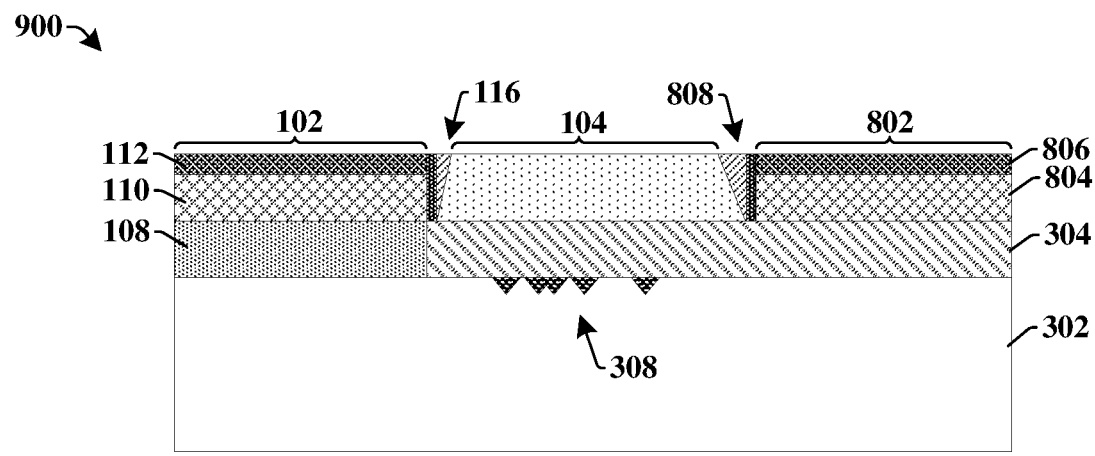

It will be appreciated that the structures of the first region 102, the second region 104, and the third region 802 shown in FIG. 8 are non-limiting embodiments of the structures and that in alternative embodiments, the first region 102, the second region 104, and/or the third region 802 may have structures as shown in the embodiments of FIGS. 1-8. For example, FIG. 9 illustrates a cross-sectional view of some alternative embodiments of an integrated chip 900 having a multi-function substrate with three regions. As shown in FIG. 9, within a first region 102 the integrated chip 900 comprises a polysilicon layer 108 disposed over a semiconductor body 302, a dielectric layer 110 arranged over the polysilicon layer 108, and an active semiconductor layer 112 arranged over the dielectric layer 110. Within a second region 104, the epitaxial layer 304 is disposed over the semiconductor body 302 and a semiconductor material 114 is disposed over the epitaxial layer 304. Within a third region 802, the epitaxial layer 304 is disposed over the semiconductor body 302, a second dielectric layer 804 is disposed over the epitaxial layer 304, and a second active semiconductor layer 806 is arranged over the second dielectric layer 804. In some embodiments, the epitaxial layer 304 continuously extends from within the second region 104 to within the third region 802.

FIGS. 10-30 illustrate cross-sectional views 1000-3000 of some embodiments of a method of forming a multi-function integrated chip. Although FIGS. 10-30 are described in relation to a method, it will be appreciated that the structures disclosed in FIGS. 10-30 are not limited to such a method, but instead may stand alone as structures independent of the method.

Figure 10:
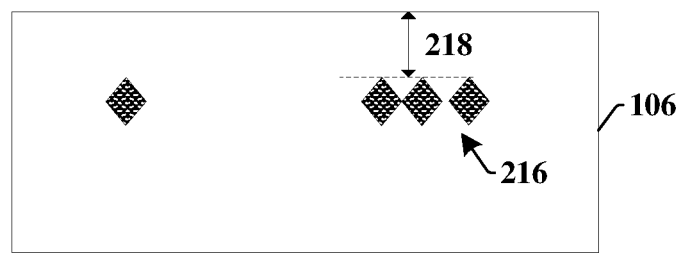
FIGS. 10-30 illustrate cross-sectional views of some embodiments of a method of forming a multi-function substrate.

As shown in cross-sectional view 1000 of FIG. 10, a base substrate 106 is provided. In some embodiments, the base substrate 106 may comprise a semiconductor material such as silicon, germanium, or the like. In some embodiments, the base substrate 106 is a high resistivity substrate (e.g., a substrate having a resistivity of greater than or equal to approximately 1 kΩ-cm, greater than or equal to approximately 3 kΩ-cm, etc.). In some embodiments, the base substrate 106 may be doped with a first dopant species having a doping concentration of greater than or equal to approximately greater than approximately 1e13 at/cm$^3$, less than approximately 1.4e13 at/cm$^3$, approximately 1e15 at/cm$^3$, or other similar values. In various embodiments, the base substrate 106 may comprise a wafer, a die, or the like.

In some embodiments, an anneal process may be performed on the base substrate 106 to reduce defects (e.g., COP defects) within the base substrate 106. In some embodiments, the anneal process may be performed by exposing the base substrate 106 to a first temperature for a first time. In some embodiments, the first temperature may be greater than or equal to approximately 1100° C., greater than or equal to approximately 1150° C., greater than or equal to approximately 1200° C., or other similar values. In some embodiments, the anneal process may be performed in a hydrogen (H$_2$) ambient, an argon ambient, or the like. The anneal process reduces and/or removes COP defects from along an upper surface of the base substrate 106, so as to form a region 218 of the base substrate that is substantially devoid of defects. In some embodiments, one or more defects 216 may be present within the base substrate 106 below the region 218.

As shown in cross-sectional view 1100 of FIG. 11A, a polysilicon layer 108 is formed onto the base substrate 106. In some embodiments, the polysilicon layer 108 may comprise a trap-rich (TR) polysilicon layer (e.g., a polysilicon layer having a trap density of greater than approximately 10$^{10}$ cm$^2$ eV$^{-1}$, greater than approximately 10$^9$ cm$^2$ eV$^{-1}$, or other similar values). In some embodiments, the polysilicon layer 108 may be formed to a thickness of between approximately 2 kÅ and approximately 6 kÅ, between approximately 3 kÅ and approximately 4 kÅ, between approximately 3 kÅ and approximately 2 μm, or other similar values. In some embodiments, the polysilicon layer 108 may be formed by a deposition process (e.g., a physical vapor deposition (PVD) process, a chemical vapor deposition process (CVD) process, a plasma enhanced CVD (PE-CVD) process, reduced-pressure CVD (RP-CVD), atmospheric-pressure CVD (APCVD), or the like).

Figure 12A:
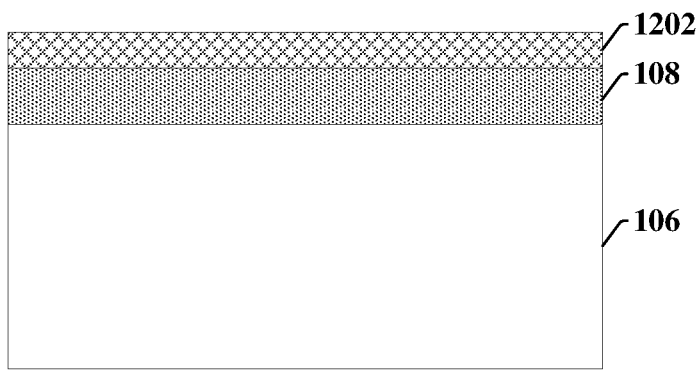

As shown in cross-sectional view 1200 of FIG. 12A, a first dielectric layer 1202 is formed onto the polysilicon layer 108, in some embodiments. In some embodiments, the first dielectric layer 1202 may comprise an oxide (e.g., silicon oxide), a nitride (e.g., silicon nitride, silicon oxynitride, etc.), a carbide (e.g., silicon carbide, silicon oxycarbide, etc.), or the like. In some embodiments, the first dielectric layer 1202 may be formed to a thickness that is in a range of between approximately 0 Å and approximately 2 kÅ, between approximately 500 Å and approximately 1 kÅ, or other similar values. In some embodiments, the first dielectric layer 1202 may be formed by a deposition process (e.g., a PVD process, a CVD process, a PE-CVD process, an ALD process, or the like), or a thermal oxidation process, or the like.

Figure 11:
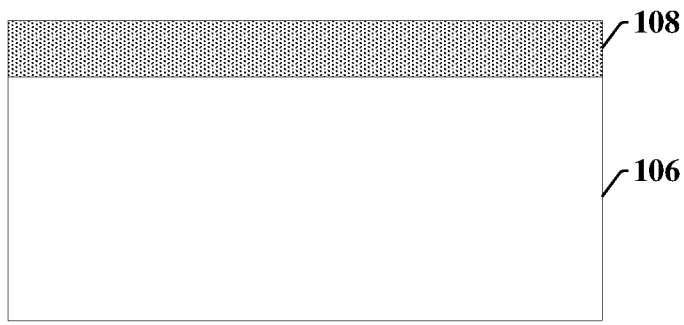
Figure 12B:
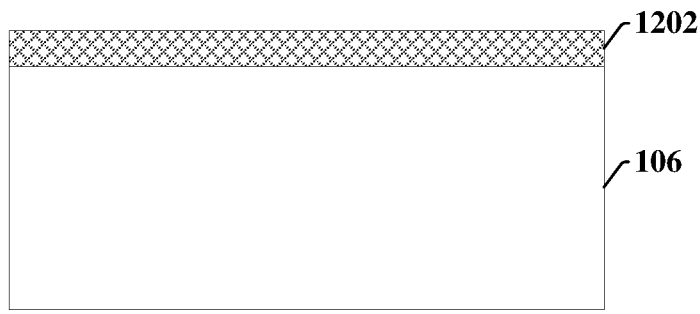

In some alternative embodiments, shown in cross-sectional view 1204 of FIG. 12B, the acts shown in FIG. 11 may be omitted and the method described in FIGS. 10-30 may not form a polysilicon layer (e.g., 108) onto the base substrate 106. In such embodiments, the first dielectric layer 1202 is formed directly onto the base substrate 106, as shown in cross-sectional view 1204. Although subsequent cross-sectional views shown in this method (e.g., cross-sectional views 1300-3000 of FIGS. 13-30) illustrate a polysilicon layer 108 on the base substrate 106, it will be appreciated that in alternative embodiments the polysilicon layer may be omitted in these cross-sectional views.

Figure 13:

As shown in cross-sectional view 1300 of FIG. 13, a sacrificial substrate 1302 is provided. In some embodiments, the sacrificial substrate 1302 may comprise a semiconductor material such as silicon, germanium, or the like. In various embodiments, the sacrificial substrate 1302 may comprise a wafer, a die, or the like.

Figure 14:

As shown in cross-sectional view 1400 of FIG. 14, a buffer layer 1402 is formed onto the sacrificial substrate 1302 and an active semiconductor layer 112 is formed onto the buffer layer 1402. In some embodiments, the buffer layer 1402 may comprise a semiconductor compound comprising a same semiconductor material as the sacrificial substrate 1302 and an additional semiconductor material. In some embodiments, the buffer layer 1402 may comprise a same semiconductor material as the base substrate 106. For example, in some embodiments, the sacrificial substrate 1302 may comprise silicon, the buffer layer 1402 may comprise silicon germanium, and the active semiconductor layer 112 may comprise silicon. In some embodiments, the buffer layer 1402 and/or the active semiconductor layer 112 may be formed by a deposition process (e.g., a CVD process, an ALD process, reduced-pressure CVD (RP-CVD), atmospheric-pressure CVD (APCVD), or the like).

Figure 15:
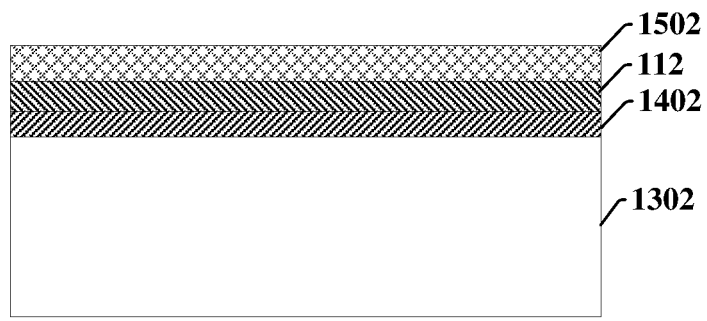

As shown in cross-sectional view 1500 of FIG. 15, a second dielectric layer 1502 is formed onto the active semiconductor layer 112. In some embodiments, the second dielectric layer 1502 may comprise an oxide (e.g., silicon oxide), a nitride (e.g., silicon nitride, silicon oxynitride, etc.), a carbide, or the like. In some embodiments, a second dielectric layer 1502 may be formed to a thickness that is in a range of between approximately 0 Å and approximately 2 kÅ, between approximately 500 Å and approximately 1 kÅ, or other similar values. In some embodiments, the second dielectric layer 1502 may be formed by a deposition process (e.g., a PVD process, a CVD process, a PE-CVD process, an ALD process, or the like), or a thermal oxidation process, or the like.

Figure 16:
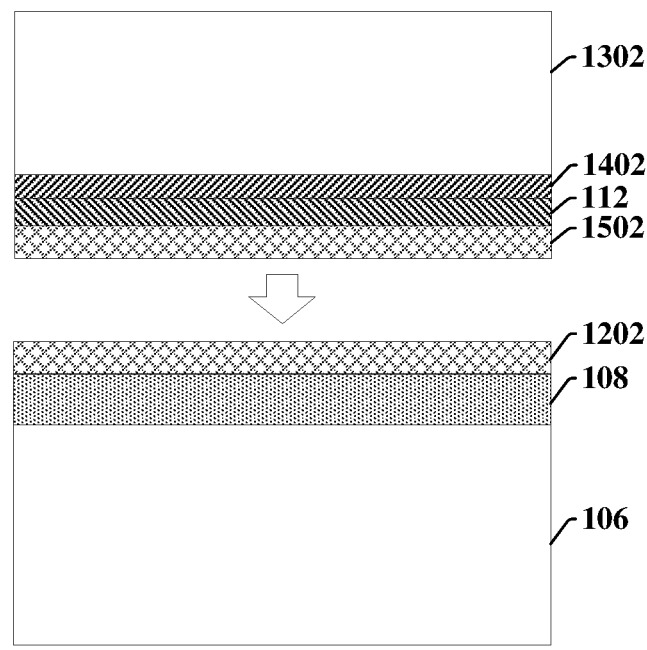
Figure 17:
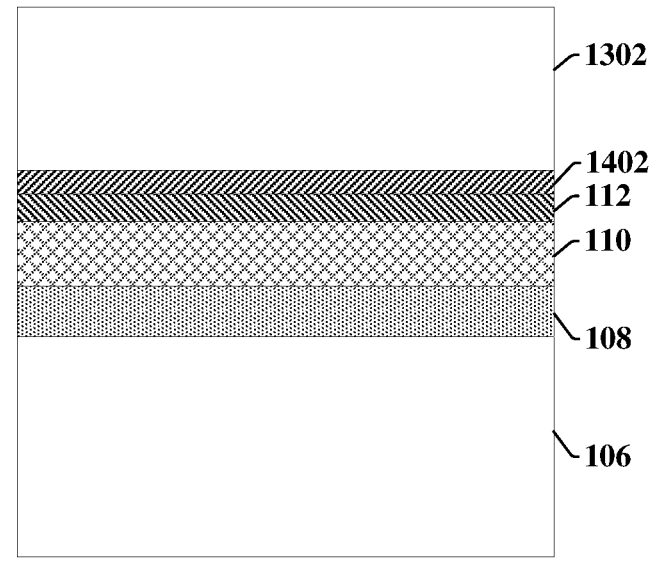

As shown in cross-sectional views 1600-1700 of FIGS. 16-17, the first dielectric layer 1202 is bonded to the second dielectric layer 1502. In some embodiments, the first dielectric layer 1202 may be bonded to the second dielectric layer 1502 by a fusion bonding process. In such embodiments, the first dielectric layer 1202 and the second dielectric layer 1502 are brought into contact and brought to an elevated temperature (e.g., between approximately 150° C. and approximately 1000° C.). The bonding process results in a dielectric layer 110 arranged between the polysilicon layer 108 and the active semiconductor layer 112, as shown in cross-sectional view 1700 of FIG. 17.

Figure 18:
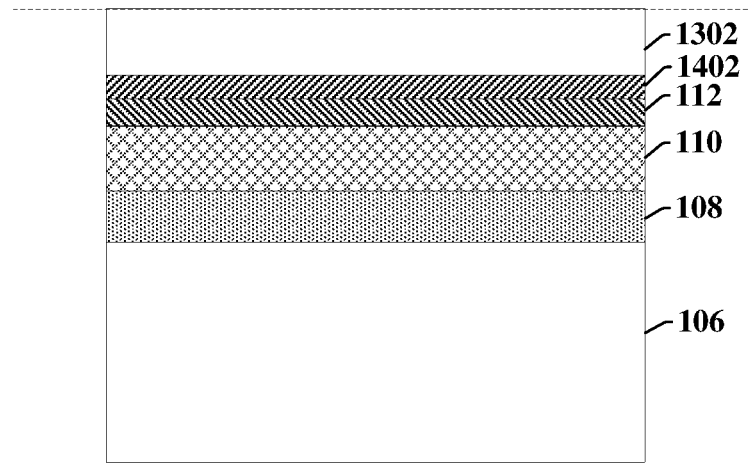
Figure 19:
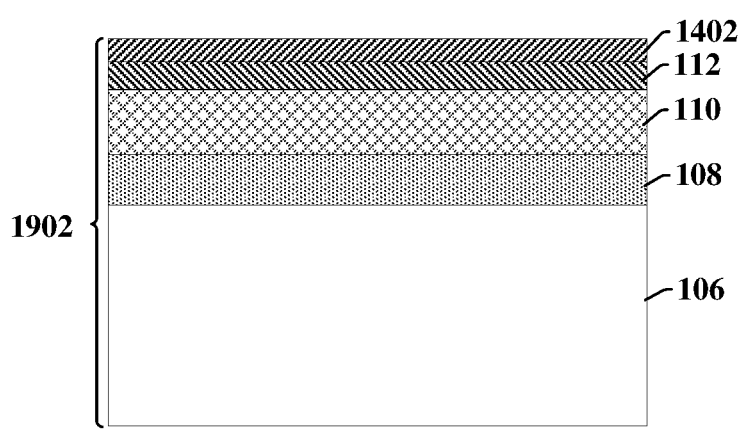

As shown in cross-sectional views 1800-1900 of FIGS. 18-19, the sacrificial substrate 1302 is removed to form a stacked semiconductor structure 1902. In some embodiments, a single process may be used to remove the sacrificial substrate 1302. In other embodiments, a multi-step process may be used to remove the sacrificial substrate 1302 to reduce an impact on the buffer layer 1402. For example, in some embodiments a first process (shown in cross-sectional view 1800 of FIG. 18) may be performed to reduce a thickness of the sacrificial substrate 1302, followed by a second process (shown in cross-sectional view 1900 of FIG. 19) that completely removes a remainder of the sacrificial substrate 1302. In some embodiments, the first process (performed along line 1802) may comprise a planarization process (e.g., a chemical mechanical planarization (CMP) process), a grinding process, or the like. In some embodiments, the second process may comprise a planarization process, an etching process, or the like. In some embodiments, the second process exposes a remainder of the sacrificial substrate 1302 to an etchant 1904 that removes the remainder of the sacrificial substrate 1302

Figure 20:
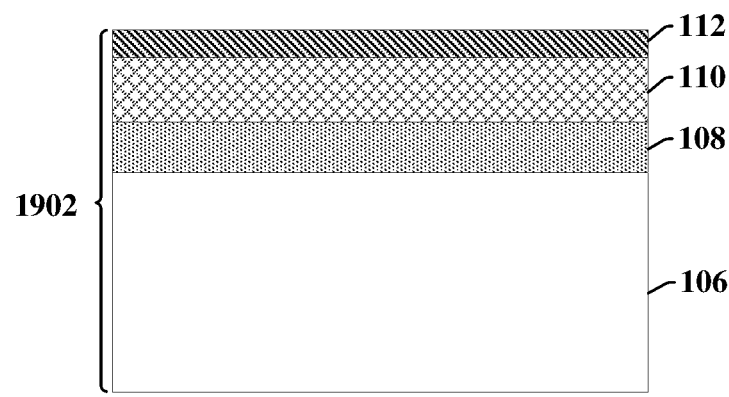

As shown in cross-sectional view 2000 of FIG. 20, the buffer layer (1402 of FIG. 19) is removed. In some embodiments, the buffer layer (1402 of FIG. 19) may be removed by way of an etching process, a CMP process, or the like. In some embodiments, the buffer layer (1402 of FIG. 19) may be exposed to an etchant 2002 that removes the buffer layer. In some embodiments, the etchant 2002 may have a high etching rate for the buffer layer relative to the active semiconductor layer 112, so that the etchant 2002 does not significantly reduce a thickness of the active semiconductor layer 112 and/or cause variations in the thickness of the active semiconductor layer 112. In some embodiments, the etchant 2002 may comprise a wet etchant.

Figure 21:
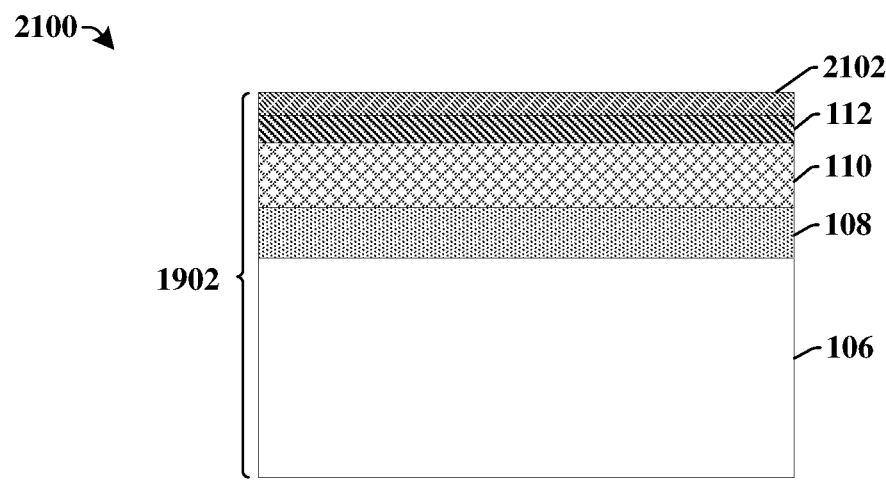

As shown in cross-sectional view 2100 of FIG. 21, a masking layer 2102 is formed over the active semiconductor layer 112. In various embodiments, the masking layer 2102 may comprise an oxide, a nitride, or the like. In some embodiments, the masking layer 2102 may be formed by a deposition process (e.g., a PVD process, a CVD process, a PE-CVD process, an ALD process, or the like), or a thermal oxidation process, or the like. In some embodiments (not shown), wherein the masking layer 2102 comprises an oxide, a photosensitive material (e.g., photoresist) may be formed onto the masking layer 2102. The photosensitive material is configured to protect the masking layer 2102 from being etched away during subsequent etching of the dielectric layer 110 (e.g., as shown in FIG. 24).

Figure 22:
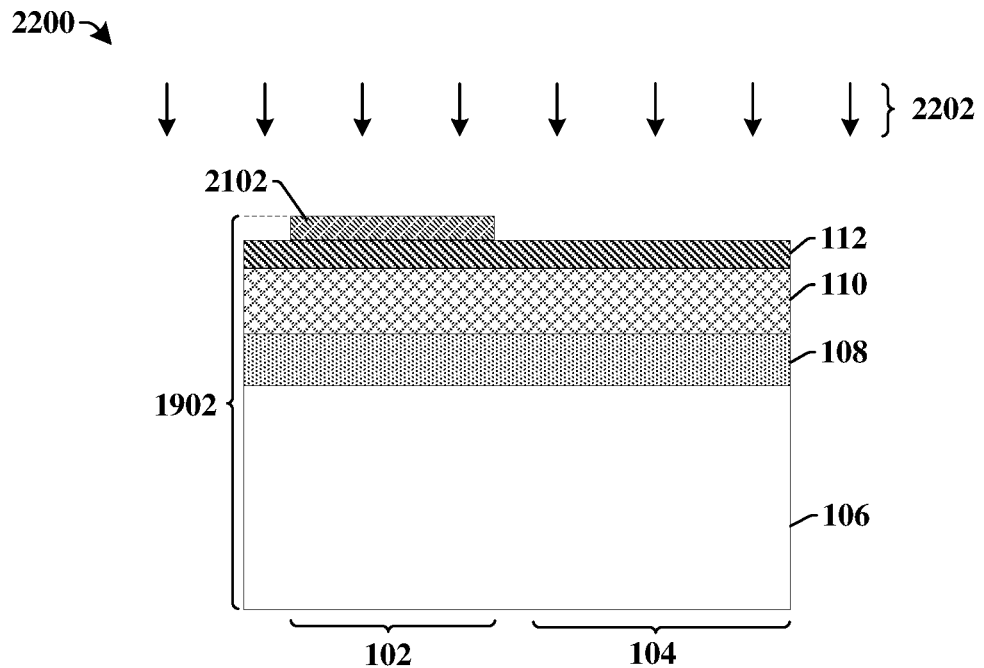

As shown in cross-sectional view 2200 of FIG. 22, the masking layer 2102 is selectively patterned to remove the masking layer 2102 from within a second region 104 of the stacked semiconductor structure 1902, while keeping the masking layer 2102 within a first region 102 of the stacked semiconductor structure 1902. In some embodiments, the masking layer 2102 may be patterned using a lithographic patterning process and/or an etching process using an etchant 2202.

Figure 23:
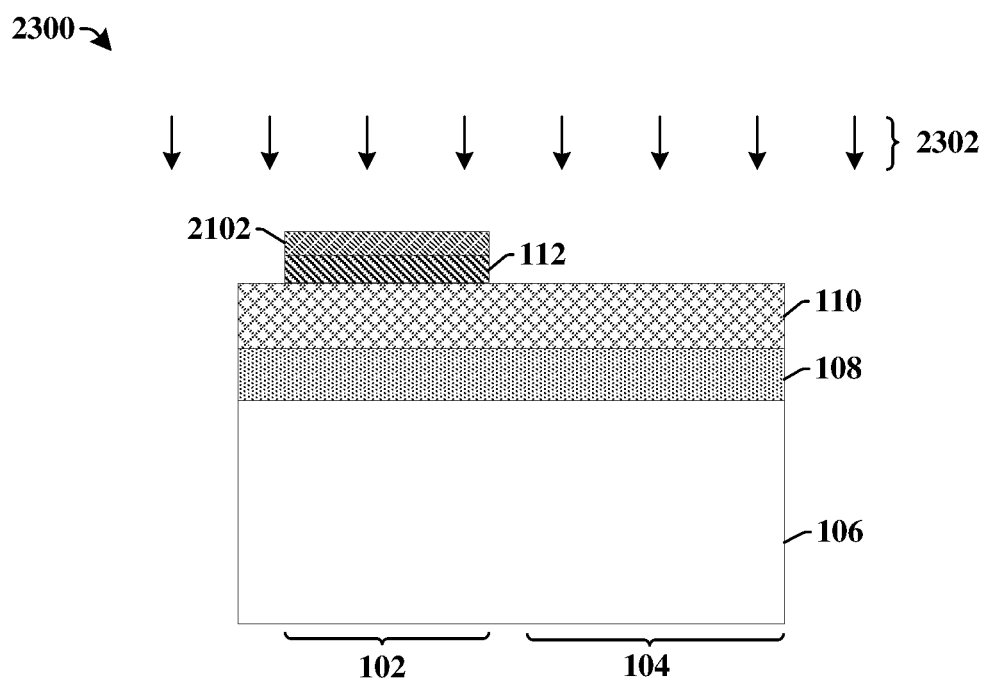

As shown in cross-sectional view 2300 of FIG. 23, the active semiconductor layer 112 is selectively patterned to remove the active semiconductor layer 112 from within the second region 104. In some embodiments, the active semiconductor layer 112 may be patterned by selectively exposing the active semiconductor layer 112 to an etchant 2302 according to the masking layer 2102.

Figure 24:
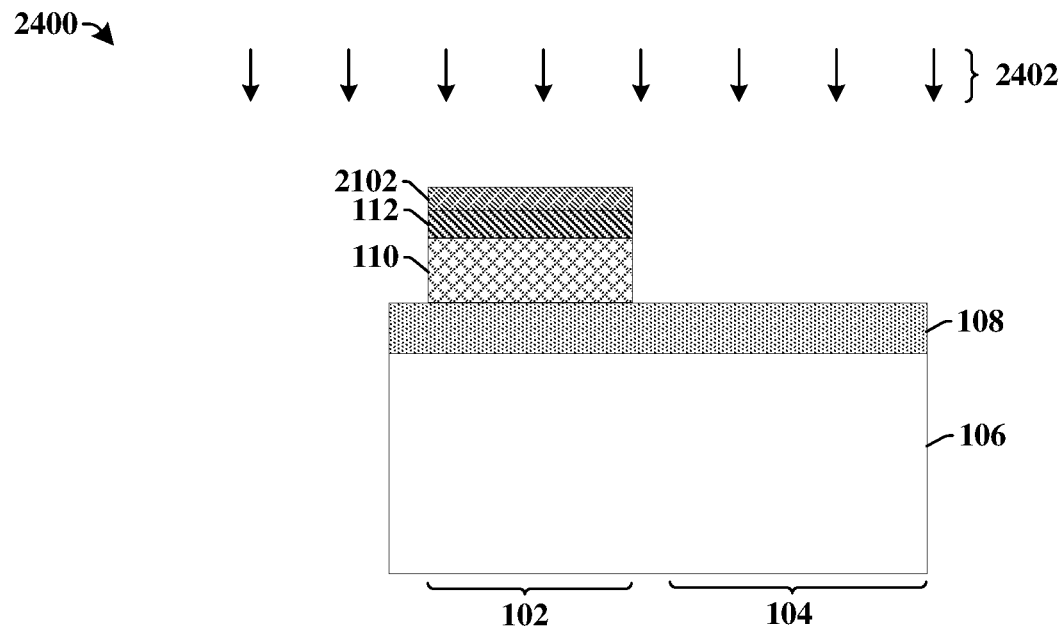

As shown in cross-sectional view 2400 of FIG. 24, the dielectric layer 110 is selectively patterned to remove the dielectric layer 110 from within the second region 104. In some embodiments, the dielectric layer 110 may be patterned by selectively exposing the dielectric layer 110 to an etchant 2402 according to the masking layer 2102.

Figure 25:
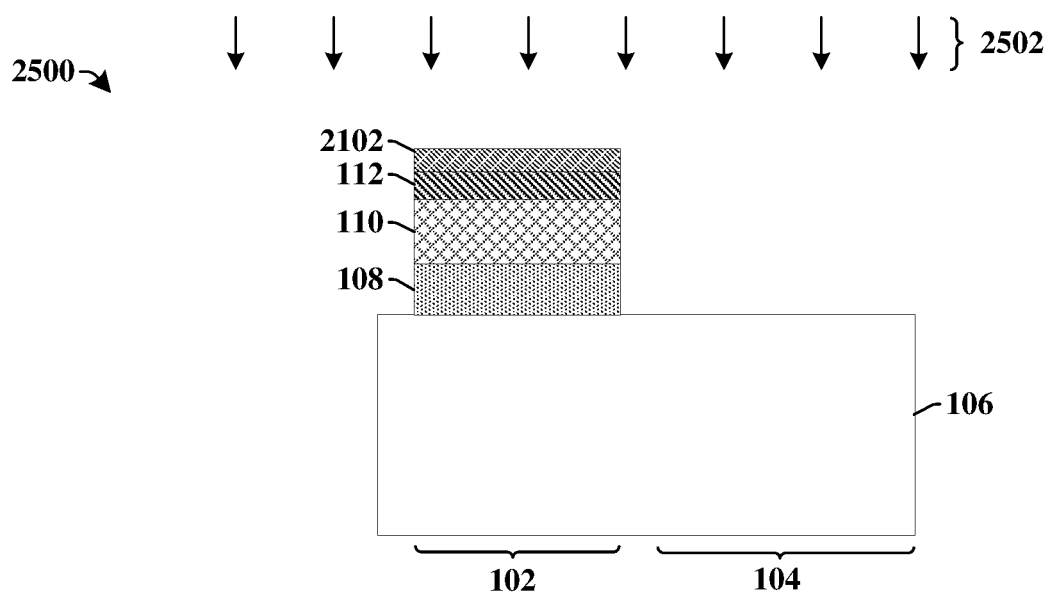

As shown in cross-sectional view 2500 of FIG. 25, the polysilicon layer 108 is selectively patterned to remove the polysilicon layer 108 from within the second region 104. In some embodiments, the polysilicon layer 108 may be patterned by selectively exposing the polysilicon layer 108 to an etchant 2502 according to the masking layer 2102. In some embodiments, the etchant 2502 may over-etch the polysilicon layer 108 to ensure that the polysilicon layer 108 is removed from within the second region 104. In such embodiments, the epitaxial layer 304 may have an upper surface that is recessed below a bottom surface of the polysilicon layer 108. In embodiments where the epitaxial layer 304 is not used, the anneal process is used to reduce COP defects along an upper surface of the base substrate 106 (e.g., as shown in FIG. 10); in such embodiments, the COP defects exposed by the etchant 2502 will be mitigated (e.g., eliminated).

Figure 26:
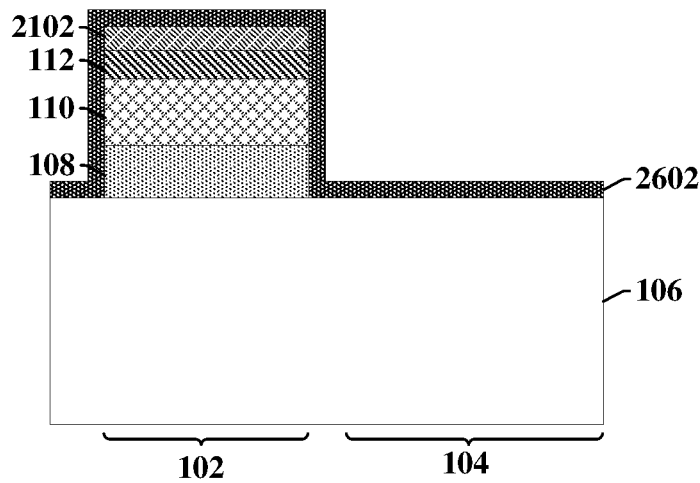
Figure 26:
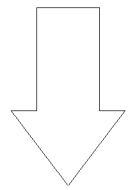
Figure 26:
Figure 26:
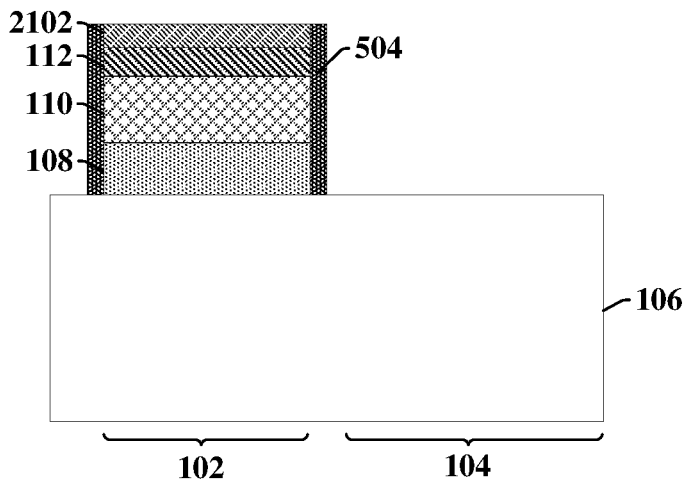

As shown in cross-sectional views 2600 and 2604 of FIG. 26, a spacer 504 may be formed on the exposed sidewalls of the polysilicon layer 108, the dielectric layer 110, the active semiconductor layer 112, and the masking layer 2102. In some embodiments, the spacer 504 may be formed by forming a spacer material 2602 over the base substrate 106 and along sidewalls of the polysilicon layer 108, the dielectric layer 110, the active semiconductor layer 112, and the masking layer 2102. In various embodiments, the spacer material 2602 may comprise silicon nitride, silicon dioxide, silicon oxynitride, and/or the like.

As shown in cross-sectional view 2604, the spacer material 2602 is etched. In some embodiments, the spacer material 2602 may be exposed to an etchant 2606 (e.g., a dry etchant), which removes the spacer material 2602 from horizontal surfaces. Removing the spacer material 2602 from horizontal surfaces leaves a part of the spacer material 2602, which forms the spacer 504, along sidewalls of the polysilicon layer 108, the dielectric layer 110, the active semiconductor layer 112, and the masking layer 2102.

Figure 27:
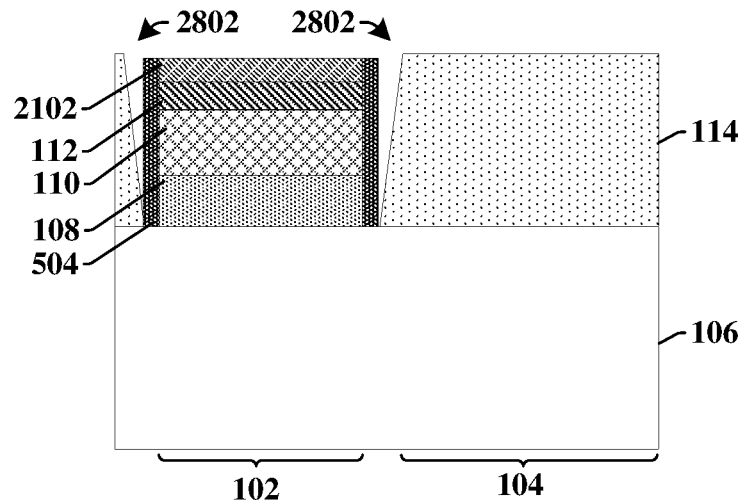

As shown in cross-sectional view 2700 of FIG. 27, a semiconductor material 114 is epitaxially formed within the second region 104. Because the anneal process has reduced COP defects along an upper surface of the base substrate 106, the semiconductor material 114 can be epitaxially grown without being significantly impacted by the COP defects within the base substrate 106. The semiconductor material 114 may be formed to a height that extends to a top surface of the masking layer 2102. In some embodiments, the spacer 504 prevents the semiconductor material 114 from forming along sidewalls of the spacer 504, leaving gaps 2802 between a sidewall of the spacer 504 and the semiconductor material 114. In some embodiments, the semiconductor material 114 may be formed to a thickness of greater than approximately 5 kÅ, to a thickness of greater than approximately 6 kÅ, to a thickness of greater than approximately 7 kÅ, to a thickness of greater than approximately 1 µm, to a thickness of greater than approximately 2 µm, or other similar values. In some embodiments, the semiconductor material 114 may be formed by a deposition process (e.g., a CVD process, reduced-pressure CVD (RP-CVD), atmospheric-pressure CVD (APCVD), or the like).

Figure 28:
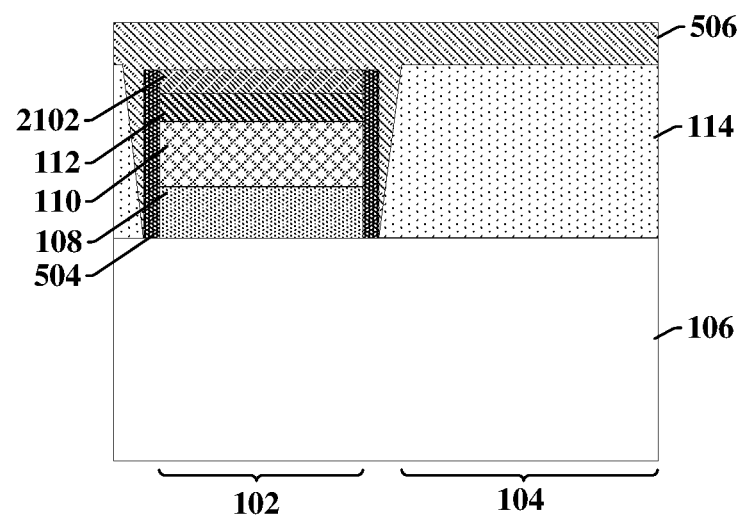

As shown in cross-sectional view 2800 of FIG. 28, a gap fill material 506 is formed within the gaps 2802 and over top surfaces of the spacer 504 and the semiconductor material 114. In some embodiments, the gap fill material 506 may comprise a semiconductor material, a dielectric material, and/or the like. In some embodiments, the gap fill material 506 may be formed by a deposition process (e.g., a PVD process, a CVD process, a PE-CVD process, an ALD process, reduced-pressure CVD (RP-CVD), atmospheric-pressure CVD (APCVD), or the like).

Figure 29A:
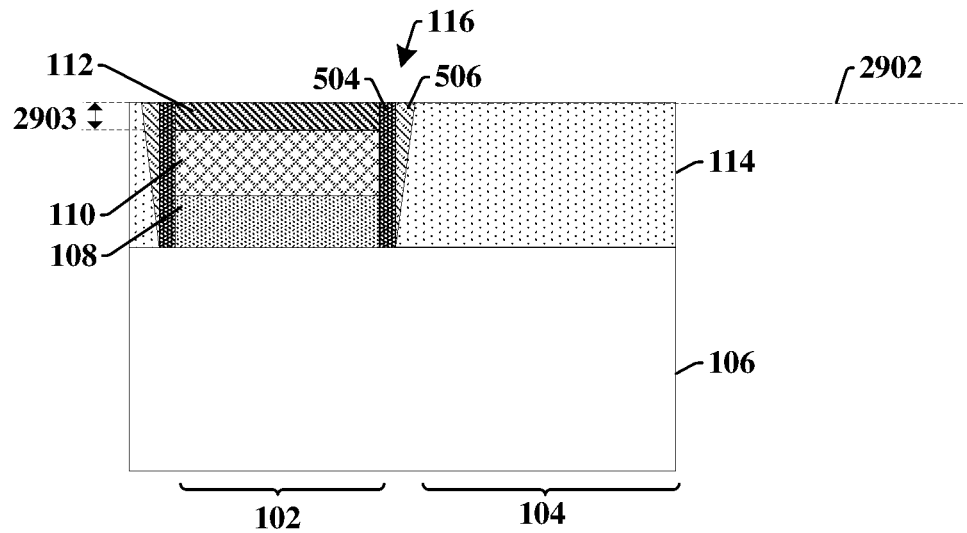
Figure 29A:
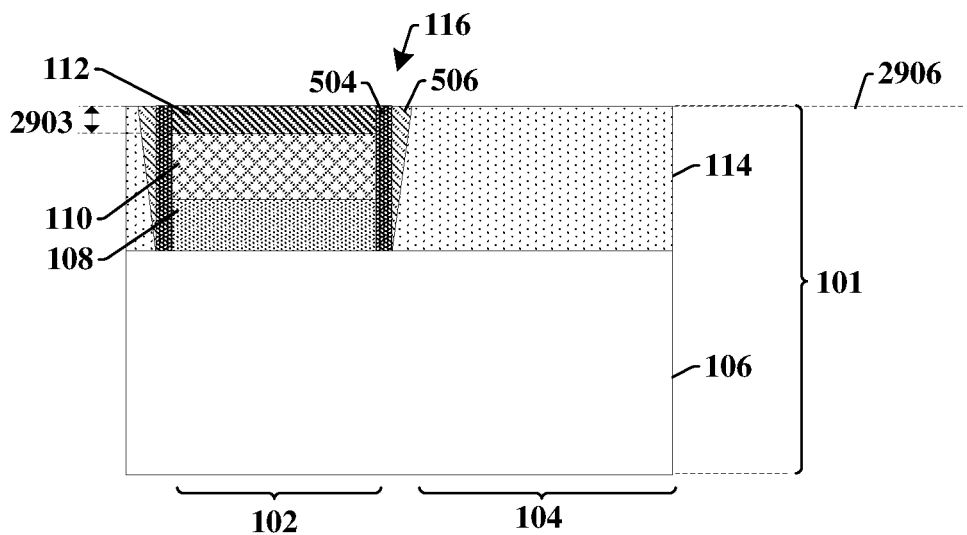

As shown in cross-sectional views 2900 and 2904 of FIG. 29A, one or more planarization processes are performed to remove parts of the gap fill material 506, the spacer 504, and the masking layer (2102 of FIG. 28) and to define a gap fill structure 116. The one or more planarization processes expose upper surfaces of the active semiconductor layer 112 and the semiconductor material 114. In some embodiments, the upper surfaces of the active semiconductor layer 112, the semiconductor material 114, the gap fill material 506, and the spacer 504 may be substantially co-planar (e.g., planar within a tolerance of a planarization process). In some embodiments, the one or more planarization processes may comprise a first planarization process (shown along line 2902 of cross-sectional view 2900) and a second planarization process (shown along line 2906 of cross-sectional view 2904). In some embodiments, the one or more planarization processes may reduce the thickness 2903 of the semiconductor material 114 by approximately 1% to approximately 5% (e.g., from a thickness of approximately 7 kÅ to a thickness of approximately 6.75 kÅ), by approximately 2% to approximately 4%, by approximately 10% to approximately 20%, or other similar values.

Figure 29B:
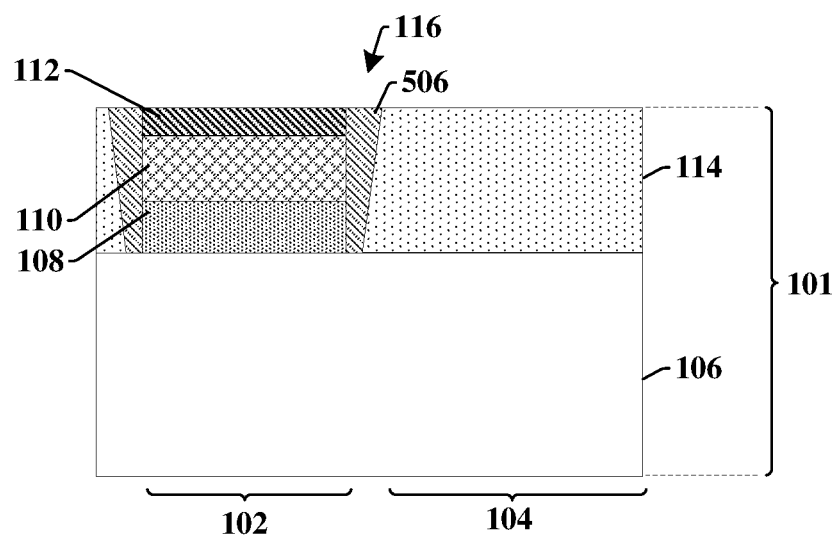

In some alternative embodiments, shown in cross-sectional view 2908 of FIG. 29B, the acts shown in FIG. 26 may be omitted and the method described in FIGS. 10-30 may not form a spacer (e.g., 504) along the exposed sidewalls of the polysilicon layer, the dielectric layer, the active semiconductor layer, and the masking layer. In such embodiments, the gap fill material 506 is formed to completely fill the gaps (e.g., 2802) shown in the cross-sectional view 2800 of FIG. 28. Upon performing one or more planarization processes to remove parts of the gap fill material 506, a resulting gap fill structure 116 will comprise a gap fill material 506 that continuously extends between sidewalls of the semiconductor material 114 and sidewalls of the polysilicon layer 108, the dielectric layer 110, and the active semiconductor layer 112. In some such embodiments, the gap fill material 506 may be formed concurrent with the semiconductor material 114. In some embodiments, the gap fill material 506 may be partially polysilicon and partially silicon, due to imperfect growth of the gap fill material 506 along sidewalls of the dielectric layer 110 and/or the polysilicon layer 108. Although subsequent cross-sectional view(s) shown in this method (e.g., cross-sectional view 3000 of FIG. 30) illustrate a gap fill structure comprising a spacer, it will be appreciated that in alternative embodiments the spacer may be omitted in these cross-sectional view(s).

Figure 30:
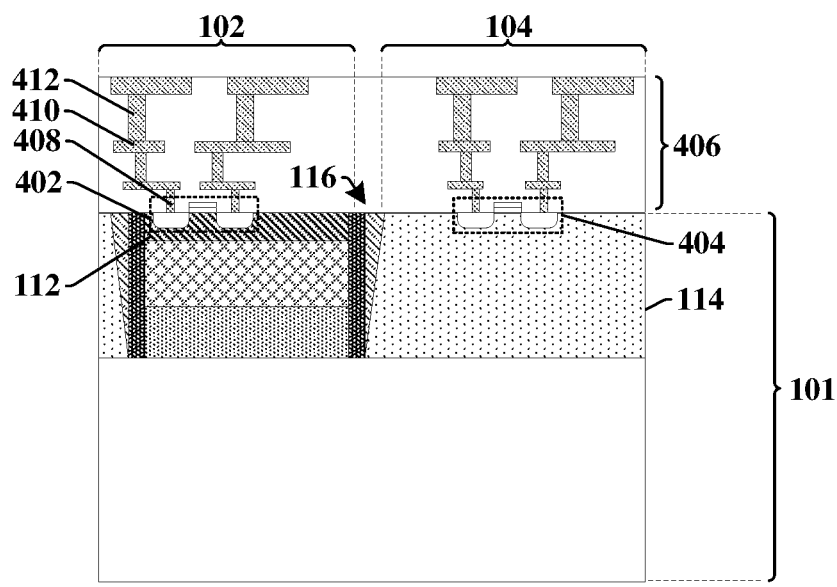

As shown in cross-sectional view 3000 of FIG. 30, a first device 402 is formed within the active semiconductor layer 112 within the first region 102 and a second device 404 is formed within the semiconductor material 114 within the second region 104. The first device 402 and the second device 404 are different types of devices. In some embodiments (not shown), an isolation structure (e.g., an STI structure) may be formed within the substrate 101 between the first region 102 and the second region 104 prior to forming the first device 402 and/or the second device 404. In some embodiments, the isolation structure may replace a part or all of the gap fill structure 116.

A plurality of interconnects 408-412 are subsequently formed within an ILD structure 406 over the substrate 101. In some embodiments, the plurality of interconnects 408-412 may be formed by way of a damascene process and/or a dual damascene process. In such embodiments, an ILD is formed over the substrate 101. The ILD structure 406 is etched to form holes and/or trenches, which are subsequently filled with a conductive material (e.g., tungsten, copper, and/or aluminum). A chemical mechanical planarization (CMP) process is subsequently performed to remove excess of the conductive material from over the ILD structure 406.

Figure 31:
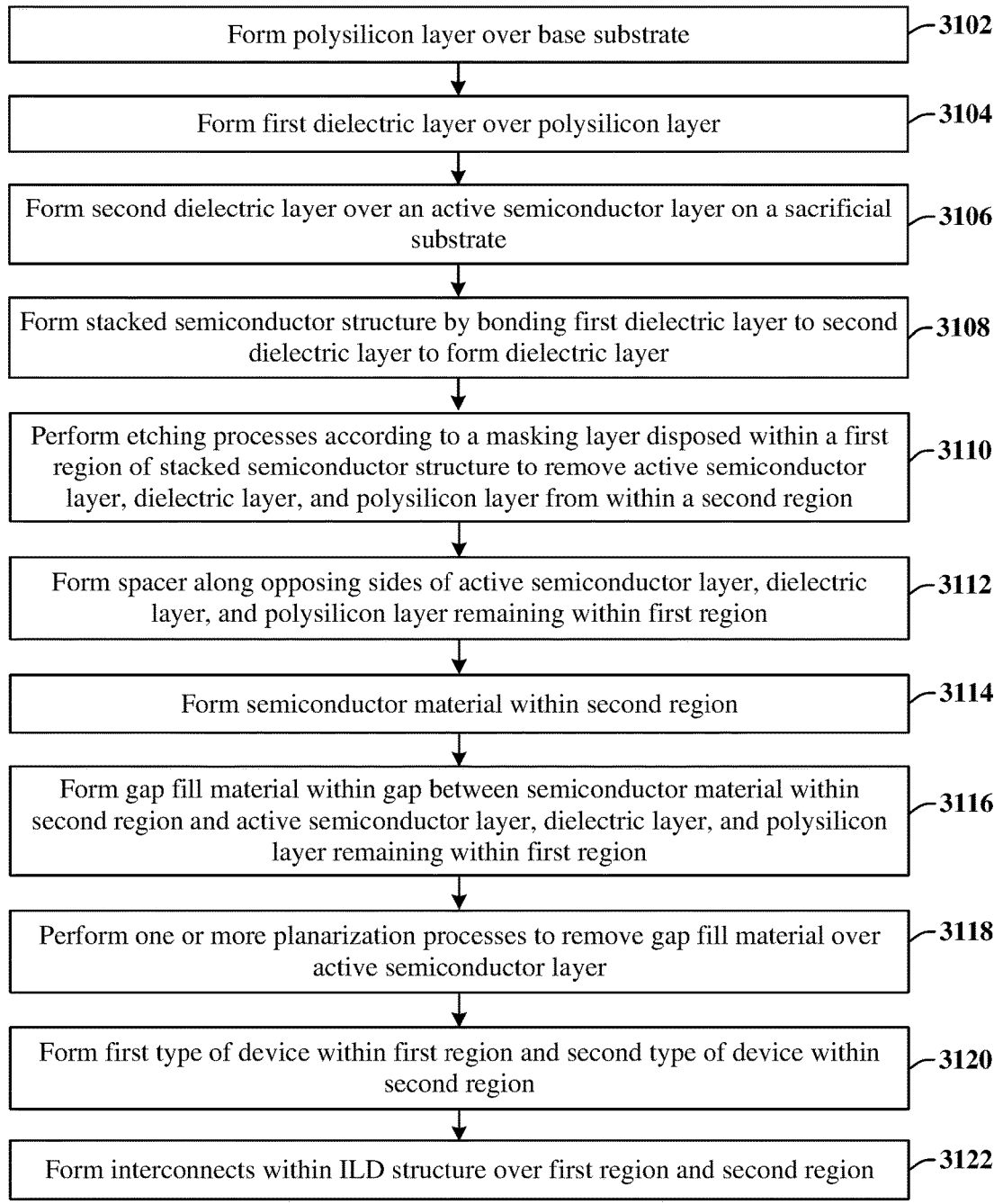
FIG. 31 illustrates a flow diagram of some embodiments of a method of forming a multi-function substrate.

FIG. 31 illustrates a flow diagram of some embodiments of a method 3100 of forming a multi-function substrate.

While the disclosed methods (e.g., methods 3100, 4800, 6500, 8200, and 9900) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3102, a polysilicon layer is formed over a base substrate, in some embodiments. FIGS. 10-11 illustrate cross-sectional views 1000-1100 of some embodiments corresponding to act 3102.

At act 3104, a first dielectric layer is formed over the polysilicon layer. FIG. 12A illustrates a cross-sectional view 1200 of some embodiments corresponding to act 3104. FIG. 12B illustrates a cross-sectional view 1204 of some alternative embodiments corresponding to act 3104.

At act 3106, a second dielectric layer is formed over an active semiconductor layer on a sacrificial substrate. FIGS. 13-15 illustrate cross-sectional views 1300-1500 of some embodiments corresponding to act 3106.

At act 3108, a stacked semiconductor structure is formed by bonding the first dielectric layer to the second dielectric layer to form a dielectric layer. FIGS. 16-20 illustrate cross-sectional views 1600-2000 of some embodiments corresponding to act 3102. In some alternative embodiments, acts 3102-3108 may be alternatively performed according to cross-sectional views 10000-10600 of FIGS. 100-106.

At act 3110, one or more etching processes are performed according to a masking layer to remove the active semiconductor layer, the dielectric layer, and the polysilicon layer from within a second region of stacked semiconductor structure. The active semiconductor layer, the dielectric layer, and the polysilicon layer remain within a first region of the stacked semiconductor structure after the removal. FIGS. 21-25 illustrate cross-sectional views 2100-2500 of some embodiments corresponding to act 3110.

At act 3112, a spacer may be formed along opposing sides of the active semiconductor layer, the dielectric layer, and the polysilicon layer remaining within the first region, in some embodiments. FIG. 26 illustrates cross-sectional views 2600 and 2604 of some embodiments corresponding to act 3112.

At act 3114, a semiconductor material is formed within the second region. FIG. 27 illustrates a cross-sectional view 2700 of some embodiments corresponding to act 3114.

At act 3116, a gap fill material is formed within a gap between the semiconductor material within the second region and the active semiconductor layer, the dielectric layer, and the polysilicon layer remaining within the first region. FIG. 28 illustrates a cross-sectional view 2800 of some embodiments corresponding to act 3116.

At act 3118, one or more planarization processes are performed to remove the gap fill material from over the active semiconductor layer. FIG. 29A illustrates cross-sectional views 2900 and 2904 of some embodiments corresponding to act 3118. FIG. 29B illustrates a cross-sectional view 2908 of some alternative embodiments corresponding to act 3118.

At act 3120, a first type of device is formed within the first region and a second type of device is formed within the second region. FIG. 30 illustrates a cross-sectional view 3000 of some embodiments corresponding to act 3120.

At act 3122, interconnects are formed within an inter-level dielectric (ILD) structure over the first region and the second region. FIG. 30 illustrates a cross-sectional view 3000 of some embodiments corresponding to act 3122.

FIGS. 32-47 illustrate cross-sectional views 3200-4700 of some additional embodiments of a method of forming an integrated chip comprising a multi-function substrate. Although FIGS. 32-47 are described in relation to a method, it will be appreciated that the structures disclosed in FIGS. 32-47 are not limited to such a method, but instead may stand alone as structures independent of the method.

Figure 32:
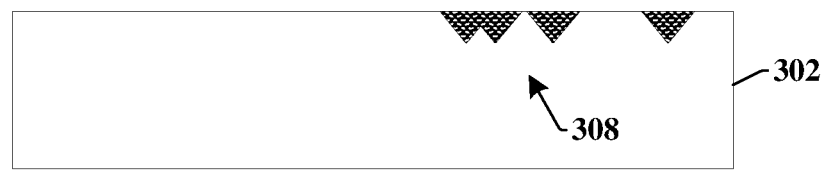
FIGS. 32-47 illustrate cross-sectional views of some additional embodiments of a method of forming a multi-function substrate.

As shown in cross-sectional view 3200 of FIG. 32, a semiconductor body 302 is provided. In some embodiments, the semiconductor body 302 may comprise a high-resistivity substrate (e.g., a substrate having a resistivity that is greater than or equal to approximately 1 kΩ-cm, greater than or equal to approximately 3 kΩ-cm, etc.). In some embodiments, one or more defects 308 (e.g., COP defects) may be present within and/or along an upper surface of the semiconductor body 302.

Figure 33:
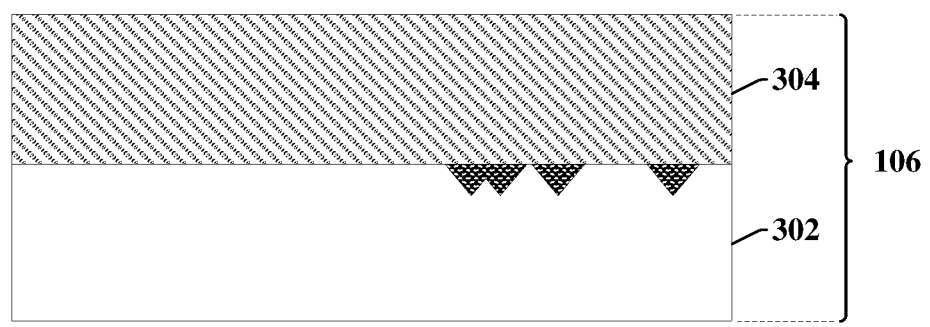

As shown in cross-sectional view 3300 of FIG. 33, an epitaxial layer 304 is formed onto the semiconductor body 302 to form a base substrate 106. In some embodiments, the epitaxial layer 304 may be formed to a thickness of greater than approximately 100 nm, greater than approximately 200 nm, greater than approximately 1 μm, approximately 2 μm, or other similar values. In some embodiments, the epitaxial layer 304 may be formed to be intrinsically doped. In some embodiments, the epitaxial layer 304 may be formed by a deposition process (e.g., a CVD process, reduced-pressure CVD (RP-CVD), atmospheric-pressure CVD (APCVD), or the like).

Figure 34:
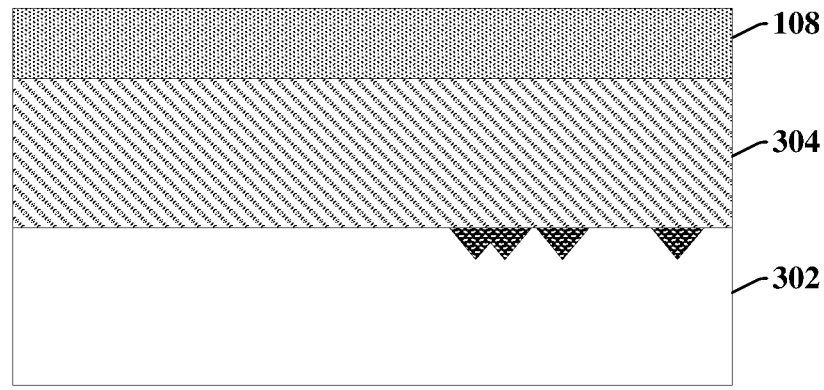

As shown in cross-sectional view 3400 of FIG. 34, a polysilicon layer 108 is formed onto the epitaxial layer 304, in some embodiments.

Figure 35A:
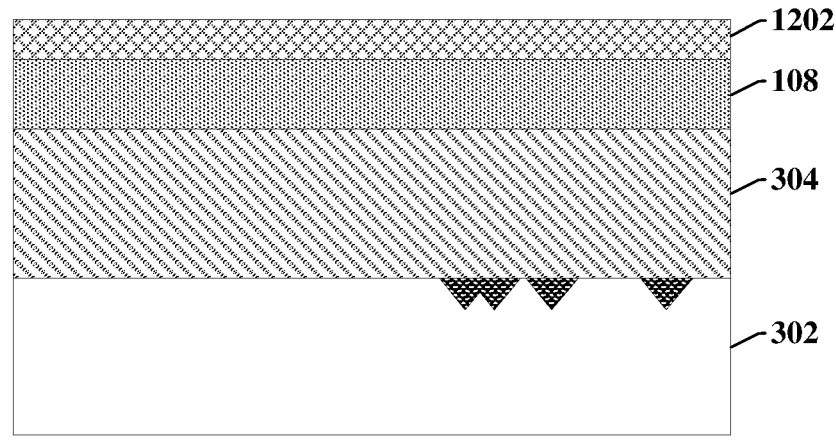

As shown in cross-sectional view 3500 of FIG. 35A, a first dielectric layer 1202 is formed onto the polysilicon layer 108. In some alternative embodiments, shown in cross-sectional view 3502 of FIG. 35B, the acts shown in FIG. 34 may be omitted and the method described in FIGS. 32-47 may not form a polysilicon layer (e.g., 108) onto the base substrate 106. In such embodiments, the first dielectric layer 1202 is formed directly onto the base substrate 106, as shown in cross-sectional view 3502. Although subsequent cross-sectional views shown in this method (e.g., cross-sectional views 3600-4700 of FIGS. 36-47) illustrate a polysilicon layer 108 on the base substrate 106, it will be appreciated that in alternative embodiments the polysilicon layer may be omitted in these cross-sectional views.

Figure 36:
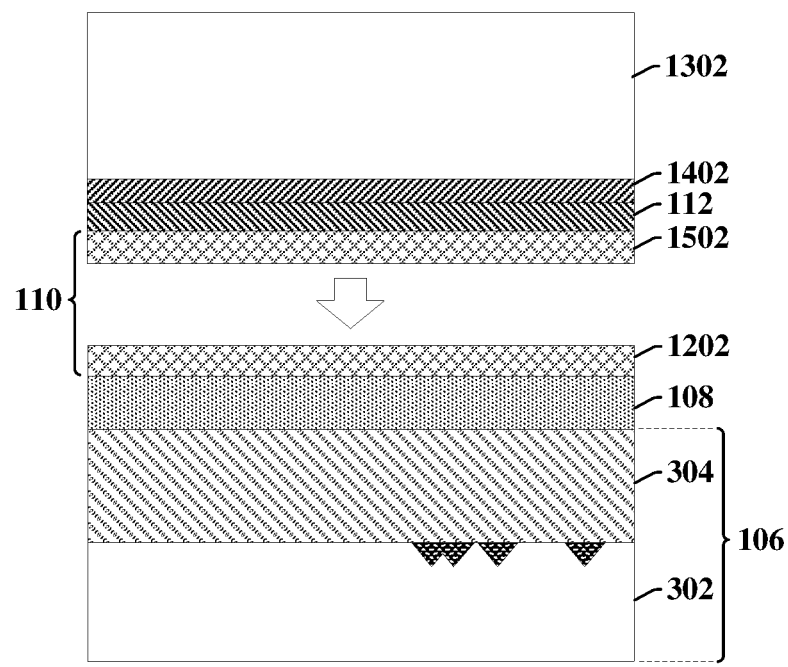

As shown in cross-sectional view 3600 of FIG. 36, a sacrificial substrate 1302 is bonded to the base substrate 106 along an interface comprising the first dielectric layer 1202 and a second dielectric layer 1502. A buffer layer 1402 is arranged on the sacrificial substrate 1302 and an active semiconductor layer 112 is between the buffer layer 1402 and the second dielectric layer 1502. The bonding process results in a dielectric layer 110 arranged between the polysilicon layer 108 and the active semiconductor layer 112.

Figure 37:
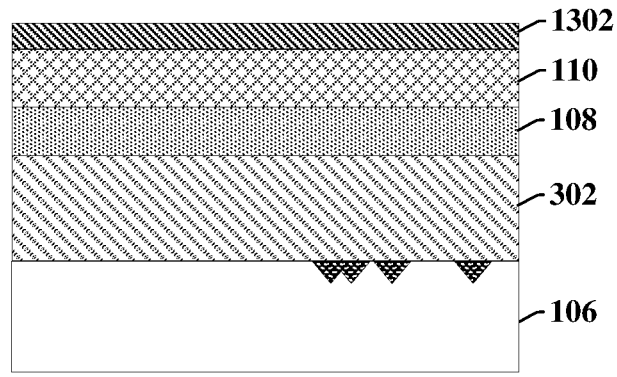

As shown in cross-sectional views 3700 of FIG. 37, the sacrificial substrate (1302 of FIG. 36) and the buffer layer (1402 of FIG. 36) are removed to form a stacked semiconductor structure 3702. In some embodiments, a multi-step process may be used to remove the sacrificial substrate and/or the buffer layer (e.g., as shown in FIGS. 18-19). In some embodiments, the multi-step process may comprise a planarization process, an etching process, and/or the like.

Figure 38:
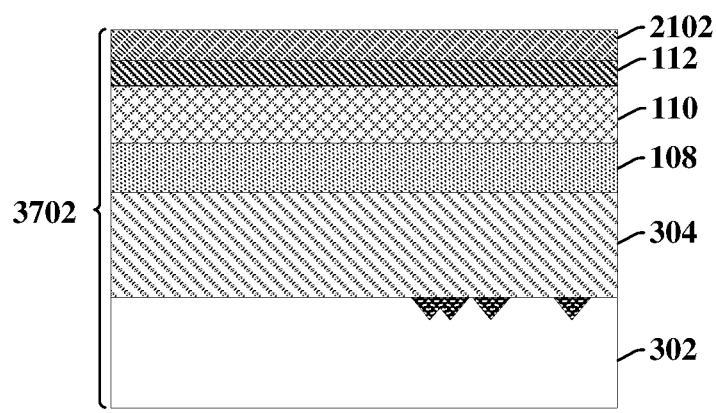

As shown in cross-sectional view 3800 of FIG. 38, a masking layer 2102 is formed over the active semiconductor layer 112. In various embodiments, the masking layer 2102 may comprise an oxide, a nitride, or the like. In some embodiments (not shown), wherein the masking layer 2102 comprises an oxide, a photosensitive material (e.g., photo-resist) may be formed onto the masking layer 2102.

Figure 39:
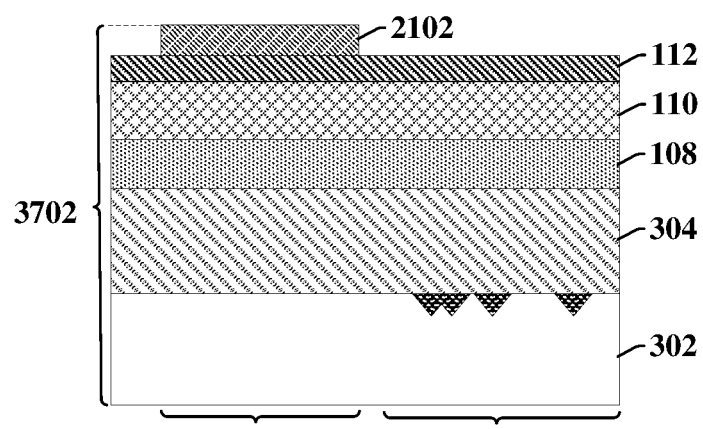

As shown in cross-sectional view 3900 of FIG. 39, the masking layer 2102 is patterned to remove the masking layer 2102 from within a second region 104 of the stacked semiconductor structure 3702. After the patterning process, the masking layer 2102 remains within a first region 102 of the stacked semiconductor structure 3702.

Figure 40:
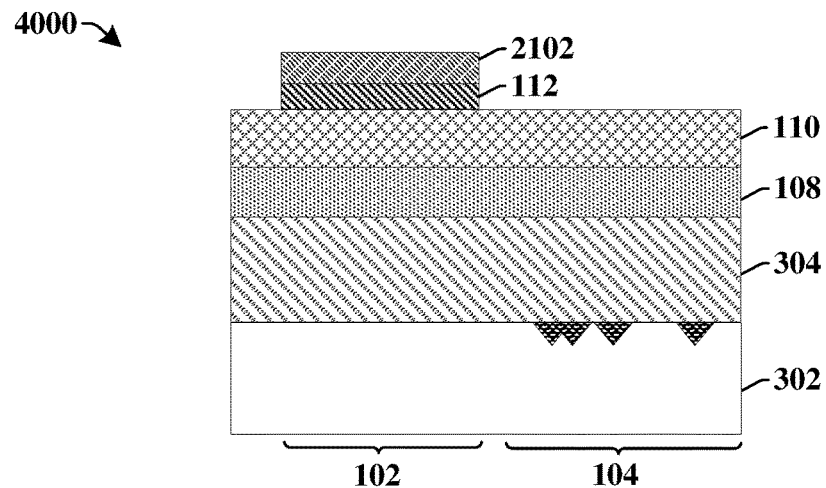

As shown in cross-sectional view 4000 of FIG. 40, the active semiconductor layer 112 is patterned to remove the active semiconductor layer 112 from within the second region 104.

Figure 41:
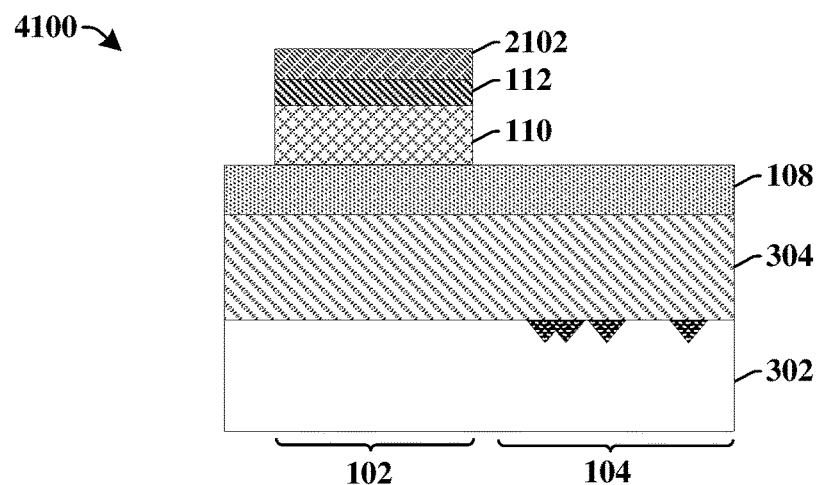

As shown in cross-sectional view 4100 of FIG. 41, the dielectric layer 110 is patterned to remove the dielectric layer 110 from within the second region 104.

Figure 42:
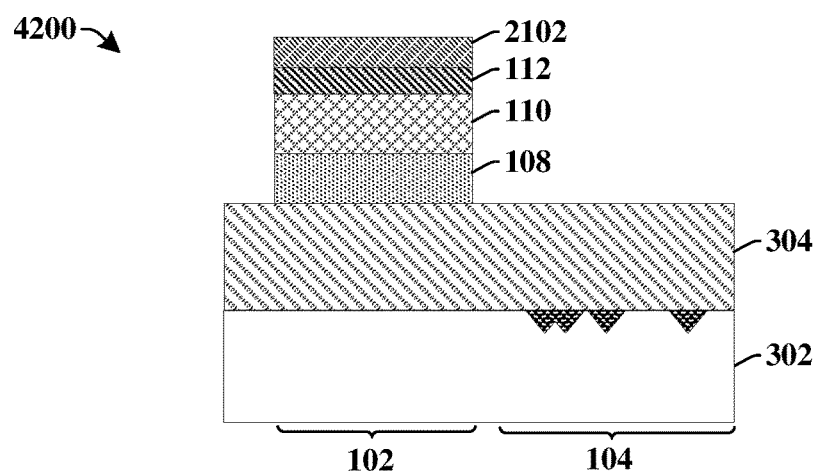

As shown in cross-sectional view 4200 of FIG. 42, the polysilicon layer 108 is patterned to remove the polysilicon layer 108 from within the second region 104. In some embodiments, the polysilicon layer 108 may be over etched to ensure complete removal which results in a recess into the epitaxial layer 304 (not shown).

Figure 43:
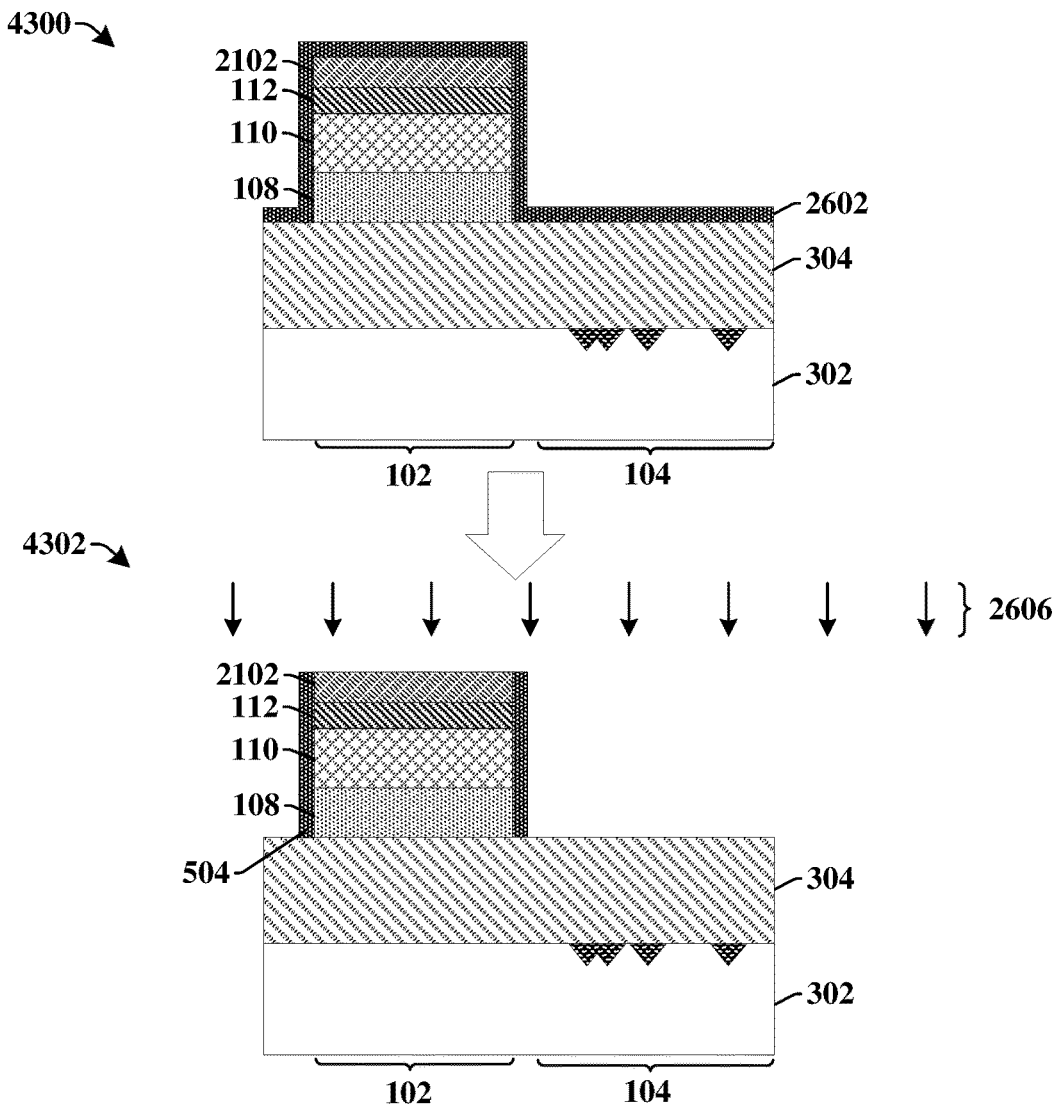

As shown in cross-sectional views 4300 and 4302 of FIG. 43, a spacer 504 is formed over the epitaxial layer 304 and along sidewalls of the polysilicon layer 108, the dielectric layer 110, the active semiconductor layer 112, and the masking layer 2102. In various embodiments, the spacer 504 may be formed by depositing a spacer material 2602 over the epitaxial layer 304 and along sidewalls of the polysilicon layer 108, the dielectric layer 110, the active semiconductor layer 112, and the masking layer 2102. The spacer material 2602 is subsequently exposed to an etchant 2606 (e.g., a dry etchant), which removes the spacer material 2602 from horizontal surfaces.

Figure 44:
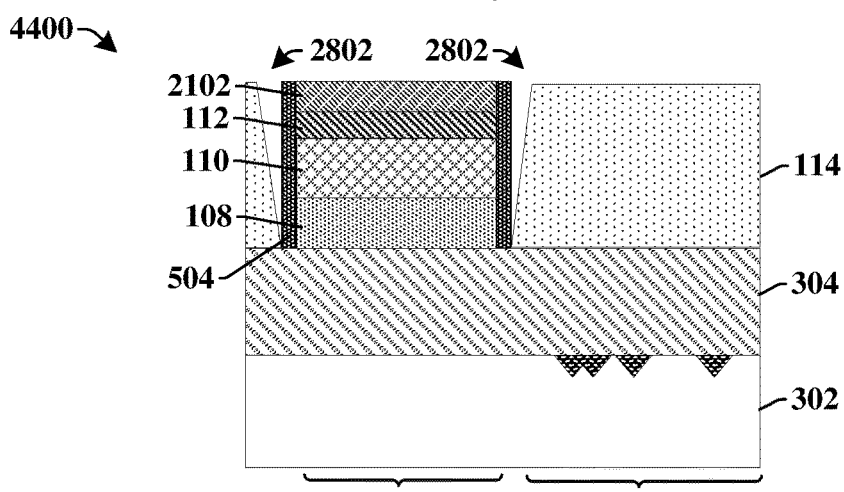

As shown in cross-sectional view 4400 of FIG. 44, a semiconductor material 114 is epitaxially formed within the second region 104. The semiconductor material 114 may be formed to a height that extends to a top surface of the masking layer 2102. In some embodiments, the spacer 504 prevents the semiconductor material 114 from forming along sidewalls of the spacer 504, leaving gaps 2802 between a sidewall of the spacer 504 and the semiconductor material 114.

Figure 45:
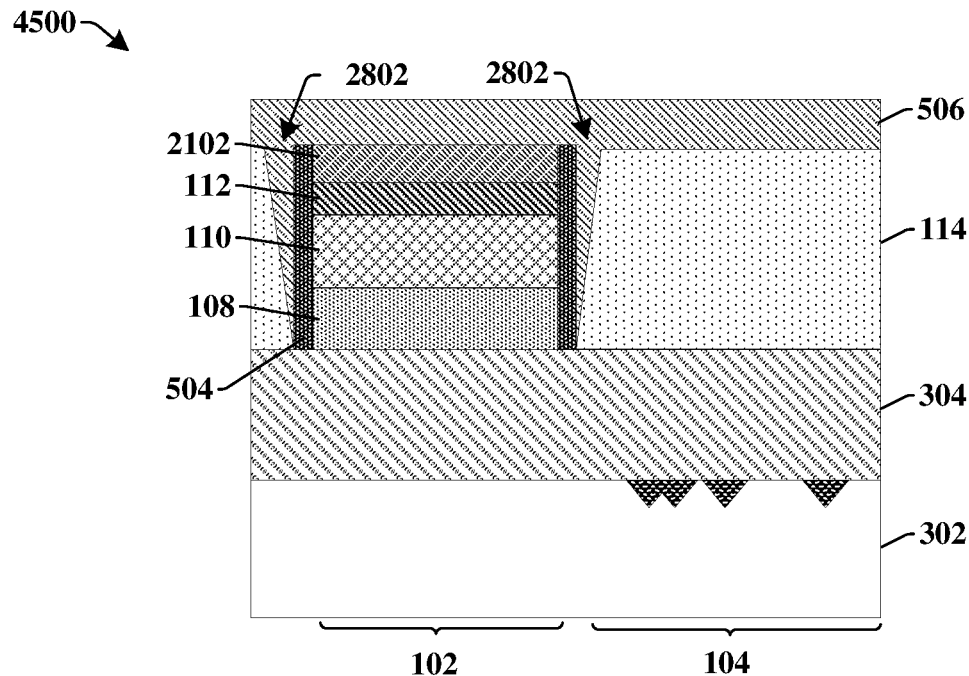

As shown in cross-sectional view 4500 of FIG. 45, a gap fill material 506 is formed within the gaps 2802 and over top surfaces of the spacer 504 and the semiconductor material 114.

Figure 46A:
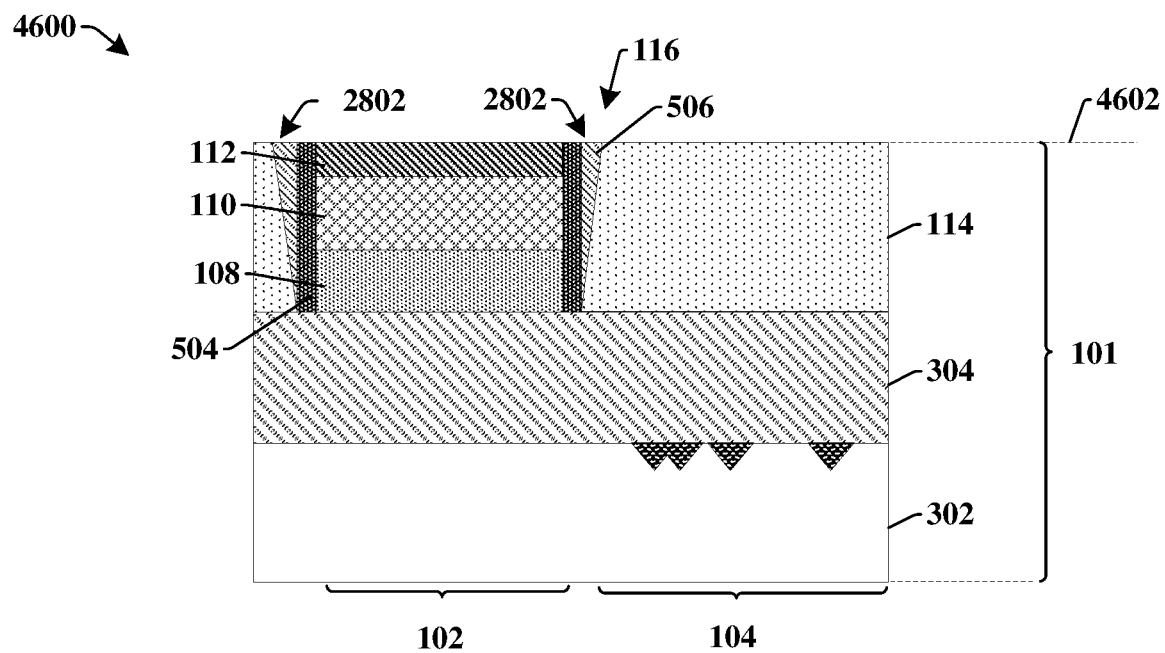

As shown in cross-sectional view 4600 of FIG. 46A, one or more planarization processes are performed (along line 4602) to remove parts of the gap fill material 506, the spacer 504, and the masking layer (2102 of FIG. 45) from over the active semiconductor layer 112 and to define a gap fill structure 116. The one or more planarization processes expose upper surfaces of the active semiconductor layer 112 and the semiconductor material 114. In some embodiments, the upper surfaces of the active semiconductor layer 112, the semiconductor material 114, the gap fill material 506, and the spacer 504 may be substantially co-planar.

Figure 46B:
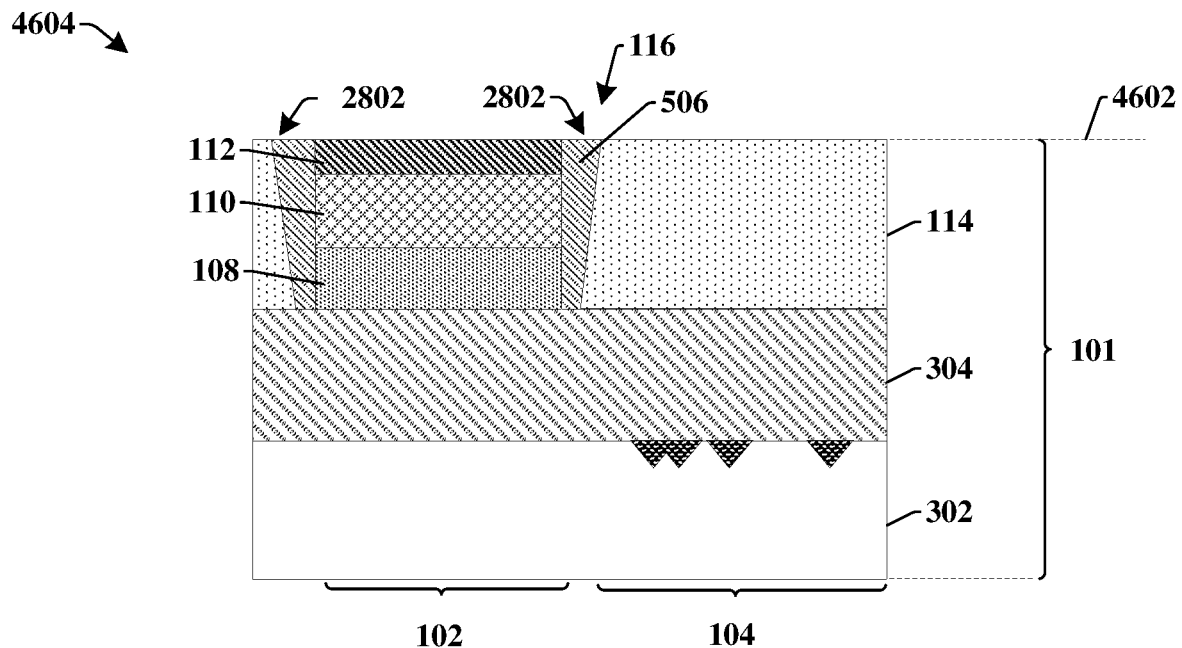

In some alternative embodiments, shown in cross-sectional view 4604 of FIG. 46B, the acts shown in FIG. 43 may be omitted and the method described in FIGS. 31-47 may not form a spacer (e.g., 504) along the exposed sidewalls of the polysilicon layer, the dielectric layer, the active semiconductor layer, and the masking layer. In such embodiments, the gap fill material 506 is formed to completely fill the gaps (e.g., 2802) shown in FIG. 44. Upon performing one or more planarization processes to remove parts of the gap fill material 506, a resulting gap fill structure 116 will comprise a gap fill material 506 that continuously extends between sidewalls of the semiconductor material 114 and sidewalls of the polysilicon layer 108, the dielectric layer 110, and the active semiconductor layer 112. Although subsequent cross-sectional view(s) shown in this method (e.g., cross-sectional view 4700 of FIG. 47) illustrate a gap fill structure comprising a spacer, it will be appreciated that in alternative embodiments the spacer may be omitted in these cross-sectional view(s).

Figure 47:
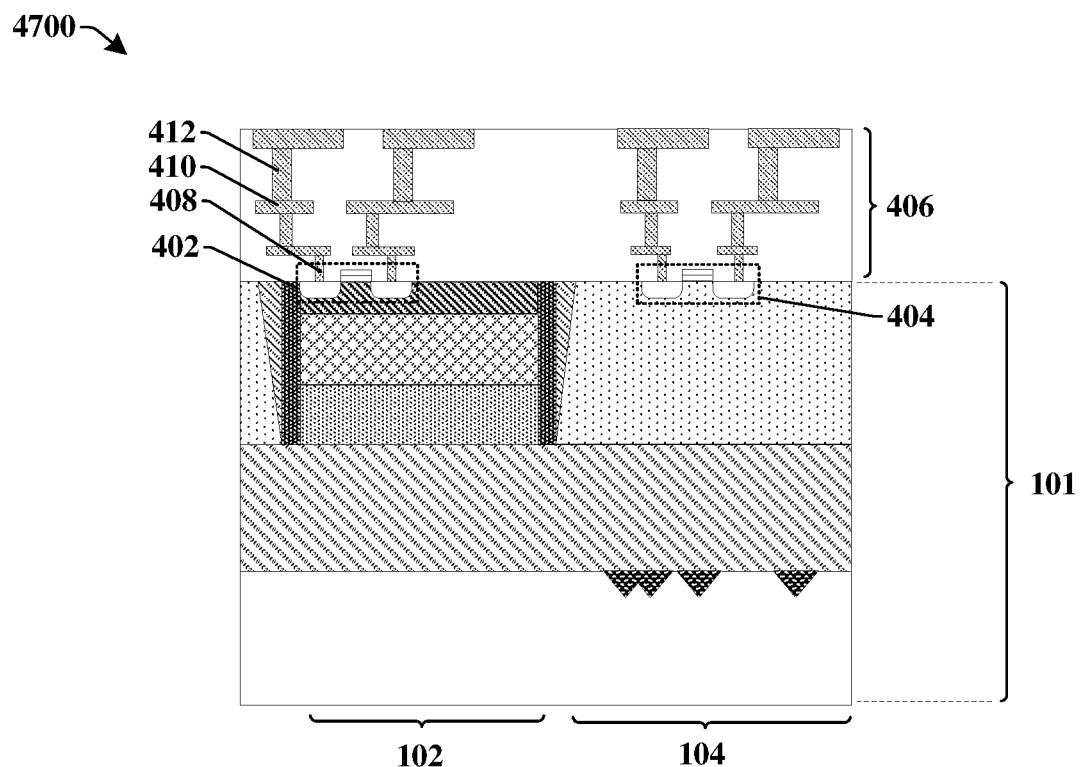

As shown in cross-sectional view 4700 of FIG. 47, a first device 402 is formed within the active semiconductor layer 112 within the first region 102 and a second device 404 is formed within the semiconductor material 114 within the second region 104. The first device 402 and the second device 404 are different types of devices. A plurality of interconnects 408-412 are subsequently formed within an ILD structure 406 over the substrate 101.

Figure 48:
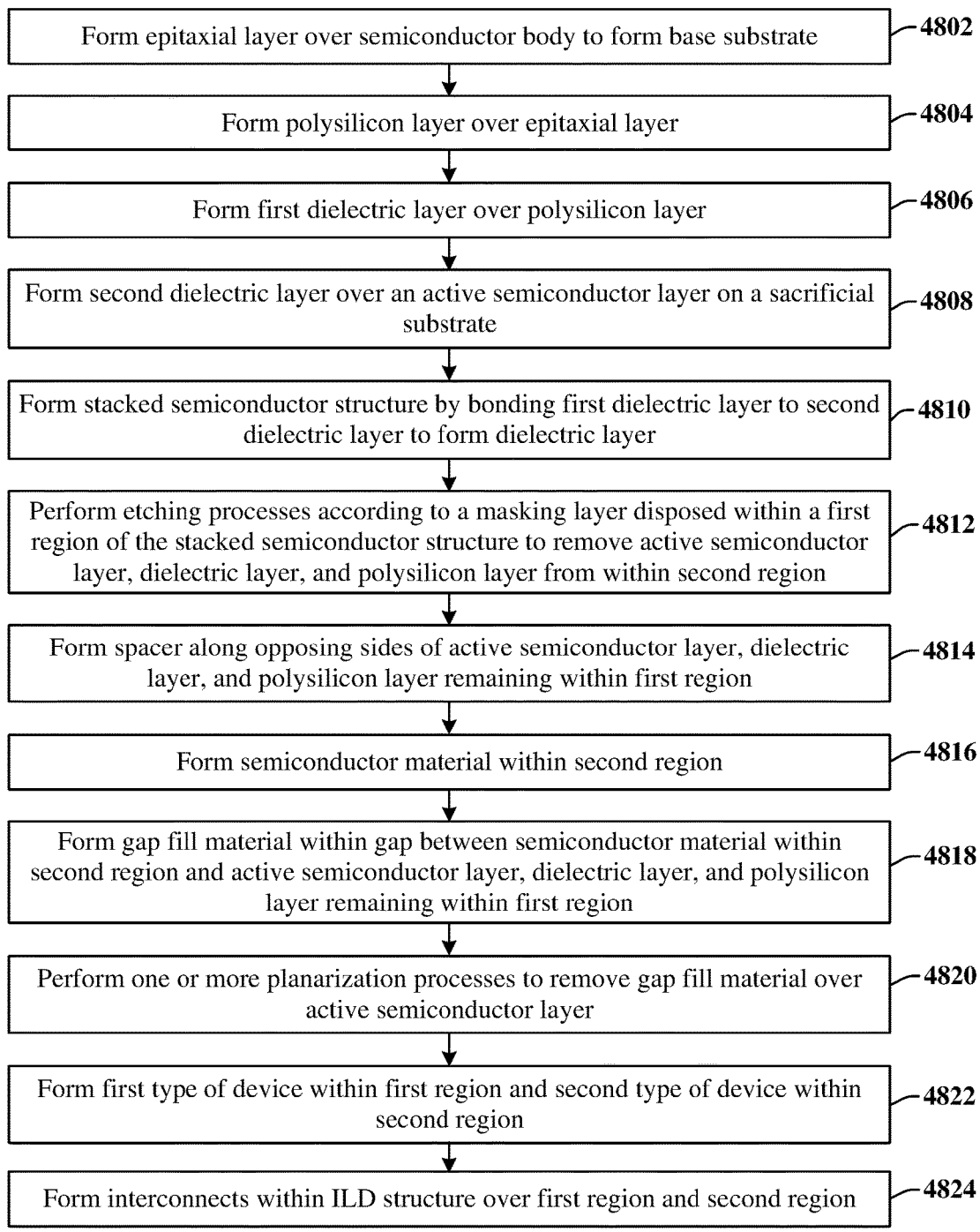
FIG. 48 illustrates a flow diagram of some additional embodiments of a method of forming a multi-function substrate.

FIG. 48 illustrates a flow diagram of some additional embodiments of a method 4800 of forming a multi-function substrate.

At act 4802, an epitaxial layer is formed over a semiconductor body to form a base substrate. FIGS. 32-33 illustrate cross-sectional views 3200-3300 of some embodiments corresponding to act 4802.

At act 4804, a polysilicon layer is formed over the epitaxial layer, in some embodiments. FIG. 34 illustrates a cross-sectional view 3400 of some embodiments corresponding to act 4804.

Figure 35B:
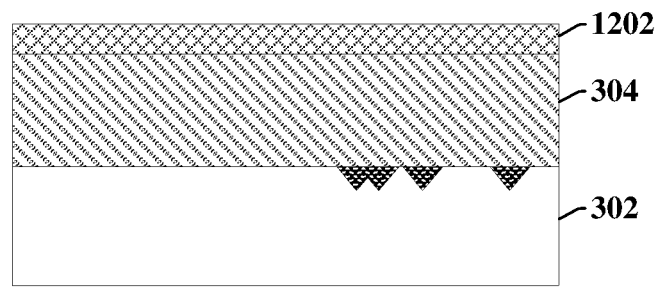

At act 4806, a first dielectric layer is formed over the polysilicon layer. FIG. 35A illustrates a cross-sectional view 3500 of some embodiments corresponding to act 4806. FIG. 35B illustrates a cross-sectional view 3502 of some alternative embodiments corresponding to act 4806.

At act 4808, a second dielectric layer is formed over an active semiconductor layer on a sacrificial substrate. FIGS. 13-15 illustrate cross-sectional views 1300-1500 of some embodiments corresponding to act 4808.

At act 4810, a stacked semiconductor structure is formed by bonding the first dielectric layer to the second dielectric layer to form a dielectric layer. FIGS. 36-37 illustrate cross-sectional views 3600-3700 of some embodiments corresponding to act 4810.

At act 4812, one or more etching processes are performed according to a masking layer to remove the active semiconductor layer, the dielectric layer, and the polysilicon layer from within a second region of stacked semiconductor structure. FIGS. 38-42 illustrate cross-sectional views 3800-4200 of some embodiments corresponding to act 4812.

At act 4814, a spacer may be formed along opposing sides of the active semiconductor layer, the dielectric layer, and the polysilicon layer remaining within the first region, in some embodiments. FIG. 43 illustrates cross-sectional views 4300 and 4302 of some embodiments corresponding to act 4814.

At act 4816, a semiconductor material is formed within the second region. FIG. 44 illustrates a cross-sectional view 4400 of some embodiments corresponding to act 4816.

At act 4818, a gap fill material is formed within a gap between the semiconductor material within the second region and the active semiconductor layer, the dielectric layer, and the polysilicon layer remaining within the first region. FIG. 45 illustrates a cross-sectional view 4500 of some embodiments corresponding to act 4818.

At act 4820, one or more planarization processes are performed to remove the gap fill material from over the active semiconductor layer. FIG. 46A illustrates a cross-sectional view 4600 of some embodiments corresponding to act 4820. FIG. 46B illustrates a cross-sectional view 4604 of some alternative embodiments corresponding to act 4820.

At act 4822, a first type of device is formed within the first region and a second type of device is formed within the second region. FIG. 47 illustrates a cross-sectional view 4700 of some embodiments corresponding to act 4822.

At act 4824, interconnects are formed within an ILD structure over the first region and the second region. FIG. 47 illustrates a cross-sectional view 4700 of some embodiments corresponding to act 4824.

FIGS. 49-64 illustrate cross-sectional views 4900-6400 of some additional embodiments of a method of forming an integrated chip comprising a multi-function substrate. Although FIGS. 49-64 are described in relation to a method, it will be appreciated that the structures disclosed in FIGS. 49-64 are not limited to such a method, but instead may stand alone as structures independent of the method.

Figure 49:
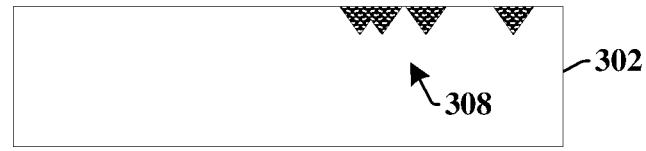
FIGS. 49-64 illustrate cross-sectional views of some additional embodiments of a method of forming a multi-function substrate.

As shown in cross-sectional view 4900 of FIG. 49, a semiconductor body 302 is provided. In some embodiments, one or more defects 308 (e.g., COP defects) may be present within and/or along an upper surface of the semiconductor body 302.

Figure 50:
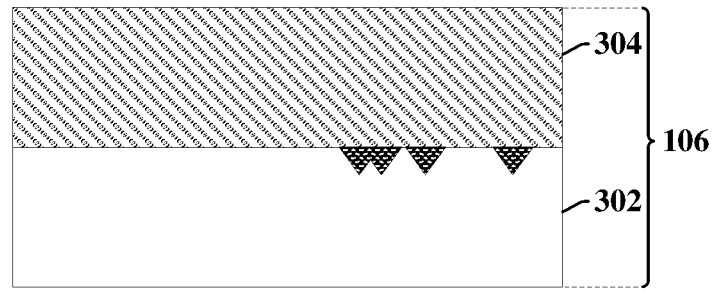

As shown in cross-sectional view 5000 of FIG. 50, an epitaxial layer 304 is formed onto the semiconductor body 302 to form a base substrate 106.

Figure 51:
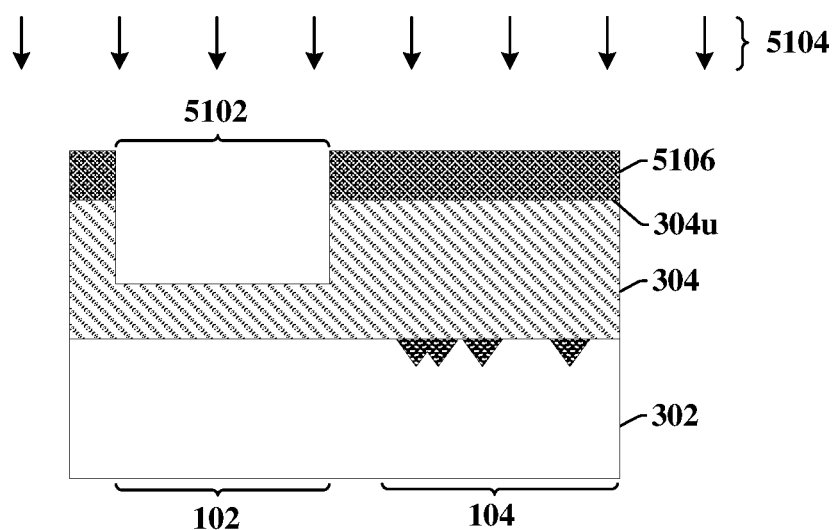

As shown in cross-sectional view 5100 of FIG. 51, the epitaxial layer 304 is selectively patterned to form a recess 5102 formed by sidewalls and a horizontally extending surface of the epitaxial layer 304. The horizontally extending surface is coupled to an upper surface 304u of the epitaxial layer 304 by way of the sidewalls. The horizontally extending surface is formed within a first region 102 and the upper surface 304u continuously extends along a second region 104. In some embodiments, the recess 5102 may be formed to a depth of approximately 6 kÅ, of between approximately 2 kÅ and approximately 6 kÅ, of between approximately 1 μm and approximately 3 μm, or other similar values. In some embodiments, the recess 5102 may be formed by selectively exposing the epitaxial layer 304 to an etchant 5104 according to a first masking layer 5106. In various embodiments, the etchant 5104 may comprise a wet etchant and/or a dry etchant. In some embodiments, the first masking layer 5106 may comprise a photosensitive material (e.g., photoresist), a hard mask, or the like.

Figure 52:
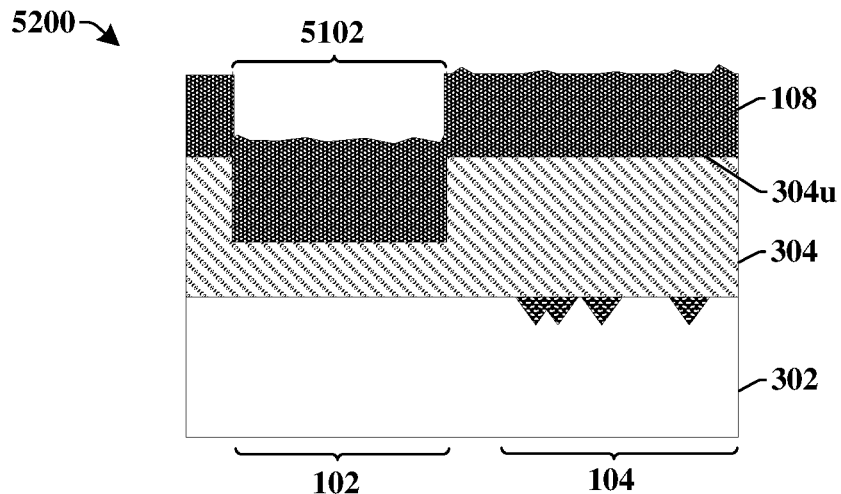

As shown in cross-sectional view 5200 of FIG. 52, a polysilicon layer 108 is formed within the recess 5102 within the epitaxial layer 304. In some embodiments, the polysilicon layer 108 may be formed to a thickness of between approximately 2 kÅ and approximately 12 kÅ, between approximately 3 kÅ and approximately 10 kÅ, approximately 9 kÅ, between approximately 3 kÅ and approximately 3 μm, or other similar values. In some embodiments, the polysilicon layer 108 may further extend from within the recess 5102 to over the upper surface 304u of the epitaxial layer 304.

Figure 53:
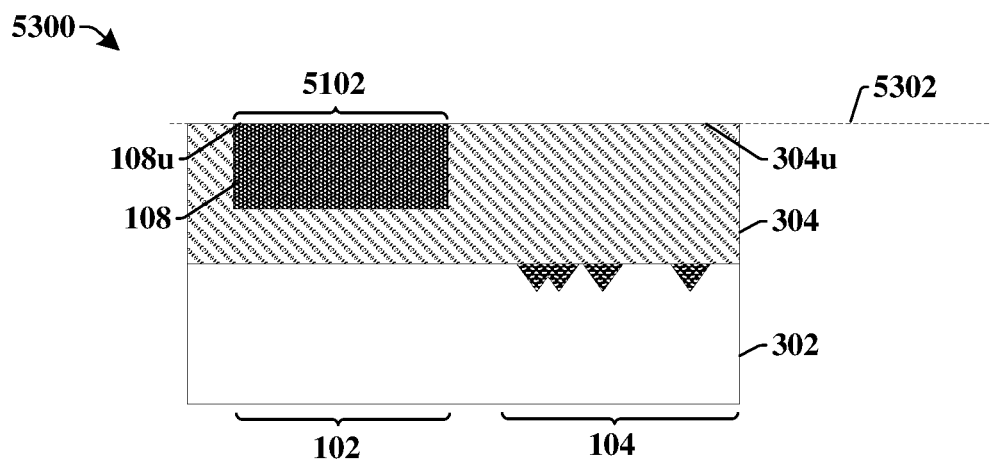

As shown in cross-sectional view 5300 of FIG. 53, one or more planarization processes are performed (along line 5302) to remove part of the polysilicon layer 108 from over the epitaxial layer 304. In some embodiments, the one or more planarization processes may comprise a CMP process. After the one or more planarization processes are completed, the upper surface 304u of the epitaxial layer 304 may be substantially co-planar (e.g., co-planar within a tolerance of a planarization process) with an upper surface 108u of the polysilicon layer 108. In some embodiments, after the one or more planarization processes are completed the polysilicon layer 108 may have a thickness of between approximately 2 kÅ and approximately 6 kÅ, approximately 4 kÅ, between approximately 3 kÅ and approximately 2 μm, or other similar values.

Figure 54A:
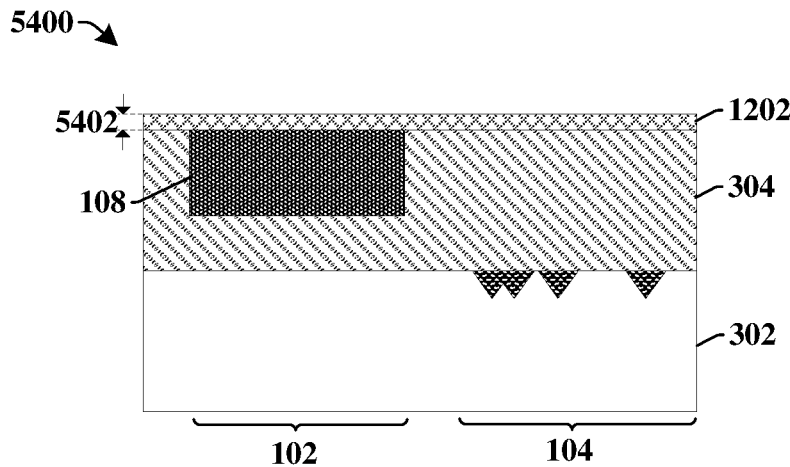
Figure 54B:
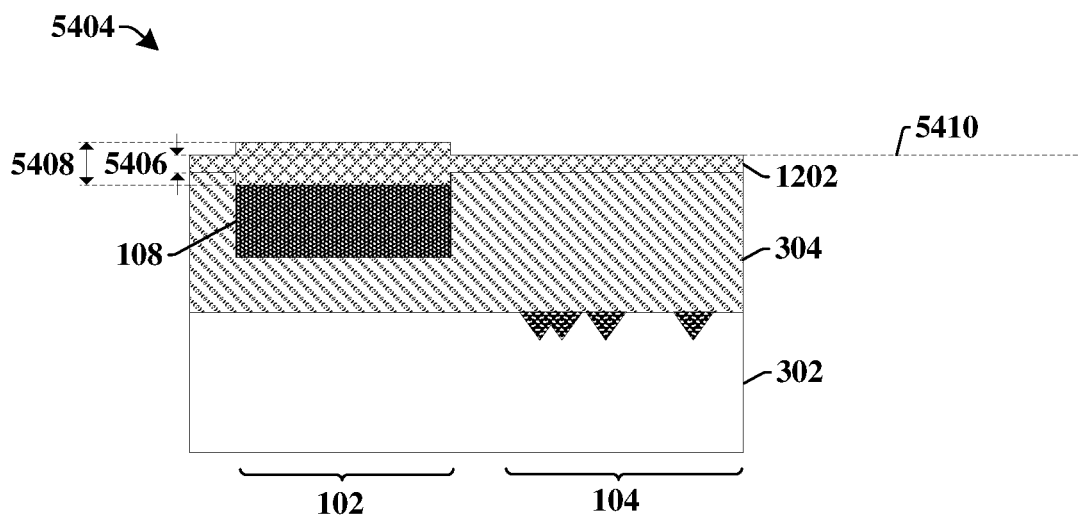

As shown in cross-sectional views 5400 and 5404 of FIGS. 54A-54B, a first dielectric layer 1202 is formed onto the polysilicon layer 108 and the epitaxial layer 304. In some embodiments, shown in cross-sectional views 5400 of FIG. 54A, the first dielectric layer 1202 may have a first thickness 5402 within the first region 102 and the second region 104. In some such embodiments, the first dielectric layer 1202 may be formed by a deposition process (e.g., a PVD process, a CVD process, a PE-CVD process, an ALD process, or the like).

In other embodiments, shown in cross-sectional views 5404 of FIG. 54B, the first dielectric layer 1202 may have a second thickness 5406 within the first region 102 and a third thickness 5408 within the second region 104. In some such embodiments, the first dielectric layer 1202 may be formed by a thermal growth process. In some such embodiments, the thermal growth process causes oxidation of polysilicon layer 108 to be faster than the oxidation of the epitaxial layer 304, so that the first dielectric layer 1202 on the polysilicon layer 108 is thicker than the first dielectric layer 1202 on the epitaxial layer 304 and so that the first dielectric layer 1202 above the polysilicon layer 108 has a bottom surface that is below than a top surface of the top surface of the epitaxial layer 304.

In some alternative embodiments, the acts shown in FIGS. 52-53 may be omitted and the method described in FIGS. 49-64 may not form a polysilicon layer (e.g., 108) onto the epitaxial layer 304. In such embodiments, the first dielectric layer 1202 is formed directly onto the epitaxial layer 304.

In some embodiments, after the thermal growth process, a planarization process (e.g., a CMP process) may be performed (along line 5410) to give the first dielectric layer 1202 a planar upper surface. In some embodiments, the first thickness 5402, the second thickness 5406, and/or the third thickness 5408 may be in a range of between approximately 0 Å and 2 kÅ, between approximately 500 Å and approximately 1 k Å, or other similar values.

Figure 55:
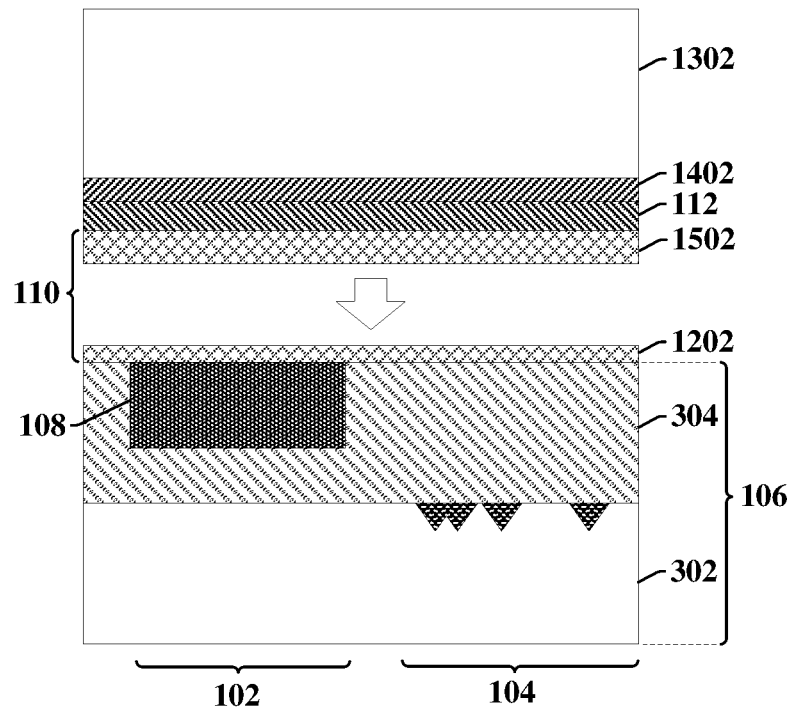

As shown in cross-sectional view 5500 of FIG. 55, a sacrificial substrate 1302 is bonded to the base substrate 106 along an interface comprising the first dielectric layer 1202 and a second dielectric layer 1502. A buffer layer 1402 is arranged on the sacrificial substrate 1302 and an active semiconductor layer 112 is between the buffer layer 1402 and the second dielectric layer 1502. The active semiconductor layer 112 is between the buffer layer 1402 and the first dielectric layer 1202. The bonding process results in a dielectric layer 110 arranged between the polysilicon layer 108 and the active semiconductor layer 112.

Figure 56:
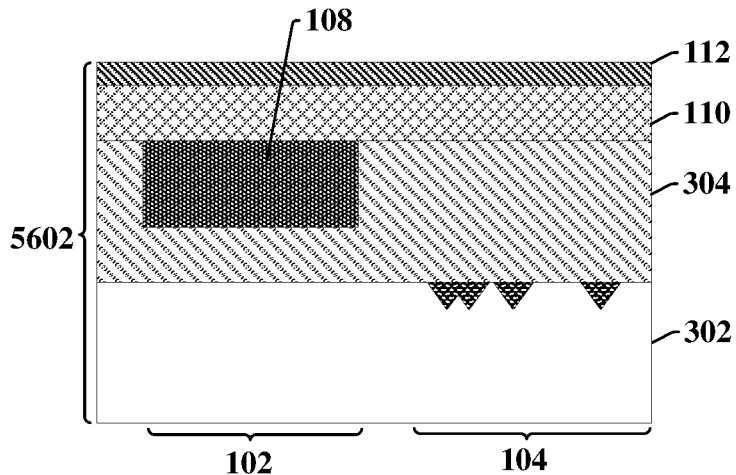

As shown in cross-sectional views 5600 of FIG. 56, the sacrificial substrate (1302 of FIG. 55) and the buffer layer (1402 of FIG. 55) are removed to form a stacked semiconductor structure 5602. In some embodiments, a multi-step process may be used to remove the sacrificial substrate and/or the buffer layer. In some embodiments, the multi-step process may comprise a planarization process, an etching process, and/or the like.

Figure 57:
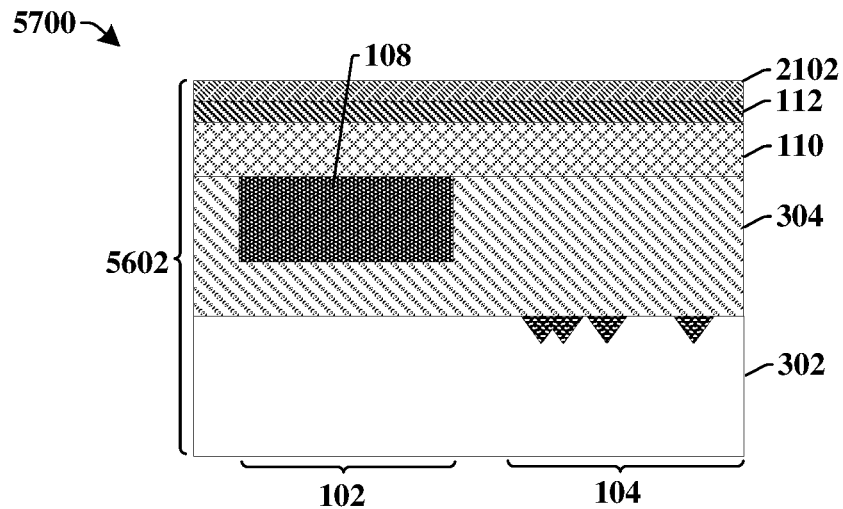

As shown in cross-sectional view 5700 of FIG. 57, a masking layer 2102 is formed over the active semiconductor layer 112. In some embodiments (not shown), wherein the masking layer 2102 comprises an oxide, a photosensitive material (e.g., photoresist) may be formed onto the masking layer 2102.

Figure 58:
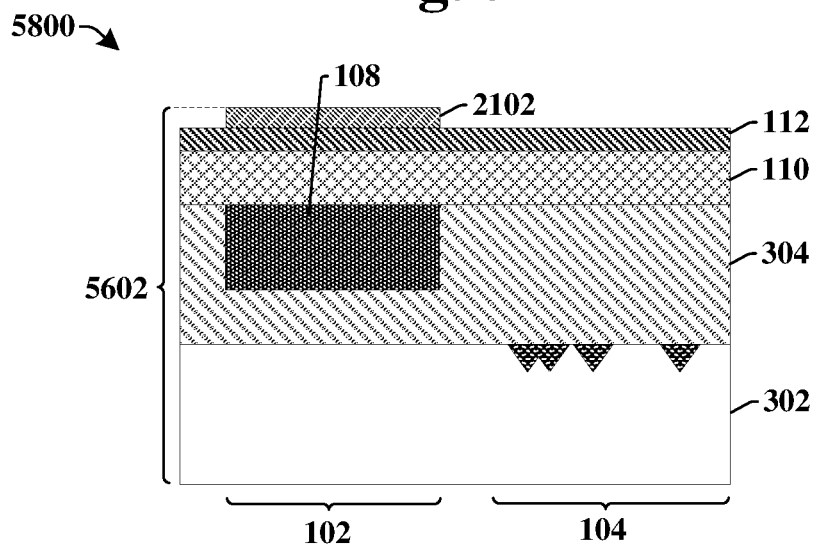

As shown in cross-sectional view 5800 of FIG. 58, the masking layer 2102 is patterned to remove the masking layer 2102 from within a second region 104 of the stacked semiconductor structure 5602. After the patterning process, the masking layer 2102 remains within a first region 102 of the stacked semiconductor structure 5602.

Figure 59:
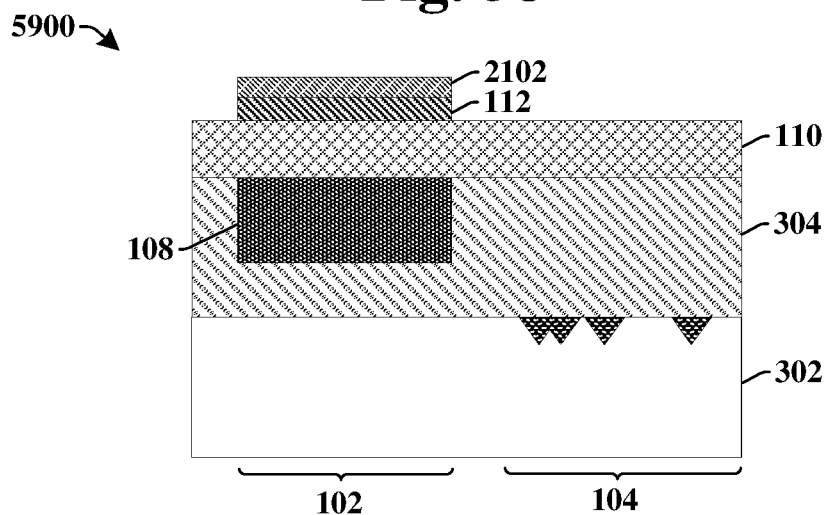

As shown in cross-sectional view 5900 of FIG. 59, the active semiconductor layer 112 is patterned to remove the active semiconductor layer 112 from within the second region 104.

Figure 60:
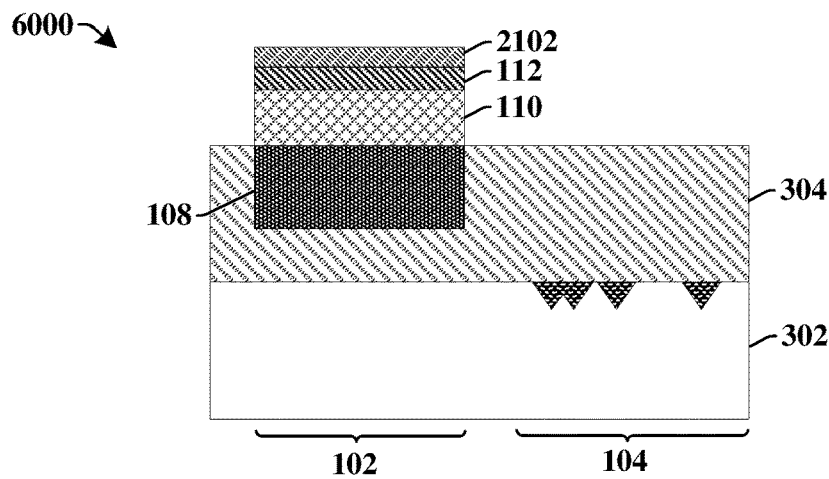

As shown in cross-sectional view 6000 of FIG. 60, the dielectric layer 110 is patterned to remove the dielectric layer 110 from within the second region 104.

Figure 61:
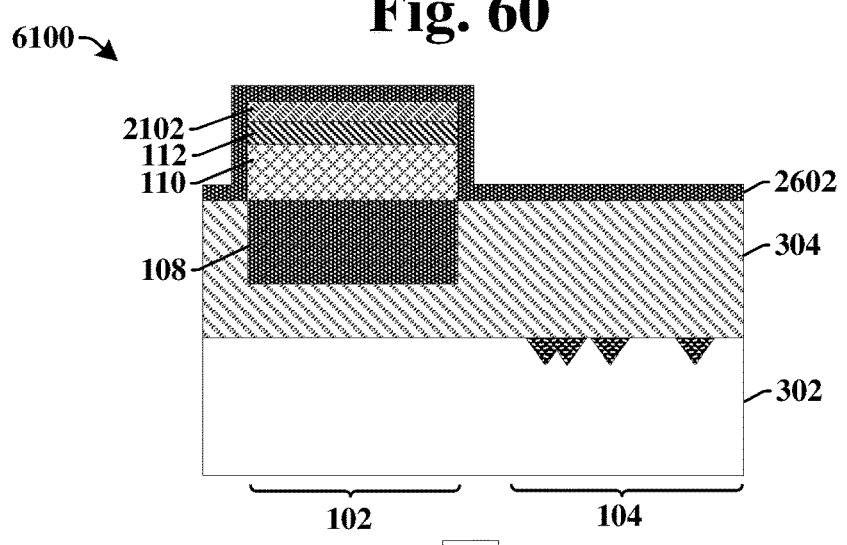
Figure 61:
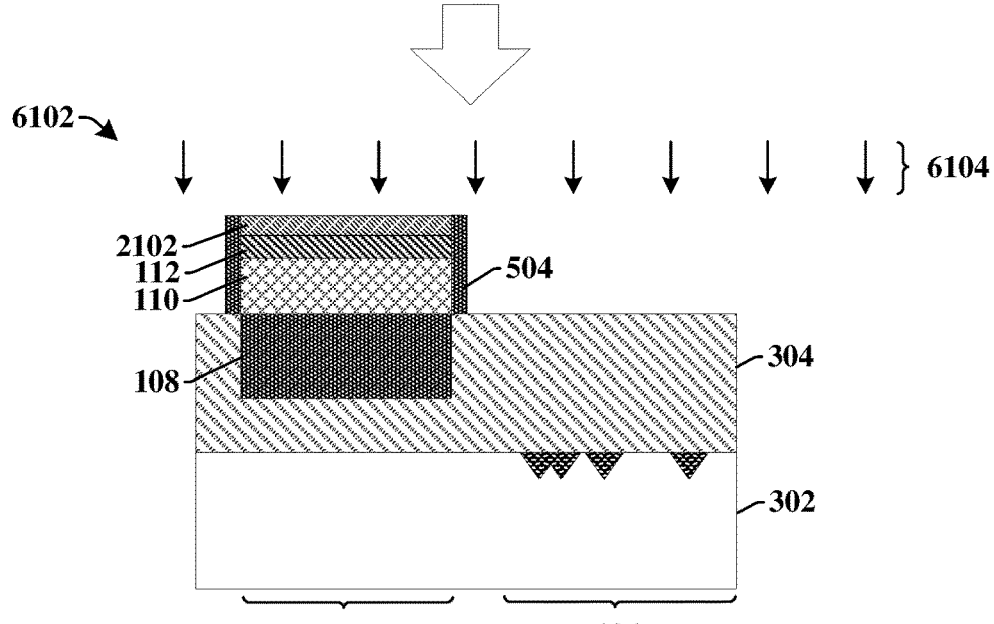

As shown in cross-sectional views 6100 and 6102 of FIG. 61, a spacer 504 is formed over the epitaxial layer 304 and along sidewalls of the polysilicon layer 108, the dielectric layer 110, the active semiconductor layer 112, and the masking layer 2102. In various embodiments, the spacer 504 may be formed by depositing a spacer material 2602 over the epitaxial layer 304 and along sidewalls of the polysilicon layer 108, the dielectric layer 110, the active semiconductor layer 112, and the masking layer 2102. The spacer material 2602 is subsequently exposed to an etchant 6104 (e.g., a dry etchant), which removes the spacer material 2602 from horizontal surfaces.

Figure 62:
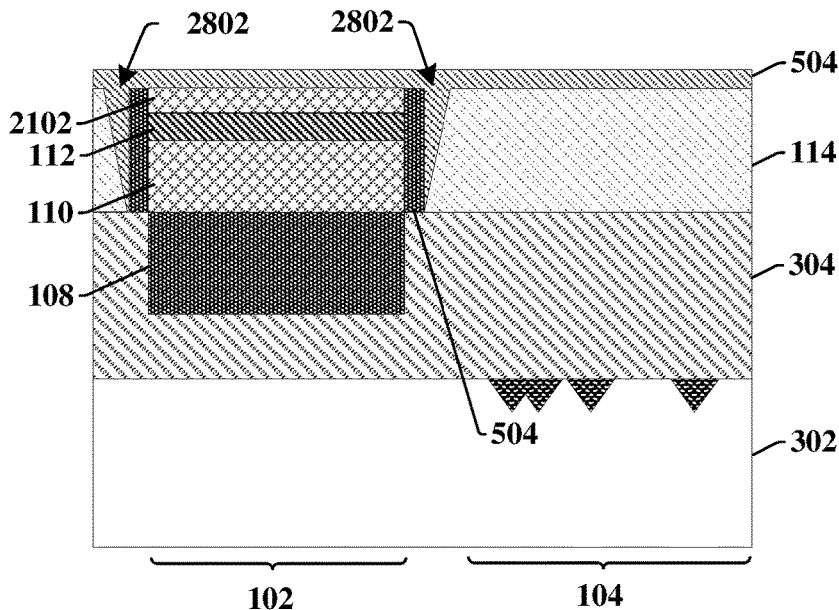

As shown in cross-sectional view 6200 of FIG. 62, a semiconductor material 114 is epitaxially formed within the second region 104. The semiconductor material 114 may be formed to a height that extends to a top surface of the masking layer 2102. In some embodiments, the spacer 504 prevents the semiconductor material 114 from forming along sidewalls of the spacer 504, leaving a gap 2802 between a sidewall of the spacer 504 and the semiconductor material 114. A gap fill material 506 is formed within the gaps 2802 and over top surfaces of the spacer 504 and the semiconductor material 114.

Figure 63A:
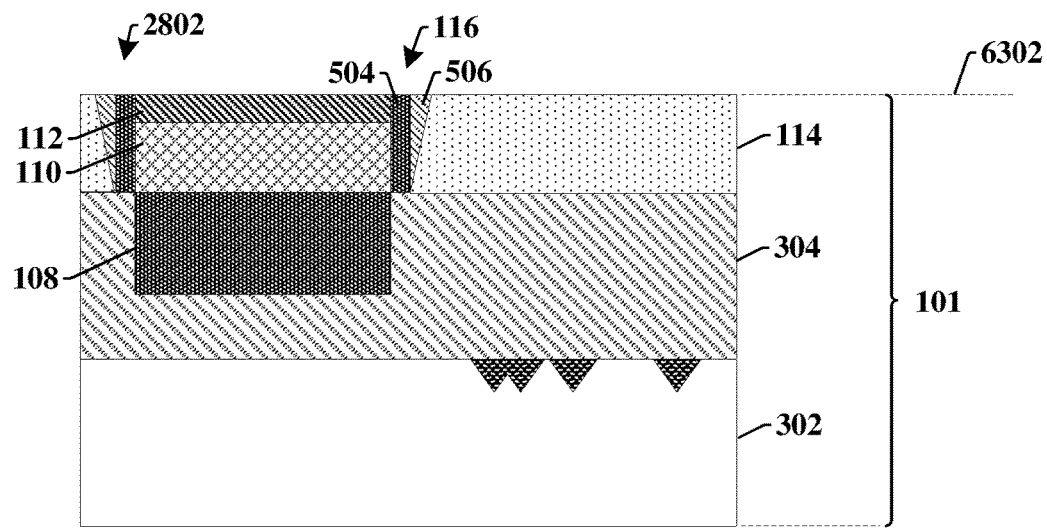

As shown in cross-sectional view 6300 of FIG. 63A, one or more planarization processes are performed (along line 6302) to remove parts of the gap fill material 506, the spacer 504, and the masking layer 2102 over the active semiconductor layer 112 and to define a gap fill structure 116. The one or more planarization processes expose upper surfaces of the active semiconductor layer 112 and the semiconductor material 114.

Figure 63B:
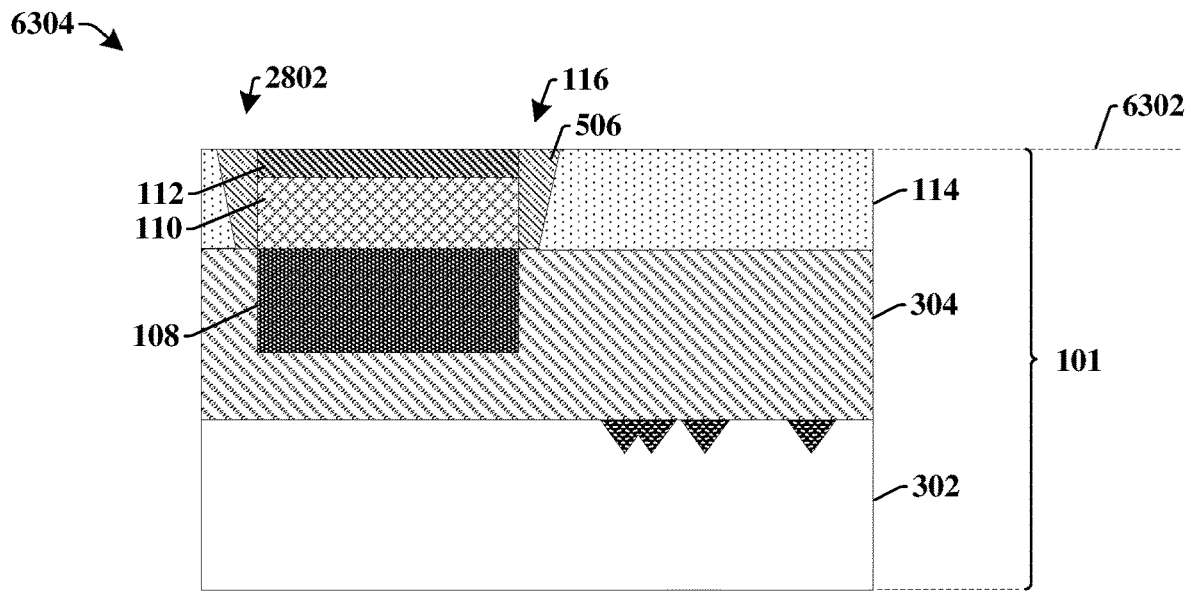

In some alternative embodiments, shown in cross-sectional view 6304 of FIG. 63B, the acts shown in FIG. 61 may be omitted and the method described in FIGS. 49-64 may not form a spacer (e.g., 504) along the exposed sidewalls of the dielectric layer, the active semiconductor layer, and the masking layer. In such embodiments, the gap fill material 506 is formed to completely fill the gaps (e.g., 2802) shown in FIG. 62. Upon performing one or more planarization processes to remove parts of the gap fill material 506, a resulting gap fill structure 116 will comprise a gap fill material 506 that continuously extends between sidewalls of the semiconductor material 114 and sidewalls of the dielectric layer 110 and the active semiconductor layer 112. Although subsequent cross-sectional view(s) shown in this method (e.g., cross-sectional view 6400 of FIG. 64) illustrate a gap fill structure comprising a spacer, it will be appreciated that in alternative embodiments the spacer may be omitted in these cross-sectional view(s).

Figure 64:
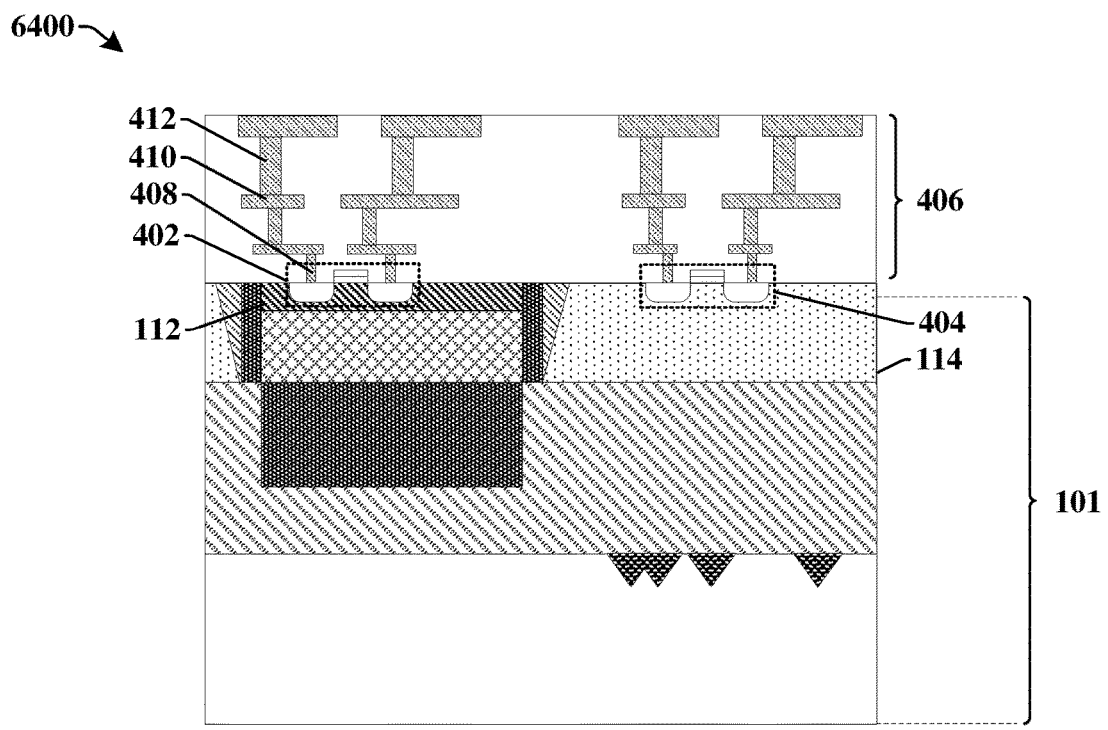

As shown in cross-sectional view 6400 of FIG. 64, a first device 402 is formed within the active semiconductor layer 112 within the first region 102 and a second device 404 is formed within the semiconductor material 114 within the second region 104. The first device 402 and the second device 404 are different types of devices. A plurality of interconnects 408-412 are subsequently formed within an ILD structure 406 over the substrate 101.

Figure 65:
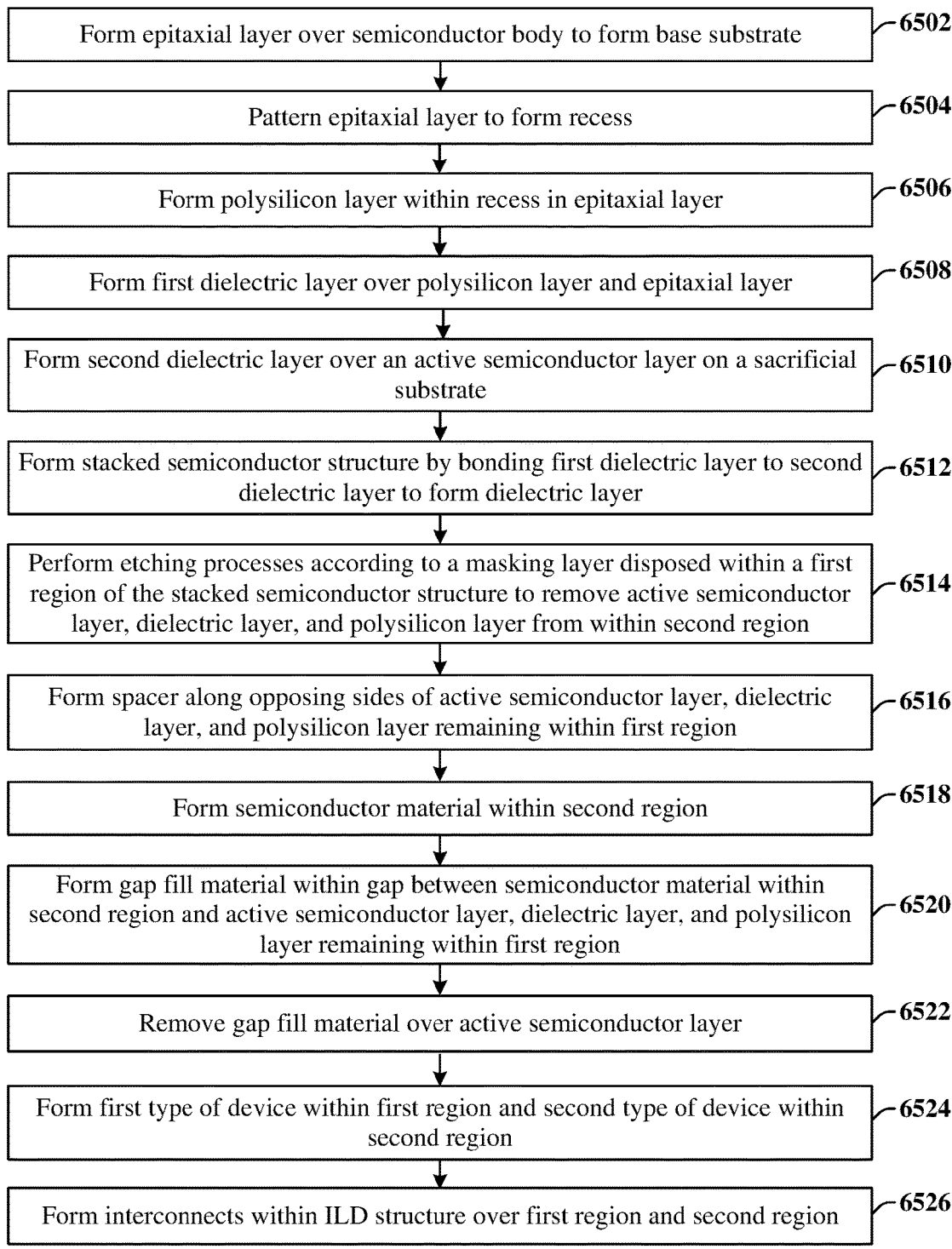
FIG. 65 illustrates a flow diagram of some additional embodiments of a method of forming a multi-function substrate.

FIG. 65 illustrates a flow diagram of some additional embodiments of a method 6500 of forming a multi-function substrate.

At act 6502, an epitaxial layer is formed over a semiconductor body to form a base substrate. FIGS. 49-50 illustrate cross-sectional views 4900-5000 of some embodiments corresponding to act 6502.

At act 6504, the epitaxial layer is patterned to form a recess. FIG. 51 illustrates a cross-sectional view 5100 of some embodiments corresponding to act 6504.

At act 6506, a polysilicon layer is formed within the recess, in some embodiments. FIGS. 52-53 illustrate cross-sectional views 5200-5300 of some embodiments corresponding to act 6506.

At act 6508, a first dielectric layer is formed over the polysilicon layer and the epitaxial layer. FIG. 54A illustrates a cross-sectional view 5400 of some embodiments corresponding to act 6508. FIG. 54B illustrates a cross-sectional view 5404 of some alternative embodiments corresponding to act 6508.

At act 6510, a second dielectric layer is formed over an active semiconductor layer on a sacrificial substrate. FIGS. 13-15 illustrate cross-sectional views 1300-1500 of some embodiments corresponding to act 4808.

At act 6512, a stacked semiconductor structure is formed by bonding the first dielectric layer to the second dielectric layer to form a dielectric layer. FIGS. 55-56 illustrate cross-sectional views 5500-5600 of some embodiments corresponding to act 6512.

At act 6514, one or more etching processes are performed according to a masking layer to remove the active semiconductor layer, the dielectric layer, and the polysilicon layer from within a second region of stacked semiconductor structure. FIGS. 57-60 illustrate cross-sectional views 5700-6000 of some embodiments corresponding to act 6514.

At act 6516, a spacer may be formed along opposing sides of the active semiconductor layer, the dielectric layer, and the polysilicon layer remaining within the first region, in some embodiments. FIG. 61 illustrates cross-sectional views 6100-6102 of some embodiments corresponding to act 6516.

At act 6518, a semiconductor material is formed within the second region. FIG. 62 illustrates a cross-sectional view 6200 of some embodiments corresponding to act 6518.

At act 6520, a gap fill material is formed within a gap between the semiconductor material within the second region and the active semiconductor layer, the dielectric layer, and the polysilicon layer remaining within the first region. FIG. 62 illustrates a cross-sectional view 6200 of some embodiments corresponding to act 6520.

At act 6522, one or more planarization processes are performed to remove the gap fill material from over the active semiconductor layer. FIG. 63A illustrates a cross-sectional view 6300 of some embodiments corresponding to act 6522. FIG. 63B illustrates a cross-sectional view 6304 of some alternative embodiments corresponding to act 6522.

At act 6524, a first type of device is formed within the first region and a second type of device is formed within the second region. FIG. 64 illustrates a cross-sectional view 6400 of some embodiments corresponding to act 6524.

At act 6526, interconnects are formed within an ILD structure over the first region and the second region. FIG. 64 illustrates a cross-sectional view 6400 of some embodiments corresponding to act 6526.

FIGS. 66-81 illustrate cross-sectional views 6600-8100 of some additional embodiments of a method of forming an integrated chip comprising a multi-function substrate. Although FIGS. 66-81 are described in relation to a method, it will be appreciated that the structures disclosed in FIGS. 66-81 are not limited to such a method, but instead may stand alone as structures independent of the method.

Figure 66:
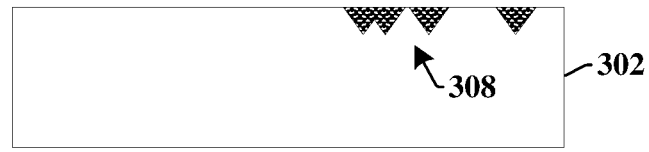
FIGS. 66-81 illustrate cross-sectional views of some additional embodiments of a method of forming a multi-function substrate.

As shown in cross-sectional view 6600 of FIG. 66, a semiconductor body 302 is provided. In some embodiments, one or more defects 308 (e.g., COP defects) may be present within and/or along an upper surface of the semiconductor body 302.

Figure 67:
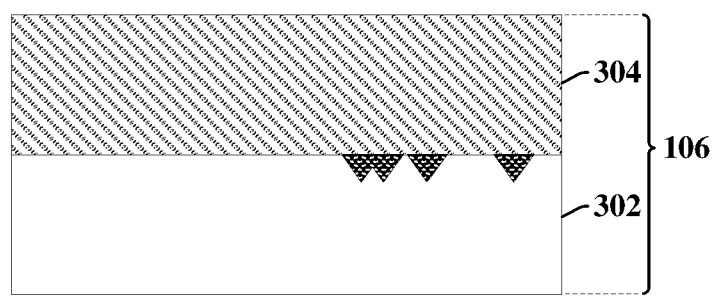

As shown in cross-sectional view 6700 of FIG. 67, an epitaxial layer 304 is formed onto the semiconductor body 302 to form a base substrate 106.

Figure 68:
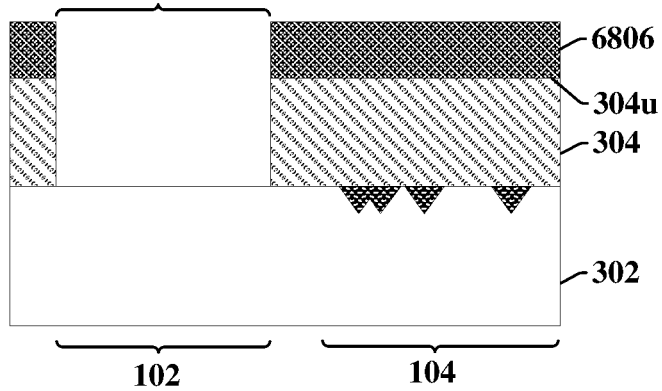

As shown in cross-sectional view 6800 of FIG. 68, the epitaxial layer 304 is selectively patterned to form a recess 6802 formed by sidewalls of the epitaxial layer 304. The sidewalls of the epitaxial layer 304 extend through the epitaxial layer 304, so that the recess 6802 exposes an upper surface of the semiconductor body 302. The recess 6802 is formed within a first region 102, while an upper surface 304u of the epitaxial layer 304 continuously extends over a second region 104. In some embodiments, the recess 6802 may be formed by selectively exposing the epitaxial layer 304 to an etchant 6804 according to a first masking layer 6806. In various embodiments, the etchant 6804 may comprise a wet etchant and/or a dry etchant. In some embodiments, the first masking layer 6806 may comprise a photosensitive material, a hard mask, or the like.

Figure 69:
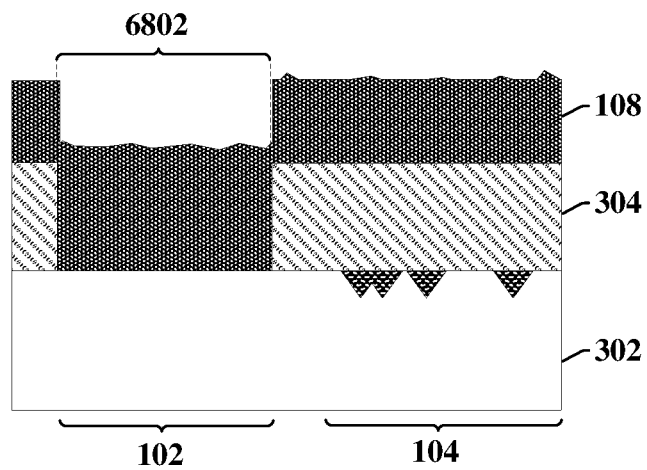

As shown in cross-sectional view 6900 of FIG. 69, a polysilicon layer 108 is formed within the recess 6802 within the epitaxial layer 304. In some embodiments, the polysilicon layer 108 may be formed to a thickness of between approximately 2 kÅ and approximately 6 kÅ, between approximately 3 kÅ and approximately 4 kÅ, between approximately 3 kÅ and approximately 2 µm, or other similar values. In some embodiments, the polysilicon layer 108 may further extend from within the recess 6802 to over the upper surface of the epitaxial layer 304.

Figure 70:
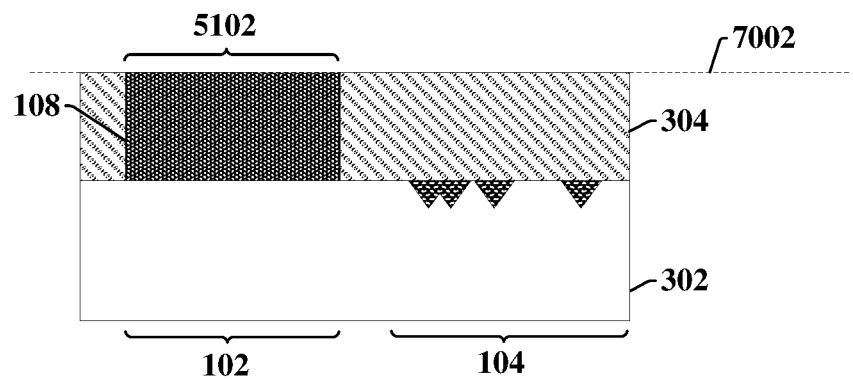

As shown in cross-sectional view 7000 of FIG. 70, one or more planarization processes are performed (along line 7002) to remove part of the polysilicon layer 108 from over the epitaxial layer 304. The one or more planarization processes are completed the upper surface of the epitaxial layer 304 may be substantially co-planar (e.g., co-planar within a tolerance of a planarization process) with an upper surface of the polysilicon layer 108.

Figure 71A:
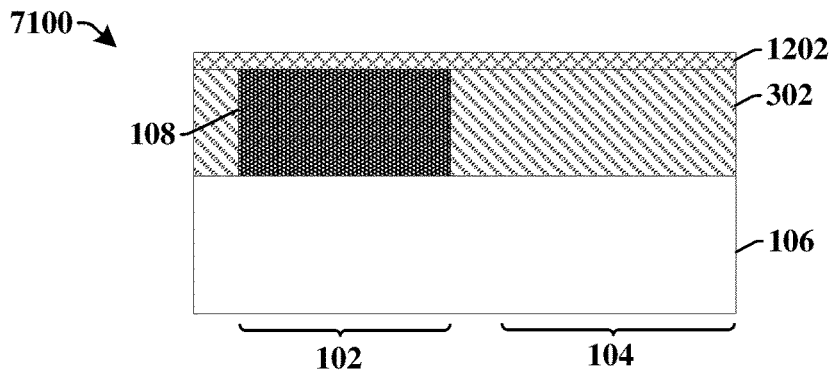
Figure 71B:
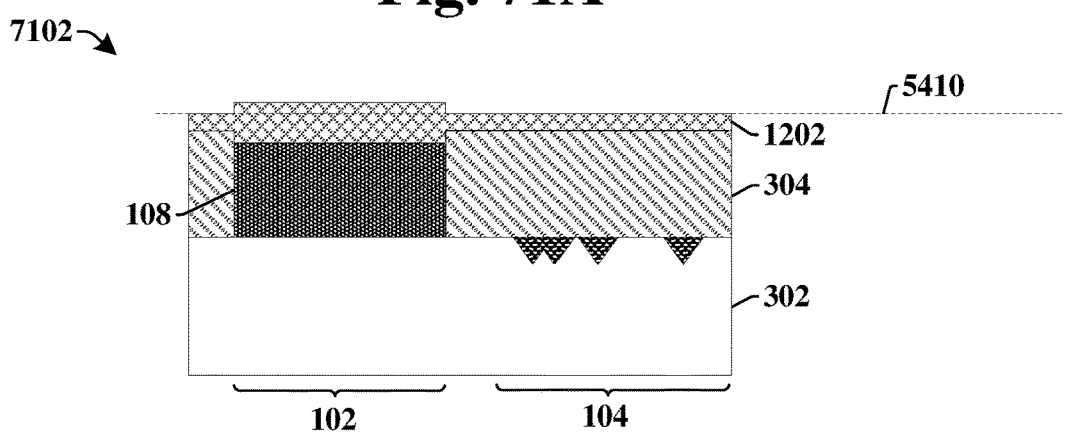

As shown in cross-sectional views 7100 and 7102 of FIGS. 71A-71B, a first dielectric layer 1202 is formed onto the polysilicon layer 108 and the epitaxial layer 304 in some embodiments. In some embodiments, shown in cross-sectional views 7100 of FIG. 71A, the first dielectric layer 1202 may have a first thickness within the first region 102 and the second region 104. In some such embodiments, the first dielectric layer 1202 may be formed by a deposition process (e.g., a PVD process, a CVD process, a PE-CVD process, an ALD process, or the like). In other embodiments, shown in cross-sectional views 7102 of FIG. 71B, the first dielectric layer 1202 may have a second thickness within the first region 102 and a third thickness within the second region 104. In some such embodiments, the first dielectric layer 1202 may be formed by a thermal growth process. In some embodiments, after the thermal growth process, a planarization process (e.g., a CMP process) may be performed (along line 5410) to give the first dielectric layer 1202 a planar upper surface. In some alternative embodiments, the acts shown in FIGS. 69-70 may be omitted and the method described in FIGS. 66-81 may not form a polysilicon layer (e.g., 108) onto the base substrate 106. In such embodiments, the first dielectric layer 1202 is formed directly onto the base substrate 106.

Figure 72:
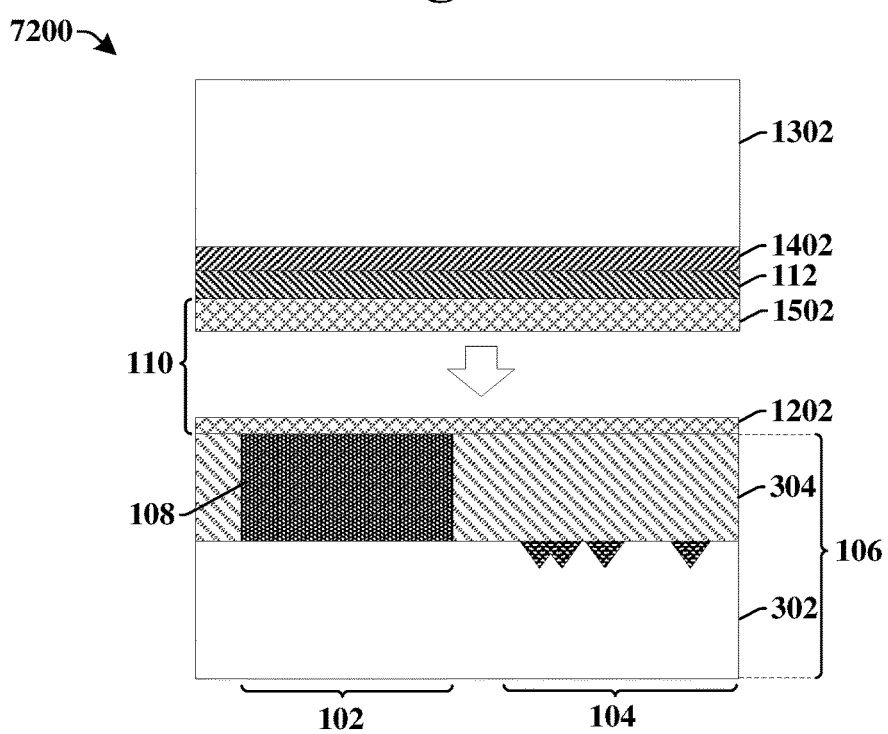

As shown in cross-sectional view 7200 of FIG. 72, a sacrificial substrate 1302 is bonded to the base substrate 106 along an interface comprising the first dielectric layer 1202 and a second dielectric layer 1502. A buffer layer 1402 is arranged on the sacrificial substrate 1302 and an active semiconductor layer 112 is between the buffer layer 1402 and the second dielectric layer 1502. The active semiconductor layer 112 is between the buffer layer 1402 and the second dielectric layer 1502. The bonding process results in a dielectric layer 110 arranged between the polysilicon layer 108 and the active semiconductor layer 112.

Figure 73:
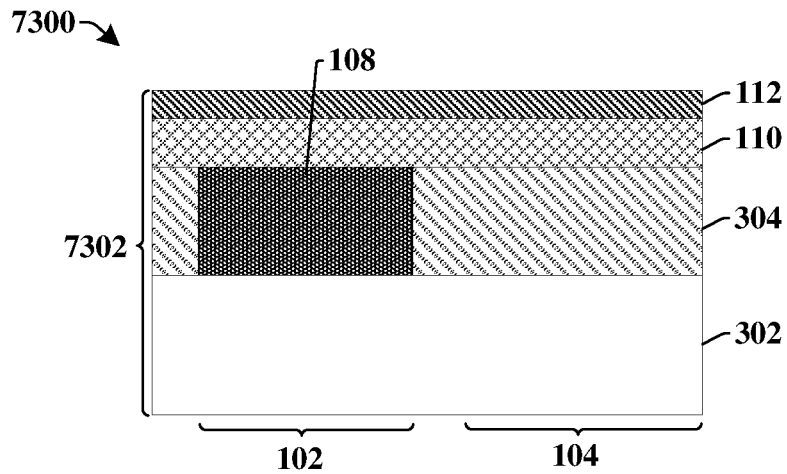

As shown in cross-sectional view 7300 of FIG. 73, the sacrificial substrate (1302 of FIG. 72) and the buffer layer (1402 of FIG. 72) are removed to form a stacked semiconductor structure 7302. In some embodiments, a multi-step process may be used to remove the sacrificial substrate and/or the buffer layer. In some embodiments, the multi-step process may comprise a planarization process, an etching process, or the like.

Figure 74:
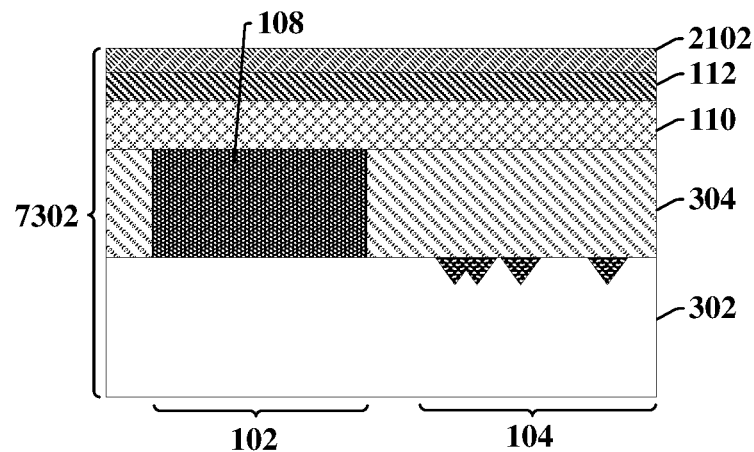

As shown in cross-sectional view 7400 of FIG. 74, a masking layer 2102 is formed over the active semiconductor layer 112. In some embodiments (not shown), wherein the masking layer 2102 comprises an oxide, a photosensitive material (e.g., photoresist) may be formed onto the masking layer 2102.

Figure 75:
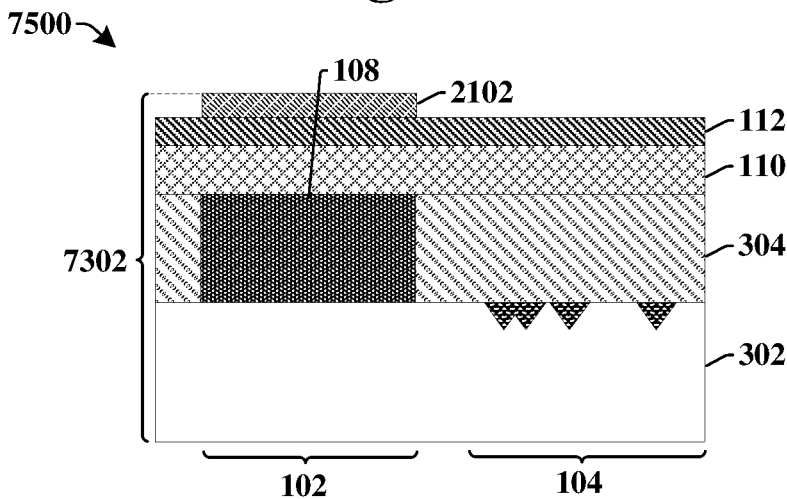

As shown in cross-sectional view 7500 of FIG. 75, the masking layer 2102 is patterned to remove the masking layer 2102 from within a second region 104 of the stacked semiconductor structure 7302. After the patterning process, the masking layer 2102 remains within a first region 102 of the stacked semiconductor structure 7302.

Figure 76:
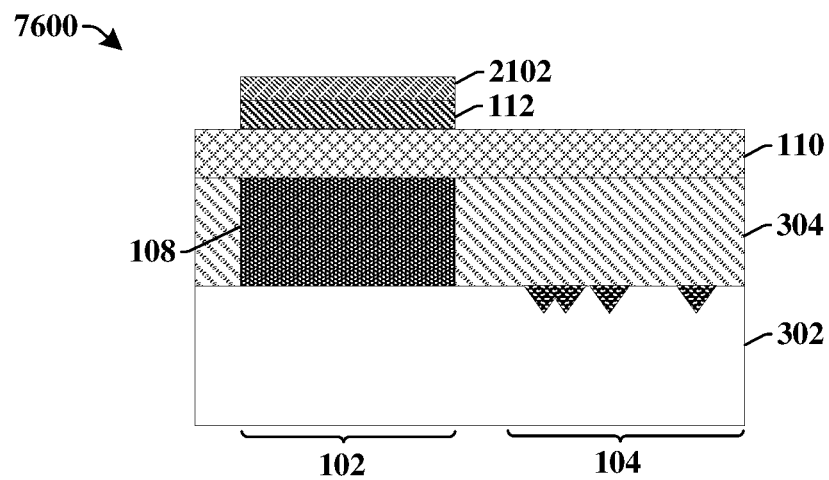

As shown in cross-sectional view 7600 of FIG. 76, the active semiconductor layer 112 is patterned to remove the active semiconductor layer 112 from within the second region 104.

Figure 77:
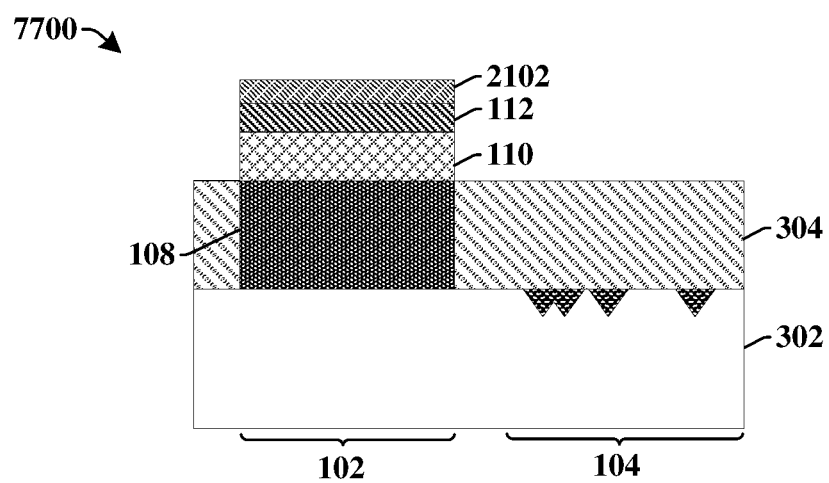

As shown in cross-sectional view 7700 of FIG. 77, the dielectric layer 110 is patterned to remove the dielectric layer 110 from within the second region 104.

Figure 78:
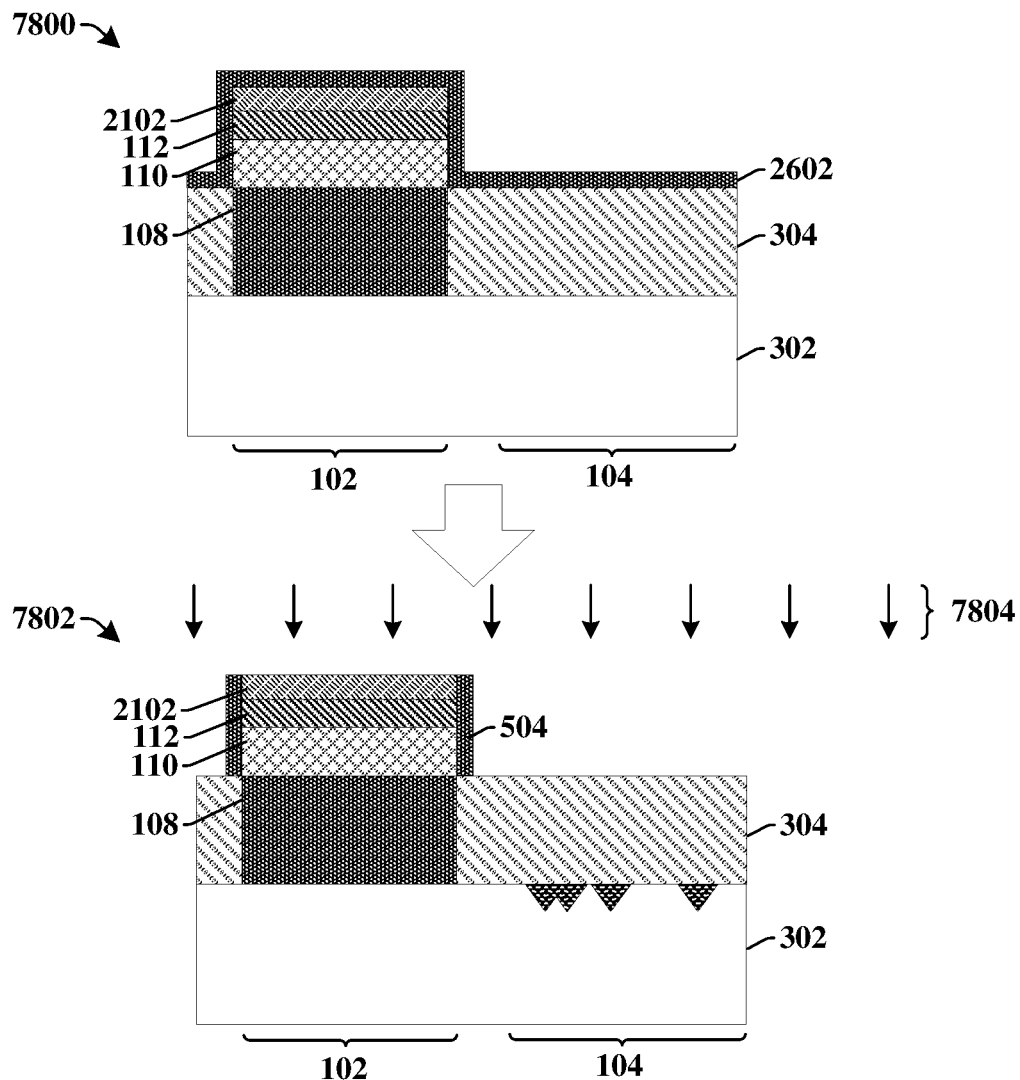

As shown in cross-sectional view 7800 and 7802 of FIG. 78, a spacer 504 is formed over the epitaxial layer 304 and along sidewalls of the polysilicon layer 108, the dielectric layer 110, the active semiconductor layer 112, and the masking layer 2102. In various embodiments, the spacer 504 may be formed by depositing a spacer material 2602 over the epitaxial layer 304 and along sidewalls of the polysilicon layer 108, the dielectric layer 110, the active semiconductor layer 112, and the masking layer 2102. The spacer material 2602 is subsequently exposed to an etchant 7804 (e.g., a dry etchant), which removes the spacer material 2602 from horizontal surfaces.

Figure 79:
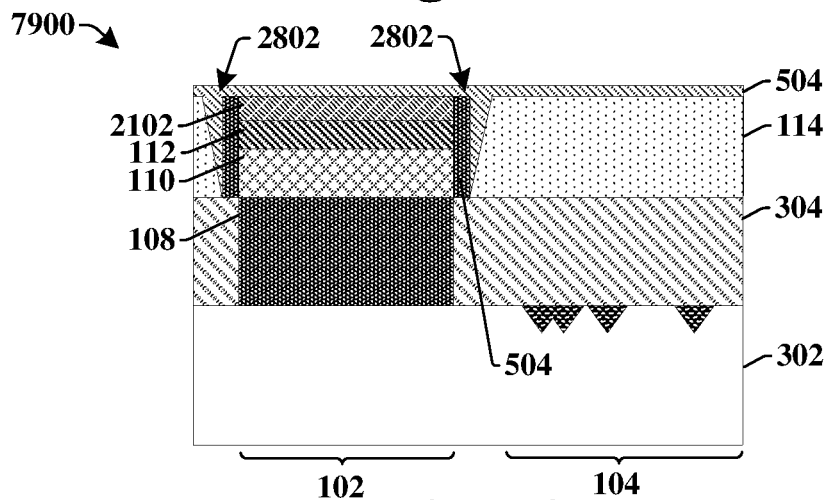

As shown in cross-sectional view 7900 of FIG. 79, a semiconductor material 114 is epitaxially formed within the second region 104. The semiconductor material 114 may be formed to a height that extends to a top surface of the masking layer 2102. In some embodiments, the spacer 504 prevents the semiconductor material 114 from forming along sidewalls of the spacer 504, leaving a gap 2802 between a sidewall of the spacer 504 and the semiconductor material 114. A gap fill material 506 is formed within the gaps 2802 and over top surfaces of the spacer 504 and the semiconductor material 114.

As shown in cross-sectional view 8000 of FIG. 80, one or more planarization processes are performed (along line 8002) to remove parts of the gap fill material 506, the spacer 504, and the masking layer 2102 over the active semiconductor layer 112 and to define a gap fill structure 116. The one or more planarization processes expose upper surfaces of the active semiconductor layer 112 and the semiconductor material 114.

Figure 80A:
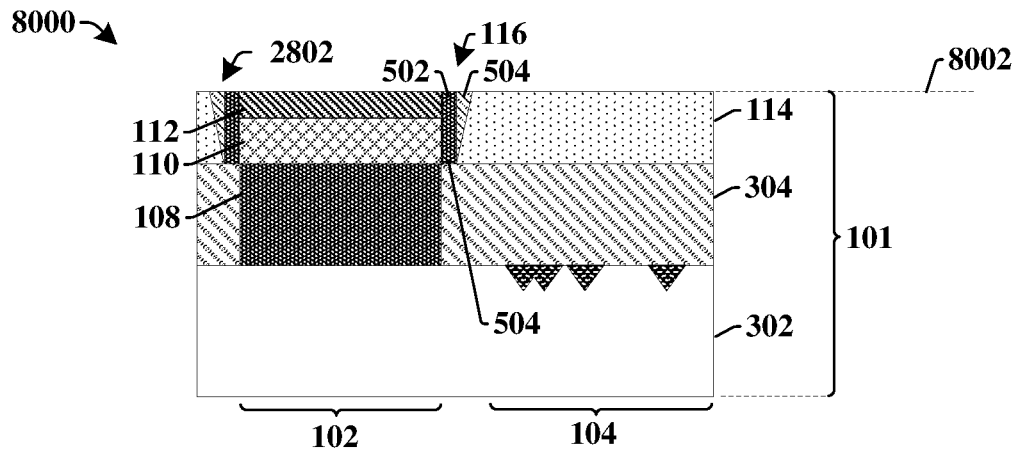
Figure 80B:
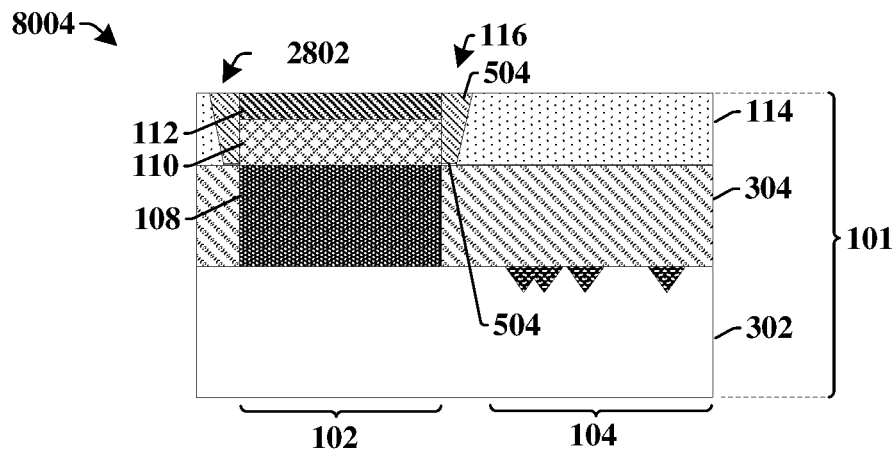

In some alternative embodiments, shown in cross-sectional view 8004 of FIG. 80B, the acts shown in FIG. 78 may be omitted and the method described in FIGS. 65-81 may not form a spacer (e.g., 504) along the exposed sidewalls of the dielectric layer, the active semiconductor layer, and the masking layer. In such embodiments, the gap fill material 506 is formed to completely fill the gaps (e.g., 2802) shown in FIG. 79. Upon performing one or more planarization processes to remove parts of the gap fill material 506, a resulting gap fill structure 116 will comprise a gap fill material 506 that continuously extends between sidewalls of the semiconductor material 114 and sidewalls of the dielectric layer 110 and the active semiconductor layer 112. Although subsequent cross-sectional view(s) shown in this method (e.g., cross-sectional view 8100 of FIG. 81) illustrate a gap fill structure comprising a spacer, it will be appreciated that in alternative embodiments the spacer may be omitted in these cross-sectional view(s).

Figure 81:
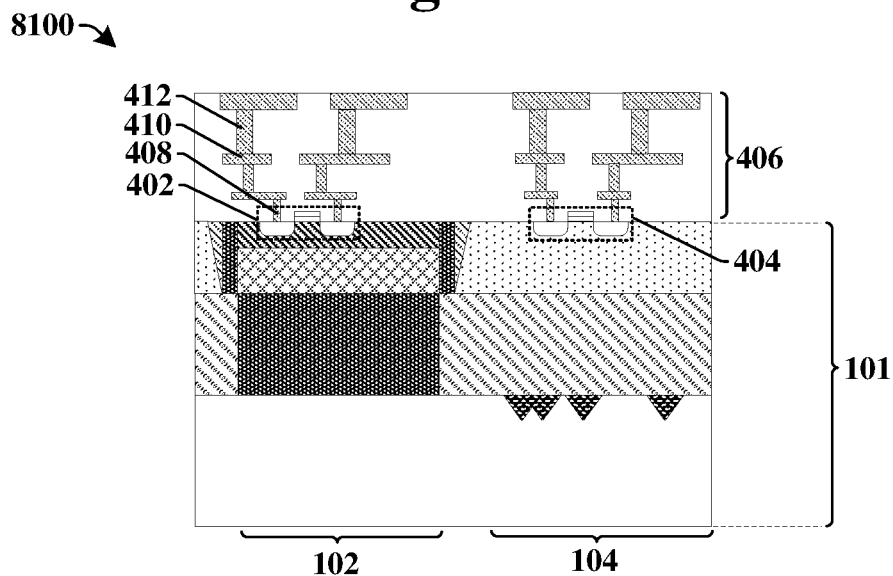

As shown in cross-sectional view 8100 of FIG. 81, a first device 402 is formed within the active semiconductor layer 112 within the first region 102 and a second device 404 is formed within the semiconductor material 114 within the second region 104. The first device 402 and the second device 404 are different types of devices. A plurality of interconnects 408-412 are subsequently formed within an ILD structure 406 over the substrate 101.

Figure 82:
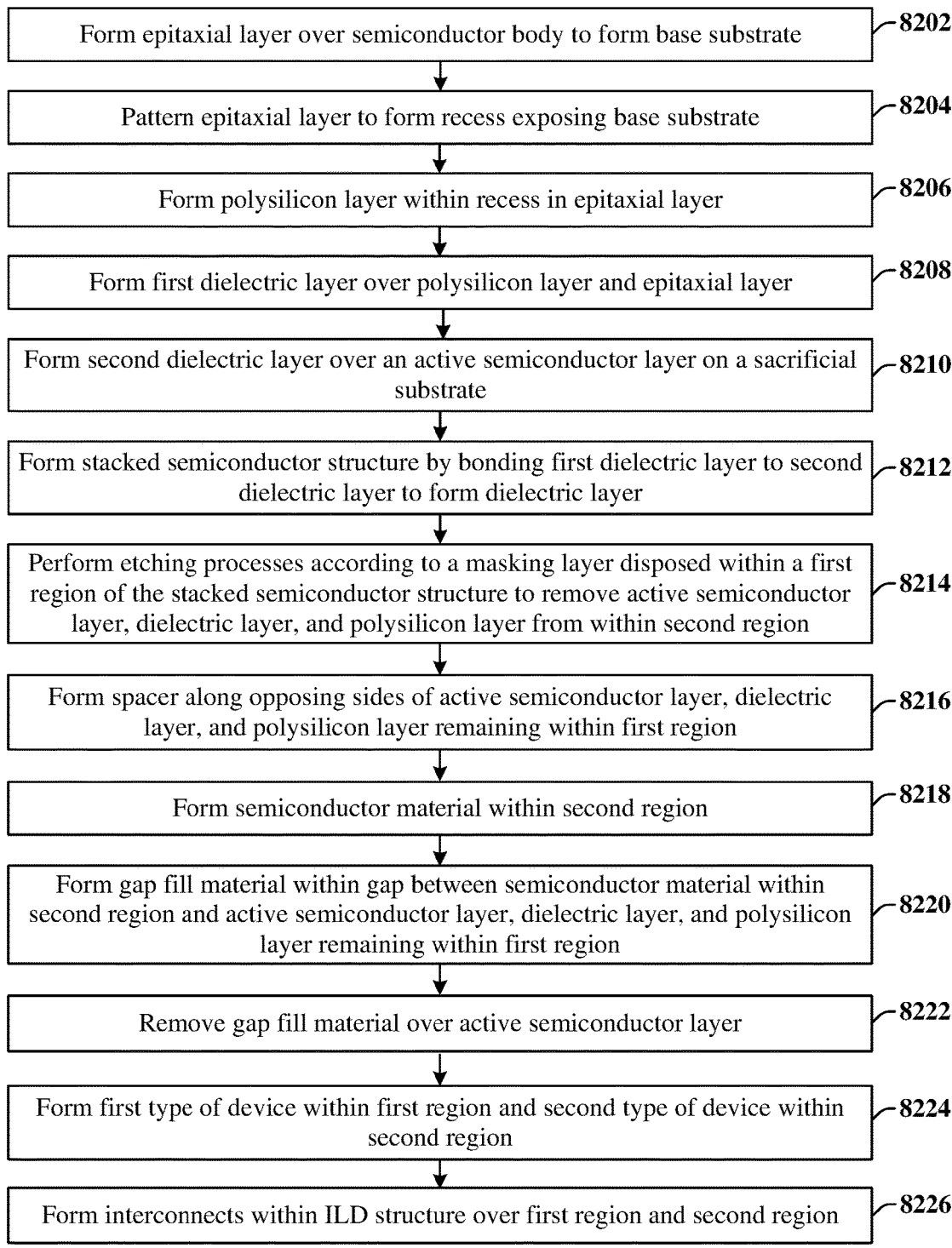
FIG. 82 illustrates a flow diagram of some additional embodiments of a method of forming a multi-function substrate.

FIG. 82 illustrates a flow diagram of some additional embodiments of a method 8200 of forming a multi-function substrate.

At act 8202, an epitaxial layer is formed over a semiconductor body to form a base substrate. FIGS. 66-67 illustrate cross-sectional views 6600-6700 of some embodiments corresponding to act 8202.

At act 8204, the epitaxial layer is patterned to form a recess exposing the base substrate. FIG. 68 illustrates a cross-sectional view 6800 of some embodiments corresponding to act 8204.

At act 8206, a polysilicon layer is formed within the recess, in some embodiments. FIGS. 69-70 illustrate cross-sectional views 6900-7000 of some embodiments corresponding to act 8206.

At act 8208, a first dielectric layer is formed over the polysilicon layer and the epitaxial layer. FIG. 71A illustrates a cross-sectional view 7100 of some embodiments corresponding to act 8208. FIG. 71B illustrates a cross-sectional view 7102 of some alternative embodiments corresponding to act 8208.

At act 8210, a second dielectric layer is formed over an active semiconductor layer on a sacrificial substrate. FIGS. 13-15 illustrate cross-sectional views 1300-1500 of some embodiments corresponding to act 8210.

At act 8212, a stacked semiconductor structure is formed by bonding the first dielectric layer to the second dielectric layer to form a dielectric layer. FIGS. 72-73 illustrate cross-sectional views 7200-7300 of some embodiments corresponding to act 8212.

At act 8214, one or more etching processes are performed according to a masking layer to remove the active semiconductor layer, the dielectric layer, and the polysilicon layer from within a second region of the stacked semiconductor structure. After the one or more etching processes are completed, the active semiconductor layer, the dielectric layer, and the polysilicon layer remain within a first region of the stacked semiconductor structure. FIGS. 74-77 illustrate cross-sectional views 7400-7700 of some embodiments corresponding to act 8214.

At act 8216, a spacer may be formed along opposing sides of the active semiconductor layer, the dielectric layer, and the polysilicon layer remaining within the first region, in some embodiments. FIG. 78 illustrates cross-sectional views 7800 and 7802 of some embodiments corresponding to act 8216.

At act 8218, a semiconductor material is formed within the second region. FIG. 79 illustrates a cross-sectional view 7900 of some embodiments corresponding to act 8218.

At act 8220, a gap fill material is formed within a gap between the semiconductor material within the second region and the active semiconductor layer, the dielectric layer, and the polysilicon layer remaining within the first region. FIG. 79 illustrates a cross-sectional view 7900 of some embodiments corresponding to act 8220.

At act 8222, one or more planarization processes are performed to remove the gap fill material from over the active semiconductor layer. FIG. 80A illustrates a cross-sectional view 8000 of some embodiments corresponding to act 8222. FIG. 80B illustrates a cross-sectional view 8004 of some alternative embodiments corresponding to act 8222.

At act 8224, a first type of device is formed within the first region and a second type of device is formed within the second region. FIG. 81 illustrates a cross-sectional view 8100 of some embodiments corresponding to act 8224.

At act 8226, interconnects are formed within an ILD structure over the first region and the second region. FIG. 81 illustrates a cross-sectional view 8100 of some embodiments corresponding to act 8226.

FIGS. 83-98 illustrate cross-sectional views 8300-9800 of some embodiments of a method of forming an integrated chip comprising a multi-function substrate having three different regions with different structures. Although FIGS. 83-98 are described in relation to a method, it will be appreciated that the structures disclosed in FIGS. 83-98 are not limited to such a method, but instead may stand alone as structures independent of the method.

Figure 83:
FIGS. 83-98 illustrate cross-sectional views of some additional embodiments of a method of forming a multi-function substrate having three different regions with different structures.

As shown in cross-sectional view 8300 of FIG. 83, a semiconductor body 302 is provided. In some embodiments, one or more defects 308 (e.g., COP defects) may be present within and/or along an upper surface of the semiconductor body 302.

Figure 84:
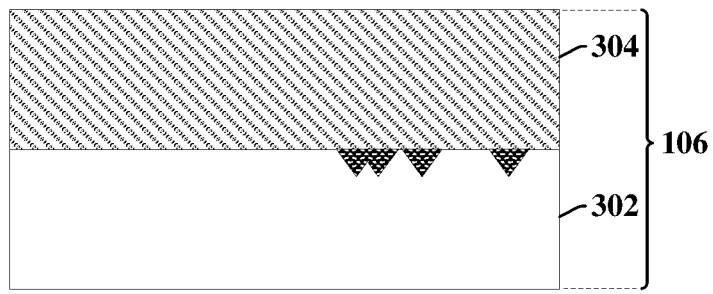

As shown in cross-sectional view 8400 of FIG. 84, an epitaxial layer 304 is formed onto the semiconductor body 302 to form a base substrate 106.

Figure 85:
Figure 85:
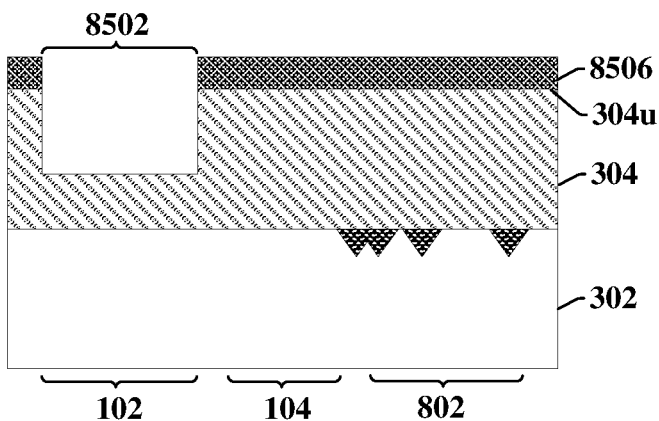

As shown in cross-sectional view 8500 of FIG. 85, the epitaxial layer 304 is selectively patterned to form a recess 8502 formed by sidewalls of the epitaxial layer 304. The recess 8502 is formed within a first region 102, while an upper surface 304$u$ of the epitaxial layer 304 continuously extends over a second region 104 and a third region 802. In some embodiments, the recess 8502 may be formed by selectively exposing the epitaxial layer to an etchant 8504 according to a first masking layer 8506.

Figure 86:
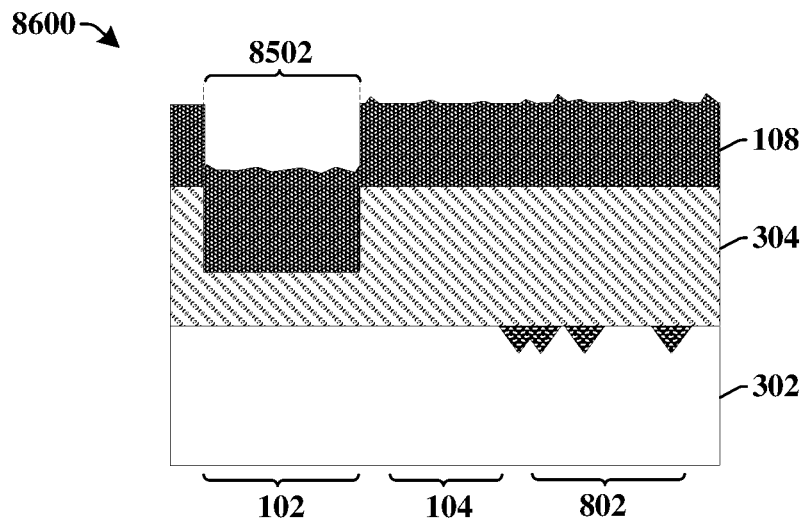

As shown in cross-sectional view 8600 of FIG. 86, a polysilicon layer 108 is formed within the recess 8502 within the epitaxial layer 304.

Figure 87:
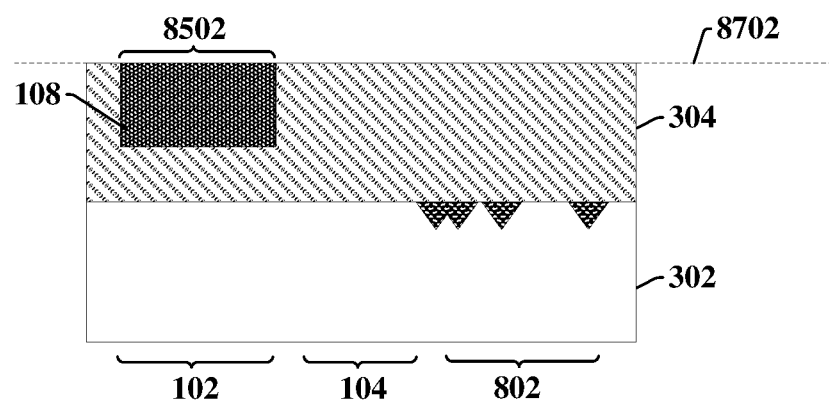

As shown in cross-sectional view 8700 of FIG. 87, one or more planarization processes are performed (along line 8702) to remove part of the polysilicon layer 108 from over the epitaxial layer 304. After the one or more planarization processes are completed, the upper surface of the epitaxial layer 304 may be substantially co-planar (e.g., co-planar within a tolerance of a planarization process) with an upper surface of the polysilicon layer 108.

Figure 88A:
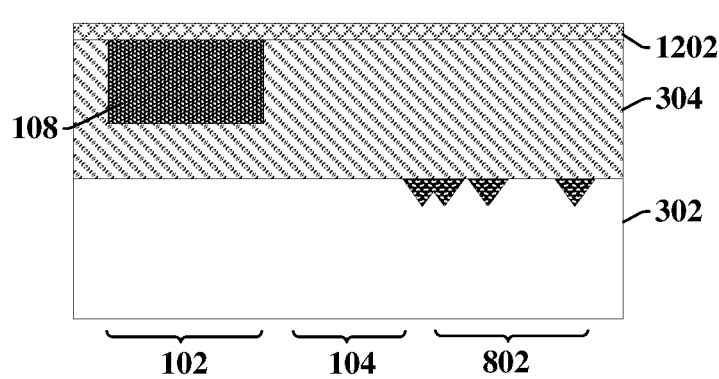
Figure 88B:
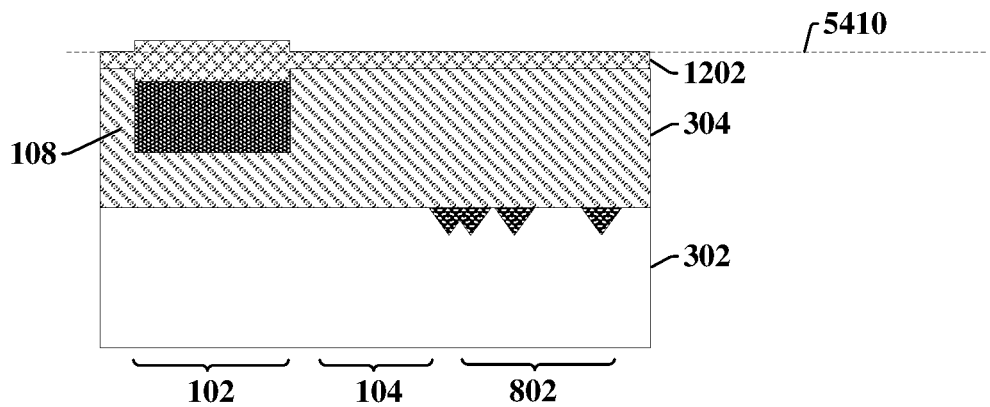

As shown in cross-sectional views 8800 and 8802 of FIGS. 88A-88B, a first dielectric layer 1202 is formed onto the polysilicon layer 108 and the epitaxial layer 304. In some embodiments, shown in cross-sectional views 8800 of FIG. 88A, the first dielectric layer 1202 may have a first thickness within the first region 102, the second region 104, and the third region 802. In some such embodiments, the first dielectric layer 1202 may be formed by a deposition process (e.g., a PVD process, a CVD process, a PE-CVD process, an ALD process, or the like). In other embodiments, shown in cross-sectional views 8802 of FIG. 88B, the first dielectric layer 1202 may have a second thickness within the first region 102 and a third thickness within the second region 104 and the third region 802. In some such embodiments, the first dielectric layer 1202 may be formed by a thermal growth process. In some embodiments, after the thermal growth process, a planarization process (e.g., a CMP process) may be performed (along line 5410) to give the first dielectric layer 1202 a planar upper surface. In some alternative embodiments, the acts shown in FIGS. 86-87 may be omitted and the method described in FIGS. 83-98 may not form a polysilicon layer (e.g., 108) onto the epitaxial layer 304. In such embodiments, the first dielectric layer 1202 is formed directly onto the epitaxial layer 304.

Figure 89:
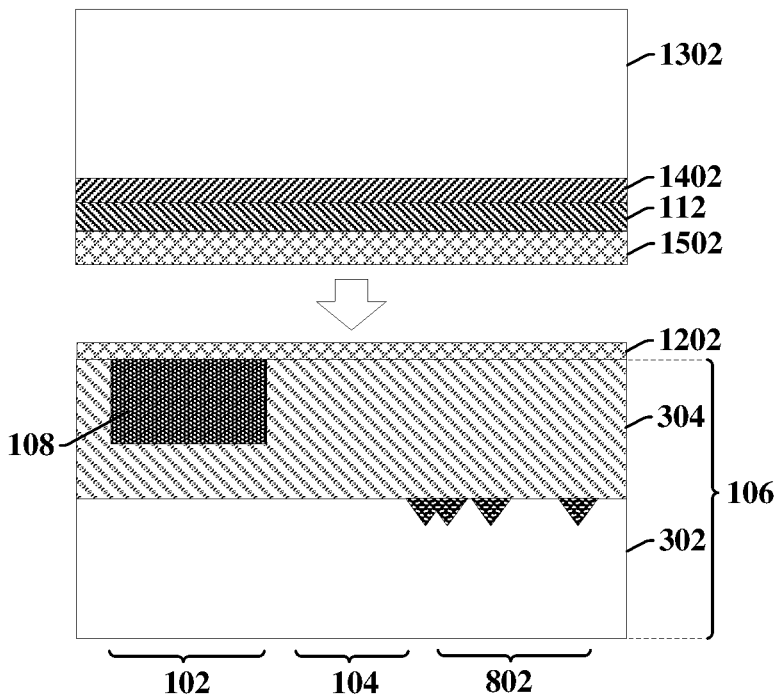

As shown in cross-sectional view 8900 of FIG. 89, a sacrificial substrate 1302 is bonded to the base substrate 106 along an interface comprising the first dielectric layer 1202 and a second dielectric layer 1502. A buffer layer 1402 is arranged on the sacrificial substrate 1302 and an active semiconductor layer 112 is between the buffer layer 1402 and the second dielectric layer 1502. The active semiconductor layer 112 is between the buffer layer 1402 and the second dielectric layer 1502. The bonding process results in a dielectric layer 110 arranged between the polysilicon layer 108 and the active semiconductor layer 112.

Figure 90:
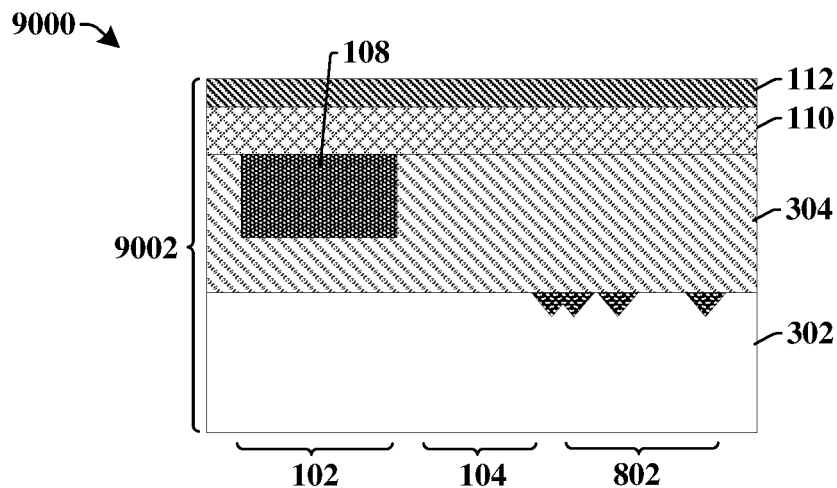

As shown in cross-sectional view 9000 of FIG. 90, the sacrificial substrate (1302 of FIG. 89) and the buffer layer (1402 of FIG. 89) are removed to form a stacked semiconductor structure 9002. In some embodiments, a multi-step process may be used to remove the sacrificial substrate and/or the buffer layer. In some embodiments, the multi-step process may comprise a planarization process, an etching process, or the like.

Figure 91:
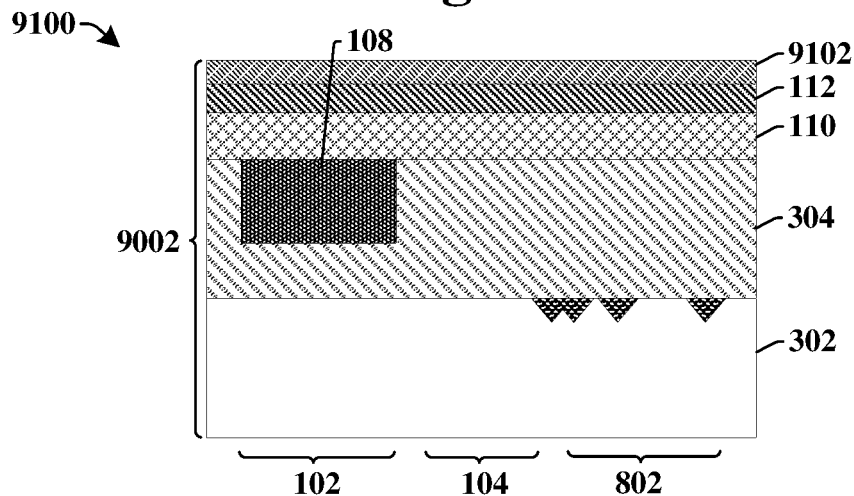

As shown in cross-sectional view 9100 of FIG. 91, a masking layer 9102 is formed over the active semiconductor layer 112. In some embodiments (not shown), wherein the masking layer 9102 comprises an oxide, a photosensitive material (e.g., photoresist) may be formed onto the masking layer 9102.

Figure 92:
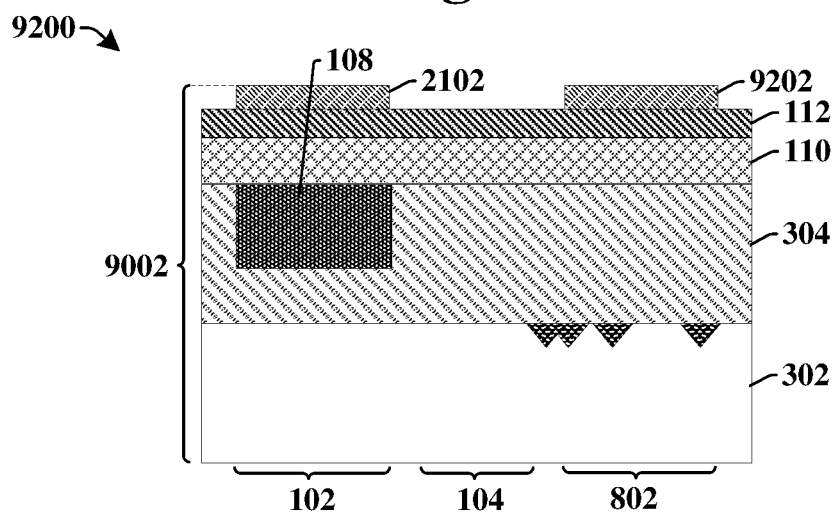

As shown in cross-sectional view 9200 of FIG. 92, the masking layer (9102 of FIG. 91) is patterned to remove the masking layer 2102 from within a second region 104 of the stacked semiconductor structure 9002. After the patterning process, a first part of the masking layer 2102 remains within a first region 102 and a second part of the masking layer 9202 remains within the third region 802 of the stacked semiconductor structure 9002.

Figure 93:
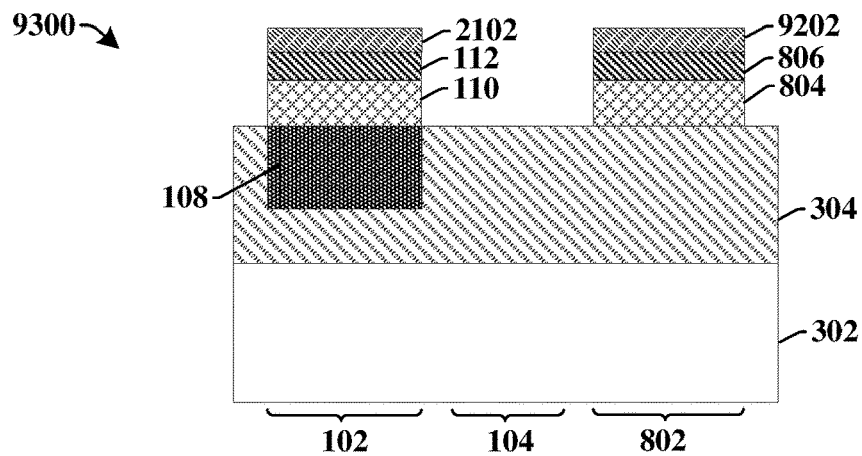

As shown in cross-sectional view 9300 of FIG. 93, the active semiconductor layer 112 is patterned to remove the active semiconductor layer 112 from within the second region 104. Removing the active semiconductor layer 112 from within the second region 104 results in the active semiconductor layer 112 within the first region 102 and a second active semiconductor layer 806 within the third region 802. The dielectric layer also 110 is patterned to remove the dielectric layer 110 from within the second region 104. Removing the dielectric layer 110 from within the second region 104 results in the dielectric layer 110 within the first region 102 and a second dielectric layer 804 within the third region 802.

Figure 94:
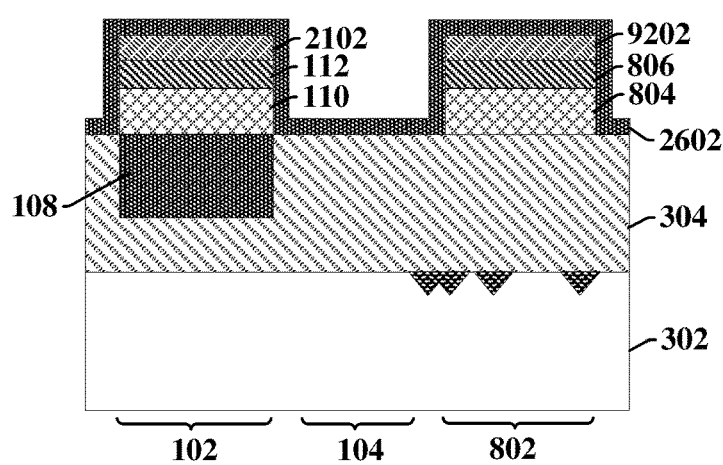
Figure 94:
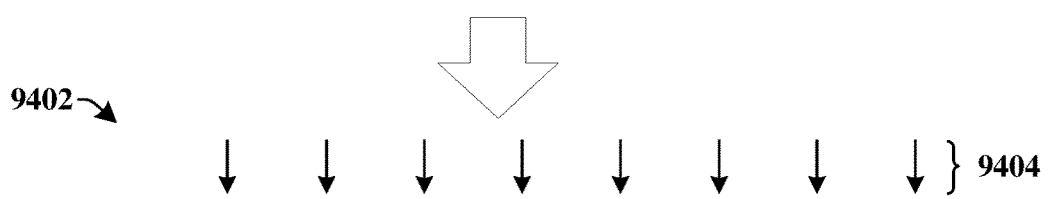
Figure 94:
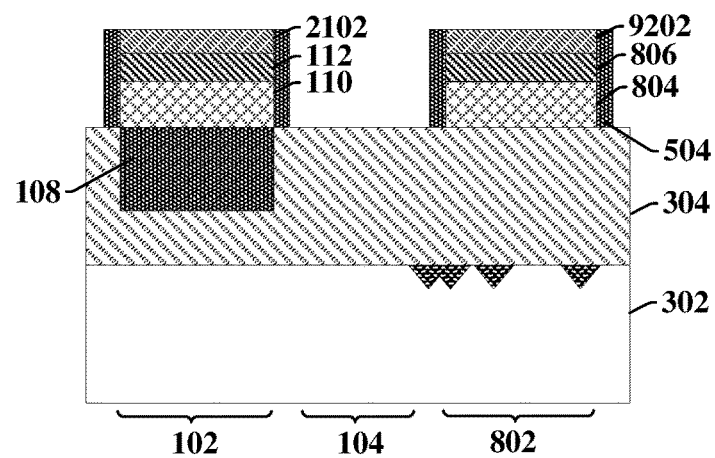

As shown in cross-sectional view 9400 and 9402 of FIG. 94, a spacer 504 is formed over the epitaxial layer 304 and along sidewalls of the polysilicon layer 108, the dielectric layer 110, the active semiconductor layer 112, the first part of the masking layer 2102, and the second part of the masking layer 9102. In various embodiments, the spacer 504 may be formed by depositing a spacer material 2602 over the epitaxial layer 304 and along sidewalls of the polysilicon layer 108, the dielectric layer 110, the active semiconductor layer 112, the first part of the masking layer 2102, and the second part of the masking layer 9102. The spacer material 2602 is subsequently exposed to an etchant 9404 (e.g., a dry etchant), which removes the spacer material 2602 from horizontal surfaces.

Figure 95:
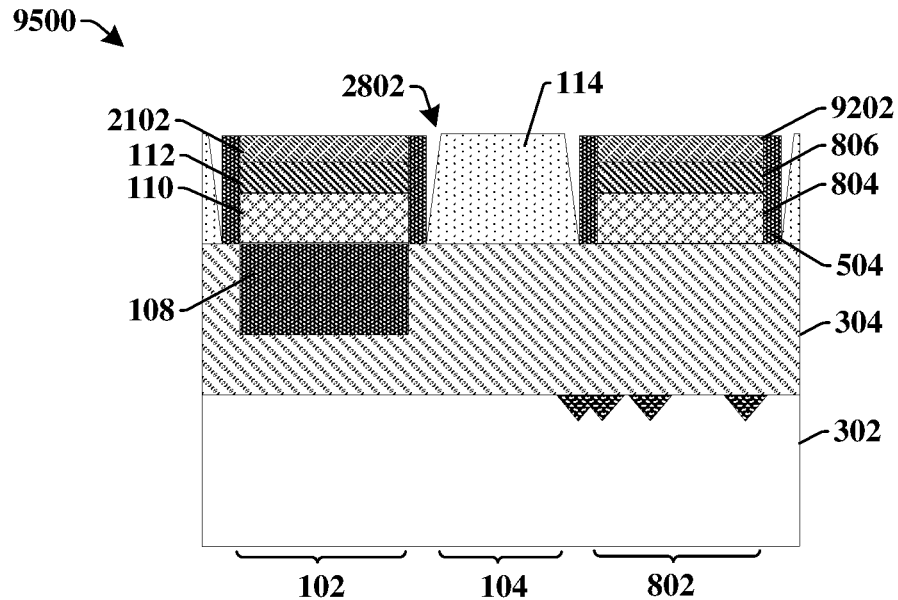

As shown in cross-sectional view 9500 of FIG. 95, a semiconductor material 114 is epitaxially formed within the second region 104. The semiconductor material 114 may be formed to a height that extends to top surfaces of the first part of the masking layer 2102 and the second part of the masking layer 9102. In some embodiments, the spacer 504 prevents the semiconductor material 114 from forming along sidewalls of the spacer 504, leaving a gap 2802 between a sidewall of the spacer 504 and the semiconductor material 114.

Figure 96:
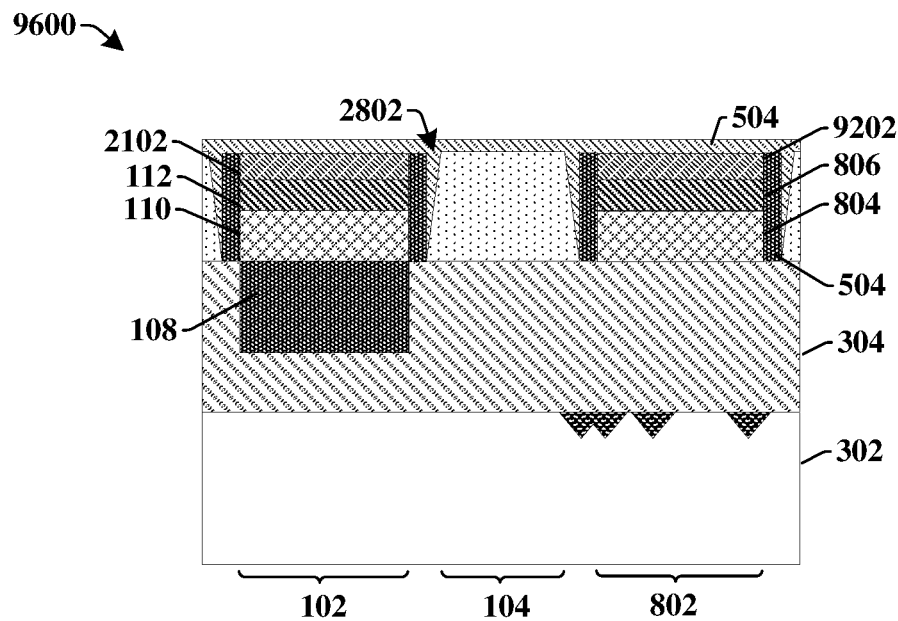

As shown in cross-sectional view 9600 of FIG. 96, a gap fill material 506 is formed within the gaps 2802 and over top surfaces of the spacer 504 and the semiconductor material 114.

Figure 97A:
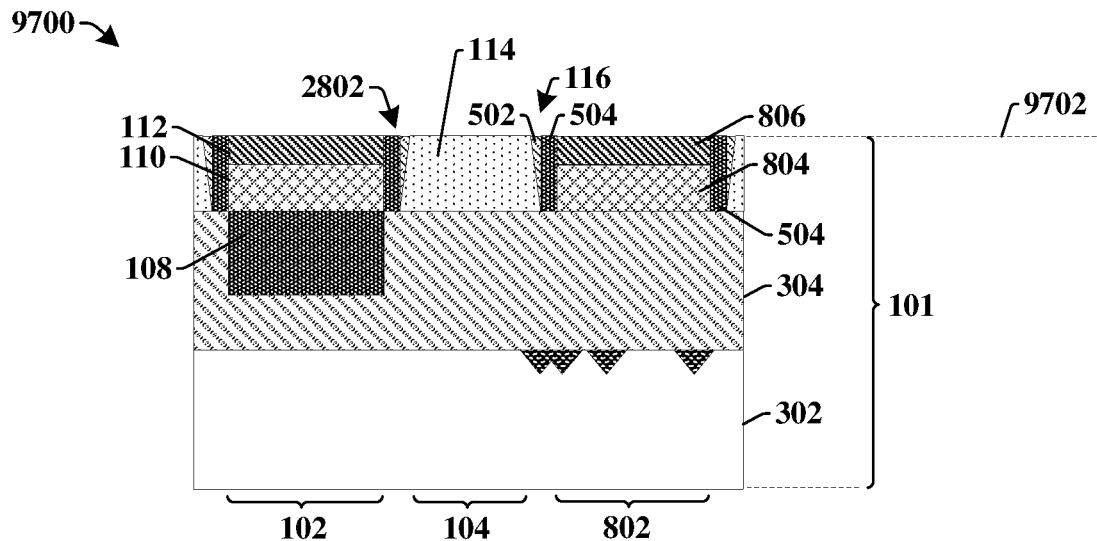

As shown in cross-sectional view 9700 of FIG. 97A, one or more planarization processes are performed (along line 9702) to remove parts of the gap fill material 506, the spacer 504, the first part of the masking layer 2102, and the second part of the masking layer 9102 over the active semiconductor layer 112 and to define a gap fill structure 116. The one or more planarization processes expose upper surfaces of the active semiconductor layer 112 and the semiconductor material 114.

Figure 97B:
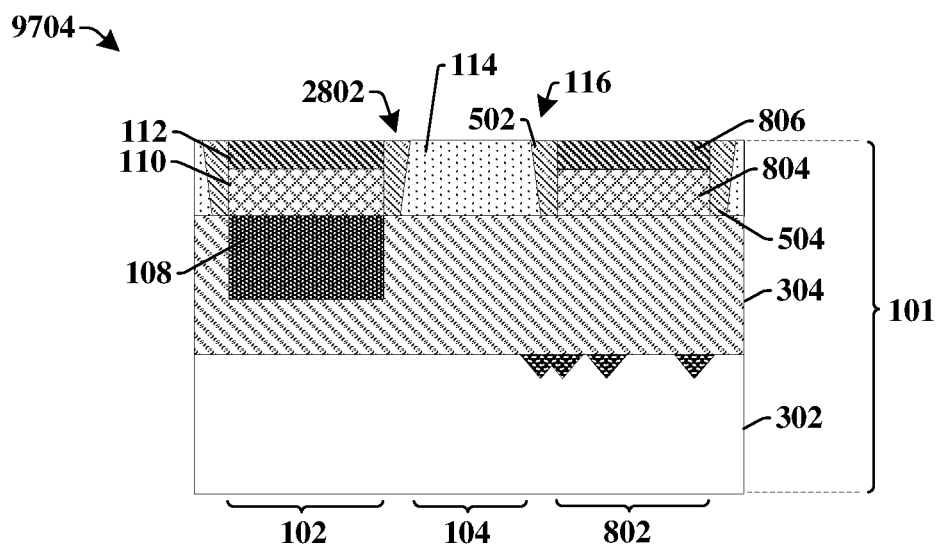

In some alternative embodiments, shown in cross-sectional view 9704 of FIG. 97B, the acts shown in FIG. 94 may be omitted and the method described in FIGS. 83-98 may not form a spacer (e.g., 504) along the exposed sidewalls of the dielectric layer, the active semiconductor layer, and the masking layer. In such embodiments, the gap fill material 506 is formed to completely fill the gaps (e.g., 2802) shown in FIG. 96. Upon performing one or more planarization processes to remove parts of the gap fill material 506, a resulting gap fill structure 116 will comprise a gap fill material 506 that continuously extends between sidewalls of the semiconductor material 114 and sidewalls of the dielectric layer 110 and the active semiconductor layer 112. Although subsequent cross-sectional view(s) shown in this method (e.g., cross-sectional view 9800 of FIG. 98) illustrate a gap fill structure comprising a spacer, it will be appreciated that in alternative embodiments the spacer may be omitted in these cross-sectional view(s).

Figure 98:
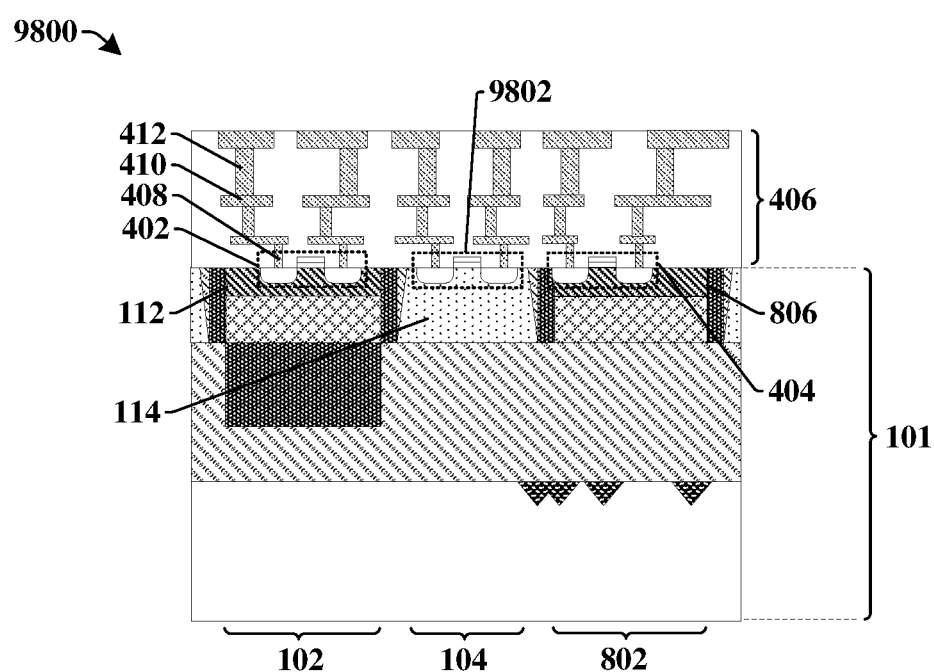

As shown in cross-sectional view 9800 of FIG. 98, a first device 402 is formed within the active semiconductor layer 112 within the first region 102, a second device 404 is formed within the second active semiconductor layer 806 within the third region 802, and a third device 9802 is formed within the semiconductor material 114 within the second region 104. The first device 402, the second device 404, and the third device 9802 are different types of devices. A plurality of interconnects 408-412 are subsequently formed within an ILD structure 406 over the substrate 101.

Figure 99:
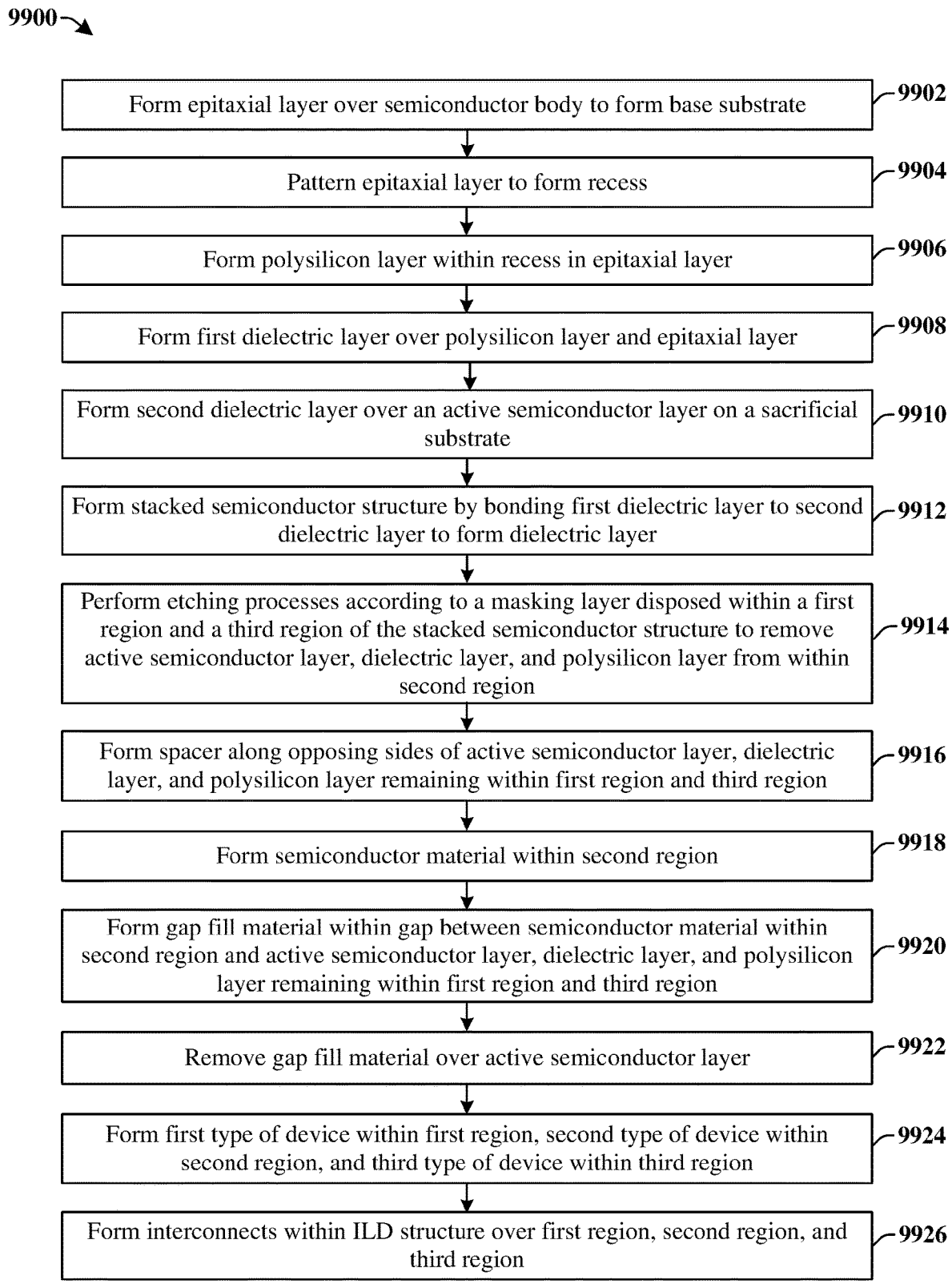
FIG. 99 illustrates a flow diagram of some additional embodiments of a method of forming a multi-function substrate having three different regions with different structures.

FIG. 99 illustrates a flow diagram of some embodiments of a method 9900 of forming a multi-function substrate having three different regions with different structures.

At act 9902, an epitaxial layer is formed over a semiconductor body to form a base substrate. FIGS. 83-84 illustrate cross-sectional views 8300-8400 of some embodiments corresponding to act 9902.

At act 9904, the epitaxial layer is patterned to form a recess. FIG. 85 illustrates a cross-sectional view 8500 of some embodiments corresponding to act 9904.

At act 9906, a polysilicon layer is formed within the recess, in some embodiments. FIGS. 86-87 illustrate cross-sectional views 8600-8700 of some embodiments corresponding to act 9906.

At act 9908, a first dielectric layer is formed over the polysilicon layer and the epitaxial layer. FIG. 88A illustrates a cross-sectional view 8800 of some embodiments corresponding to act 9908. FIG. 88B illustrates a cross-sectional view 8802 of some alternative embodiments corresponding to act 9908.

At act 9910, a second dielectric layer is formed over an active semiconductor layer on a sacrificial substrate. FIGS. 13-15 illustrate cross-sectional views 1300-1500 of some embodiments corresponding to act 9910.

At act 9912, a stacked semiconductor structure is formed by bonding the first dielectric layer to the second dielectric layer to form a dielectric layer. FIGS. 89-90 illustrate cross-sectional views 8900-9000 of some embodiments corresponding to act 9912.

At act 9914, one or more etching processes are performed according to a masking layer to remove the active semiconductor layer, the dielectric layer, and the polysilicon layer from within a second region of the stacked semiconductor structure. After the one or more etching processes are completed, the active semiconductor layer, the dielectric layer, and the polysilicon layer remain within a first region and a third region of the stacked semiconductor structure. FIGS. 91-93 illustrate cross-sectional views 9100-9300 of some embodiments corresponding to act 9914.

At act 9916, a spacer may be formed along opposing sides of the active semiconductor layer, the dielectric layer, and the polysilicon layer remaining within the first region and the third region, in some embodiments. FIG. 94 illustrates cross-sectional views 9400-9402 of some embodiments corresponding to act 9916.

At act 9918, a semiconductor material is formed within the second region. FIG. 95 illustrates a cross-sectional view 9500 of some embodiments corresponding to act 9918.

At act 9920, a gap fill material is formed within a gap between the semiconductor material within the second region and the active semiconductor layer, the dielectric layer, and the polysilicon layer remaining within the first region and the third region. FIG. 96 illustrates a cross-sectional view 9600 of some embodiments corresponding to act 9920.

At act 9922, one or more planarization processes are performed to remove the gap fill material from over the active semiconductor layer. FIG. 97A illustrates a cross-sectional view 9700 of some embodiments corresponding to act 9922. FIG. 97B illustrates a cross-sectional view 9704 of some alterative embodiments corresponding to act 9922.

At act 9924, a first type of device is formed within the first region, a second type of device is formed within the second region, and a third type of device is formed within the third region. FIG. 98 illustrates a cross-sectional view 9800 of some embodiments corresponding to act 9924.

At act 9926, interconnects are formed within an ILD structure over the first region, the second region, and the third region. FIG. 98 illustrates a cross-sectional view 9800 of some embodiments corresponding to act 9926.

FIGS. 100-106 illustrate cross-sectional views 10000-10600 of some alternative embodiments of a method of forming a stacked integrated chip structure used to form a multi-function substrate. Although the alternative method of forming a stacked integrated chip structure is shown with respect to the method of FIG. 31, it will be appreciated that the method may also be used in other disclosed methods (e.g., the methods of FIGS. 48, 65, 82, and 99).

Figure 100:
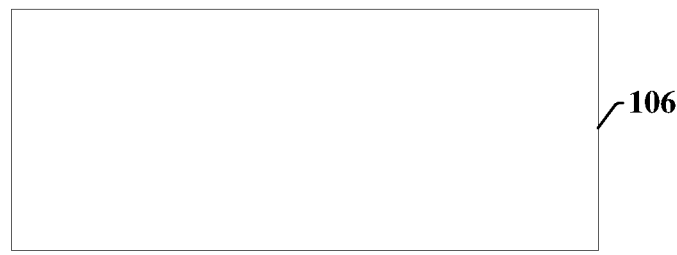
FIGS. 100-106 illustrate cross-sectional views of some alternative embodiments of diagram of a method of forming a stacked semiconductor structure used to form a multi-function substrate.

As shown in cross-sectional view 10000 of FIG. 100, a base substrate 106 is provided. In some embodiments, the base substrate 106 may comprise a semiconductor material such as silicon, germanium, or the like.

Figure 101:

As shown in cross-sectional view 10100 of FIG. 101, a polysilicon layer 108 is formed onto the base substrate 106.

Figure 102:
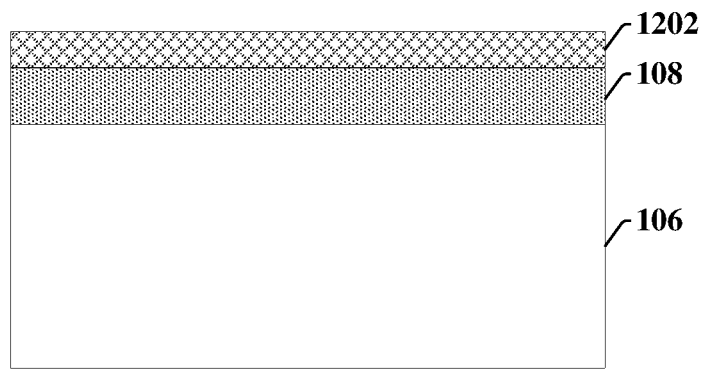

As shown in cross-sectional view 10200 of FIG. 102, a first dielectric layer 1202 is formed onto the polysilicon layer 108.

Figure 103:
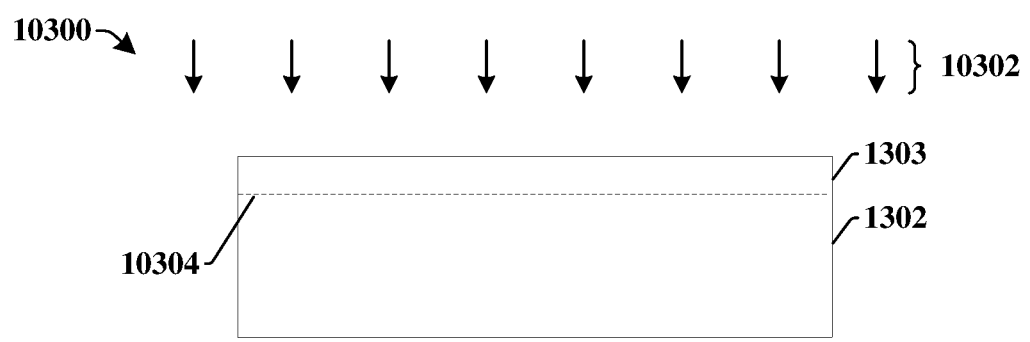

As shown in cross-sectional view 10300 of FIG. 103, a sacrificial substrate 1302 is provided. A severing species 10302 is implanted into the sacrificial substrate 1302. The severing species 10302 is implanted so as to have a peak concentration along a horizontal cleaving plane 10304 that is parallel to an upper surface of the sacrificial substrate 1302. The horizontal cleaving plane 10304 separates the sacrificial substrate 1302 from an active semiconductor layer 1303 above the horizontal cleaving plane 10304. In some embodiments, the severing species 10302 may comprise hydrogen. In such embodiments, the molecules ($H_2$) align along the horizontal cleaving plane 10304 and weaken bonds between atoms along the horizontal cleaving plane 10304.

Figure 104:
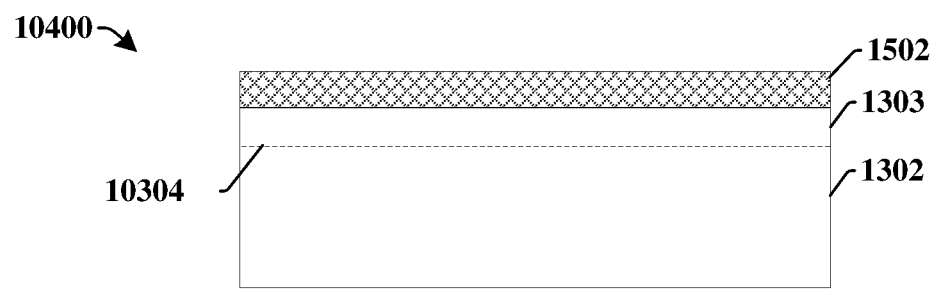

As shown in cross-sectional view 10400 of FIG. 104, a second dielectric layer 1502 is formed over the active semiconductor layer 1303. In some embodiments, the second dielectric layer 1502 may be formed by a deposition process. In other embodiments, the second dielectric layer 1502 may be formed by a thermal oxidation process that forms the second dielectric layer 1502 from a part of the active semiconductor layer 1303.

Figure 105:
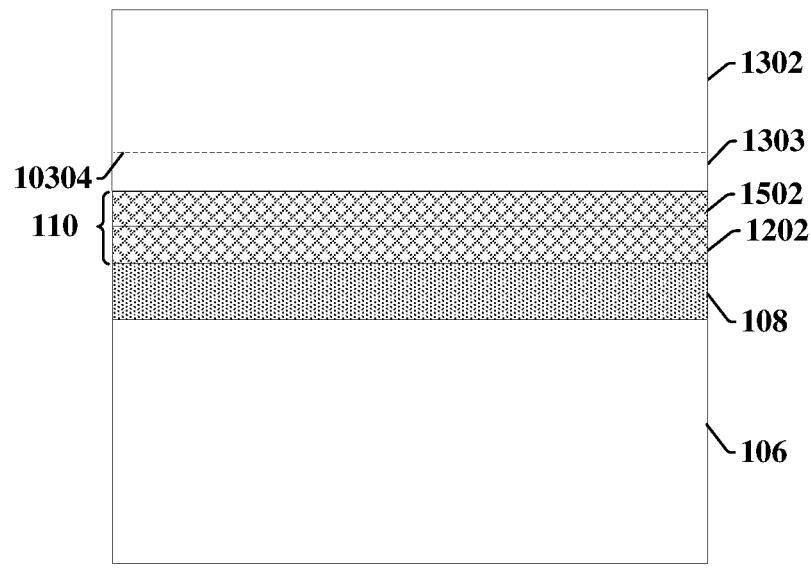

As shown in cross-sectional view 10500 of FIG. 105, the sacrificial substrate 1302 is bonded to the base substrate 106. In some embodiments, the sacrificial substrate 1302 is bonded to the base substrate 106 along an interface comprising a first dielectric layer 1202 and the second dielectric layer 1502. In other embodiments, the sacrificial substrate 1302 is bonded to the base substrate 106 along an interface between the polysilicon layer 108 and the second dielectric layer 1502.

Figure 106:
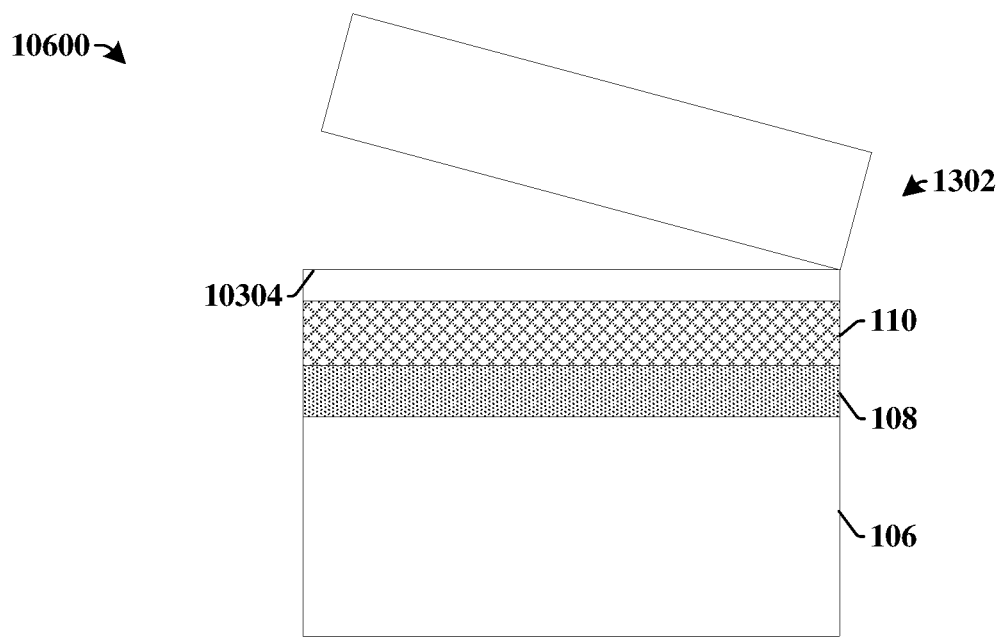
Figure 106:
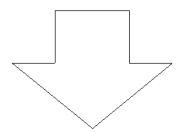
Figure 106:
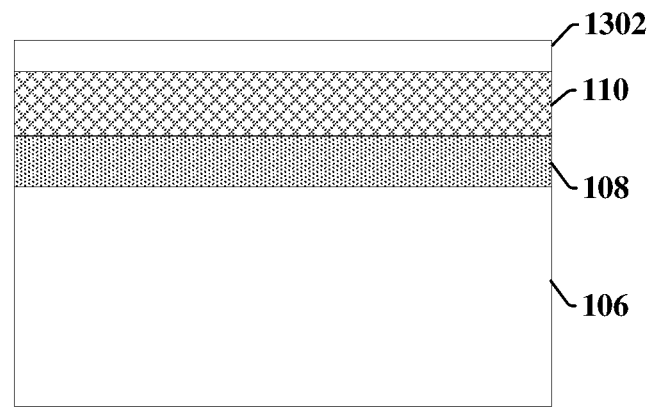

As shown in cross-sectional views 10600 and 10602 of FIG. 106, the sacrificial substrate 1302 is cleaved by applying a force to the sacrificial substrate 1302. Cleaving the sacrificial substrate 1302 will cause the sacrificial substrate 1302 to break along the horizontal cleaving plane 10304, reducing a thickness of the sacrificial substrate 1302.

Accordingly, in some embodiments, the present disclosure relates to an integrated chip comprising a multi-function substrate having different regions (e.g., a bulk region and an SOI region) with different structures that are disposed over a base substrate having an upper surface that is substantially devoid of COP defects. The multi-function substrate provides different types of devices with optimized performance within a same substrate (e.g., die).

In some embodiments, the present disclosure relates to an integrated chip. The integrated chip includes a polysilicon layer arranged on an upper surface of a base substrate; a dielectric layer arranged over the polysilicon layer; an active semiconductor layer arranged over the dielectric layer; a semiconductor material arranged vertically on the upper surface of the base substrate and laterally besides the active semiconductor layer. In some embodiments, the base substrate includes a semiconductor body; and an epitaxial layer arranged on the semiconductor body, the semiconductor material being disposed on the epitaxial layer. In some embodiments, the epitaxial layer continuously extends from directly below the semiconductor material to directly below the polysilicon layer. In some embodiments, the integrated chip further includes a gap fill structure arranged along sidewalls of the semiconductor material, the active semiconductor layer, and the dielectric layer, the gap fill structure laterally separating the sidewall of the semiconductor material from the sidewalls of the dielectric layer and the active semiconductor layer. In some embodiments, the integrated chip further includes an isolation structure comprising one or more dielectric materials arranged between a sidewall of the semiconductor material and sidewalls of the active semiconductor layer and the dielectric layer. In some embodiments, the polysilicon layer includes grain sizes that increase from a lower surface of the polysilicon layer to an upper surface of the polysilicon layer. In some embodiments, the polysilicon layer has a gradient doping concentration that decreases from a lower surface of the polysilicon layer to within the polysilicon layer. In some embodiments, the integrated chip further includes an inter-level dielectric (ILD) structure continuously extending from directly over the active semiconductor layer to directly over the semiconductor material; and a plurality of interconnects disposed within the ILD structure.

In other embodiments, the present disclosure relates to an integrated chip. The integrated chip includes a semiconductor body having a first region and a second region, one or more defects are disposed along an upper surface of the semiconductor body within the second region; an epitaxial layer disposed over the semiconductor body, the epitaxial layer covering the one or more defects; a polysilicon layer arranged over the semiconductor body and within the first region; a dielectric layer arranged over the polysilicon layer; an active semiconductor layer arranged over the dielectric layer; and a semiconductor material arranged over the epitaxial layer and within the second region, the semiconductor material extending to above top surfaces of the polysilicon layer and the dielectric layer. In some embodiments, the polysilicon layer is arranged directly between sidewalls of the epitaxial layer. In some embodiments, the one or more defects comprise one or more crystal originated particle (COP) defects. In some embodiments, the polysilicon layer extends completely through the epitaxial layer to contact the semiconductor body. In some embodiments, the polysilicon layer includes a sidewall arranged along a sidewall of the epitaxial layer and a bottommost surface that is separated from the semiconductor body by the epitaxial layer. In some embodiments, the epitaxial layer continuously extends from below an uppermost surface of the polysilicon layer to above the uppermost surface of the polysilicon layer. In some embodiments, the polysilicon layer continuously extends from along a sidewall of the epitaxial layer to above an uppermost surface of the epitaxial layer. In some embodiments, the integrated chip further includes a gap fill structure laterally arranged between an outermost sidewall of the semiconductor material and outermost sidewalls of both the dielectric layer and the active semiconductor layer that face the outermost sidewall of the semiconductor material.

In yet other embodiments, the present disclosure relates to a method of forming an integrated chip. The method includes forming a stacked semiconductor structure having a polysilicon layer disposed onto a base substrate and separated from an active semiconductor layer by a dielectric layer; performing one or more etching processes to remove first parts of the active semiconductor layer and the dielectric layer within a second region and expose a surface of the base substrate, second parts of the active semiconductor layer and the dielectric layer remaining within a first region after the one or more etching processes are completed; and forming a semiconductor material onto the surface of the base substrate. In some embodiments, the method further includes forming an epitaxial layer onto a semiconductor body to form the base substrate prior to forming the polysilicon layer onto the base substrate, the one or more etching processes exposing an upper surface of the epitaxial layer. In some embodiments, the method further includes performing an anneal process on the base substrate; and forming the polysilicon layer onto the base substrate after performing the anneal process on the base substrate. In some embodiments, the method further includes forming a spacer along opposing sides of the active semiconductor layer after performing the one or more etching processes, the spacer separating the semiconductor material from the active semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a polysilicon layer arranged on an upper surface of a base substrate, wherein the polysilicon layer comprises grain sizes that increase from a lower surface of the polysilicon layer to an upper surface of the polysilicon layer;
a dielectric layer arranged over the polysilicon layer;
an active semiconductor layer arranged over the dielectric layer; and
a semiconductor material arranged vertically on the upper surface of the base substrate and laterally beside the active semiconductor layer.

2. The integrated chip of claim 1, wherein the base substrate comprises:
a semiconductor body; and
an epitaxial layer arranged on the semiconductor body, wherein the semiconductor material is disposed on the epitaxial layer.

3. The integrated chip of claim 2, wherein the epitaxial layer continuously extends from directly below the semiconductor material to directly below the polysilicon layer.

4. The integrated chip of claim 1, further comprising:
a gap fill structure arranged along sidewalls of the semiconductor material, the active semiconductor layer, and the dielectric layer, wherein the gap fill structure laterally separates the sidewall of the semiconductor material from the sidewalls of the dielectric layer and the active semiconductor layer.

5. The integrated chip of claim 1, further comprising:
an isolation structure comprising one or more dielectric materials arranged between a sidewall of the semiconductor material and sidewalls of the active semiconductor layer and the dielectric layer.

6. The integrated chip of claim 1, wherein the polysilicon layer has a gradient doping concentration that decreases from the lower surface of the polysilicon layer to within the polysilicon layer.

7. The integrated chip of claim 1, further comprising:
an inter-level dielectric (ILD) structure continuously extending from directly over the active semiconductor layer to directly over the semiconductor material; and
a plurality of interconnects disposed within the ILD structure.

8. An integrated chip, comprising:
a semiconductor body having a first region and a second region, wherein one or more defects are disposed along an upper surface of the semiconductor body within the second region;
an epitaxial layer disposed over the semiconductor body, wherein the epitaxial layer covers the one or more defects;
a polysilicon layer arranged over the semiconductor body and within the first region;
a dielectric layer arranged over the polysilicon layer;
an active semiconductor layer arranged over the dielectric layer; and
a semiconductor material arranged over the epitaxial layer and within the second region, wherein the semiconductor material extends to above top surfaces of the polysilicon layer and the dielectric layer.

9. The integrated chip of claim 8, wherein the polysilicon layer is arranged directly between sidewalls of the epitaxial layer.

10. The integrated chip of claim 8, wherein the one or more defects comprise one or more crystal originated particle (COP) defects.

11. The integrated chip of claim 8, wherein the polysilicon layer extends completely through the epitaxial layer to contact the semiconductor body.

12. The integrated chip of claim 8, wherein the polysilicon layer comprises a sidewall arranged along a sidewall of the epitaxial layer and a bottommost surface that is separated from the semiconductor body by the epitaxial layer.

13. The integrated chip of claim 8, wherein the epitaxial layer continuously extends from below an uppermost surface of the polysilicon layer to above the uppermost surface of the polysilicon layer.

14. The integrated chip of claim 8, wherein the polysilicon layer continuously extends from along a sidewall of the epitaxial layer to above an uppermost surface of the epitaxial layer.

15. The integrated chip of claim 8, further comprising:
a gap fill structure laterally arranged between an outermost sidewall of the semiconductor material and outermost sidewalls of both the dielectric layer and the active semiconductor layer that face the outermost sidewall of the semiconductor material.

16. An integrated chip, comprising:
a polysilicon layer arranged on a base substrate;
a dielectric arranged over the polysilicon layer;
an active semiconductor layer arranged over the dielectric;
a semiconductor material arranged vertically over the base substrate and laterally beside the active semiconductor layer;
a gap fill structure arranged laterally between the active semiconductor layer and the semiconductor material, wherein the gap fill structure has a bottom surface facing the base substrate and a top surface facing away from the base substrate, the top surface being wider than the bottom surface; and
wherein the gap fill structure has opposing outermost sidewalls that extend below a top of the dielectric.

17. The integrated chip of claim 16, wherein the base substrate comprises an epitaxial layer arranged over a semiconductor body, the polysilicon layer being over the epitaxial layer and the gap fill structure being above a top surface of the epitaxial layer.

18. The integrated chip of claim 17, wherein a bottom of the polysilicon layer is below the top surface of the epitaxial layer.

19. The integrated chip of claim 16, wherein the polysilicon layer includes grain sizes that increase as a distance over the base substrate increases.

20. The integrated chip of claim 16, wherein a part of the gap fill structure that is below the top of the dielectric is directly over a part of the semiconductor material in a cross-sectional view.

* * * * *